(12) United States Patent
Heuser et al.

(10) Patent No.: US 8,618,533 B2
(45) Date of Patent: Dec. 31, 2013

(54) SILOLES SUBSTITUTED BY FUSED RING SYSTEMS AND USE THEREOF IN ORGANIC ELECTRONICS

(75) Inventors: Karsten Heuser, Erlangen (DE); Arvid Hunze, Erlangen (DE); Guenter Schmid, Hemhofen (DE); Ralf Krause, Erlangen (DE); Herbert Friedrich Boerner, Aachen (DE); Volker Van Elsbergen, Aachen (DE); Nicolle Langer, Heppenheim (DE); Oliver Molt, Hirschberg (DE); Korinna Dormann, Bad Duerkheim (DE); Evelyn Fuchs, Mannheim (DE); Jens Rudolph, Worms (DE); Christian Lennartz, Schifferstadt (DE); Soichi Watanabe, Mannheim (DE); Christian Schildknecht, Mannheim (DE); Gerhard Wagenblast, Wachenheim (DE)

(73) Assignees: Osram Opto Semiconductors GmbH, Regensburg (DE); BASF SE, Ludwigshafen (DE); Koninklijke Philips Electronics N.V., Eindhoven (NL)

( * ) Notice: Subject to any disclaimer, the term of this patent is extended or adjusted under 35 U.S.C. 154(b) by 298 days.

(21) Appl. No.: 13/123,173

(22) PCT Filed: Oct. 7, 2009

(86) PCT No.: PCT/EP2009/063036
§ 371 (c)(1),
(2), (4) Date: Apr. 7, 2011

(87) PCT Pub. No.: WO2010/040777
PCT Pub. Date: Apr. 15, 2010

(65) Prior Publication Data
US 2011/0198578 A1    Aug. 18, 2011

(30) Foreign Application Priority Data

Oct. 7, 2008    (EP) .................................... 08166034
Oct. 7, 2008    (EP) .................................... 08166046

(51) Int. Cl.
*H01L 51/54*    (2006.01)
(52) U.S. Cl.
USPC .. 257/40; 257/98; 257/E51.018; 257/E51.028
(58) Field of Classification Search
USPC ...................... 257/40, 98, E51.018–E51.022, 257/E51.028; 313/498–512
See application file for complete search history.

(56) References Cited

U.S. PATENT DOCUMENTS

| | | | |
|---|---|---|---|
| 2001/0015432 A1 | 8/2001 | Igarashi | |
| 2001/0019782 A1 | 9/2001 | Igarashi et al. | |
| 2002/0024293 A1 | 2/2002 | Igarashi et al. | |
| 2002/0048689 A1 | 4/2002 | Igarashi et al. | |
| 2002/0055014 A1 | 5/2002 | Okada et al. | |
| 2002/0094453 A1 | 7/2002 | Takiguchi et al. | |
| 2006/0289882 A1* | 12/2006 | Nishimura et al. | ............. 257/94 |

FOREIGN PATENT DOCUMENTS

| | | |
|---|---|---|
| EP | 0 754 691 A2 | 1/1997 |
| EP | 1 143 538 A1 | 10/2001 |
| EP | 1 191 612 A2 | 3/2002 |
| EP | 1 191 613 A2 | 3/2002 |
| EP | 1 211 257 A2 | 6/2002 |
| EP | 1 740 019 A1 | 1/2007 |
| JP | 2001-172284 | 6/2001 |
| JP | 2001-172285 | 6/2001 |
| JP | 2001172284 A * | 6/2001 |
| JP | 2003-243178 | 8/2003 |
| JP | 2005-104986 | 4/2005 |
| WO | WO 00/70655 A2 | 11/2000 |
| WO | WO 01/41512 A1 | 6/2001 |
| WO | WO 02/02714 A2 | 1/2002 |
| WO | WO 02/15645 A1 | 2/2002 |
| WO | WO 02/060910 A1 | 8/2002 |
| WO | WO 2004/020373 A1 | 3/2004 |
| WO | WO 2005/019373 A2 | 3/2005 |
| WO | WO 2005/113704 A2 | 12/2005 |
| WO | WO 2006/056418 A2 | 6/2006 |
| WO | WO 2006/067074 A1 | 6/2006 |
| WO | WO 2006/100298 A1 | 9/2006 |
| WO | WO 2006/115301 A1 | 11/2006 |
| WO | WO 2006/121811 A1 | 11/2006 |
| WO | WO 2007/095118 A2 | 8/2007 |
| WO | WO 2007/115970 A1 | 10/2007 |
| WO | WO 2007/115981 A1 | 10/2007 |
| WO | WO 2008/000727 A1 | 1/2008 |
| WO | WO 2008/034758 A2 | 3/2008 |
| WO | WO 2009/003898 A1 | 1/2009 |
| WO | WO 2009/003919 A1 | 1/2009 |

OTHER PUBLICATIONS

M. A. Baldo, et al., "Very high-efficiency green organic light-emitting devices based on electrophosphorescence", Applied Physics Letters, vol. 75, No. 1, Jul. 5, 1999, pp. 4-6.

Donald J. Cram, et al., "Host-Guest Complexation. 29. Expanded Hemispherands", J. Am. Chem. Soc., vol. 106, No. 11, 1984, pp. 3286-3292.

N.M. Cullinane, et al., "Investigations in the Diphenylene Oxide Series. Part V.", J. Chem. Soc., 1935, pp. 1131-1134.

Weiying Gao, et al., "Controlled p doping of the hole-transport molecular material N,N' -diphenyl-N,N' -bis(1-naphthyl) -1,1' -biphenyl-4,4' -diamine with tetrafluorotetracyanoquinodimethane", Journal of Applied Physics, vol. 94, No. 1, Jul. 1, 2003, pp. 359-366.

(Continued)

Primary Examiner — Marcos D. Pizarro
(74) Attorney, Agent, or Firm — Oblon, Spivak, McClelland, Maier & Neustadt, L.L.P.

(57) ABSTRACT

The present invention relates to the use of siloles substituted by fused ring systems in organic electronics applications, and to specific siloles substituted by fused ring systems and to the use thereof in organic electronics applications.

28 Claims, 4 Drawing Sheets

(56) References Cited

OTHER PUBLICATIONS

Henry Gilman, et al., "Cyclic Organosilicon Compounds. I. Synthesis of Compounds Containing the Dibenzosilole Nucleus", The Journal of the American Chemical Society, vol. 80, Apr. 20, 1958, pp. 1883-1886.

G. Gustafsson, et al., "Flexible light-emitting diodes made from soluble conducting polymers", Letters to Nature, vol. 357, Jun. 11, 1992, pp. 477-479.

Elli S. Hand, et al., "Magnesium Methyl Carbonate-Activated Alkylation of Methyl Ketones with an ω-Halo Nitrile, Esters, and Amides", J. Org. Chem., vol. 62, No. 5, 1997, pp. 1348-1355.

Kirk-Othmer, "Photoconductive Polymers", Encyclopedia of Chemical Technology Fourth Edition, vol. 18, 1996, pp. 837-860.

Yuxia Liu, et al., "Structure and Chemistry of 1-Silafluorenyl Dianion, its Derivatives, and an Organosilicon Diradical Dianion", J. Am. Chem. Soc., vol. 124, No. 1, 2002, pp. 49, 52-57.

Takanori Matsuda, et al., "Synthesis of Silafluorenes by Iridium-Catalyzed [2+2+2] Cycloaddition of Silicon-Bridged Diynes with Alkynes", Organic Letters, vol. 9, No. 1, 2007, pp. 133-136.

Valérie Meille, et al., "Hydrodesulfurization of Alkyldibenzothiophenes over a NiMo/Al$_2$O$_3$ Catalyst: Kinetics and Mechanism", Journal of Catalysis, vol. 170, 1997, pp. 29-36.

Kazuhiro Mouri, et al., "Ladder Distyrylbenzenes with Silicon and Chalcogen Bridges: Synthesis, Structures, and Properties", Organic Letters, vol. 9, No. 1, 2007, pp. 93-96.

Minnie Park, et al., "A Convenient Synthesis of 3,6-Substitued Carbazoles via Nickel Catalyzed Cross-Coupling", Tetrahedron, vol. 54, 1998 pp. 12707-12714.

M. Pfeiffer, et al., "Doped organic semiconductors: Physics and application in light emitting diodes", Organic Electronics, vol. 4, 2003, pp. 89-103.

Surasak Seesukphronrarak, et al., "Novel Fluorene-based Biphenolic Monomer: 9,9-Bis(4-hydroxyphenyl)-9-silafluorene", Chemistry Letters, vol. 36, No. 9, 2007, pp. 1138-1139.

A. G. Werner, et al., "Pyronin B as a donor for n-type doping of organic thin films", Applied Physics Letters, vol. 82, No. 25, Jun. 23, 2003, pp. 4495-4497.

Wei Yang, et al., "Improvement of color purity in blue-emitting polyfluorene by copolymerization with dibenzothiophene", J. Mater. Chem., vol. 13, 2003, pp. 1351-1355.

Xiaowei Zhan, et al., "Electron Affinities of 1,1-Diaryl-2,3,4,5-tetraphenylsiloles: Direct Measurements and Comparison with Experimental and Theoretical Estimates" J. Am. Chem. Soc., vol. 127, 2005, pp. 9021-9029.

U.S. Appl. No. 13/516,117, filed Aug. 27, 2012, Molt, et al.

* cited by examiner

SILOLES SUBSTITUTED BY FUSED RING SYSTEMS AND USE THEREOF IN ORGANIC ELECTRONICS

The present invention relates to the use of siloles substituted by fused ring systems in organic electronics applications, preferably as a matrix material and/or hole/exciton blocker material, to an organic light-emitting diode comprising an anode An and a cathode Ka and a light-emitting layer E arranged between the anode An and the cathode Ka, and optionally, as a further layer, at least one blocking layer for holes/excitons, the organic light-emitting diode comprising at least one silole compound of the formula (I) which is present in the light-emitting layer and/or in the at least in the blocking layer for holes/excitons—where present, to a device selected from the group consisting of stationary visual display units, mobile visual display units and illumination units comprising at least one inventive organic light-emitting diode, and to specific siloles substituted by fused ring systems.

Organic electronics is a subfield of electronics and uses electronic circuits which comprise polymers or smaller organic compounds. Fields of use of organic electronics are the use of polymers or smaller organic compounds in organic light-emitting diodes (OLEDs), use in organic solar cells (organic photovoltaics) and in switching elements such as organic transistors, for example organic FETs and organic TFTs.

The use of suitable novel organic materials thus allows various new types of components based on organic electronics to be provided, such as displays, sensors, transistors, data stores or photovoltaic cells. This makes possible the development of new applications which are thin, light, flexible and producible at low cost.

A preferred field of use according to the present application is the use of relatively small organic compounds in organic light-emitting diodes.

Organic light-emitting diodes (OLEDs) exploit the property of materials of emitting light when they are excited by electrical current. OLEDs are of particular interest as an alternative to cathode ray tubes and liquid-crystal displays for producing flat visual display units. Owing to the very compact design and the intrinsically low power consumption, the devices comprising OLEDs are suitable especially for mobile applications, for example for applications in cellphones, laptops, etc., and for illumination.

The basic principles of the way in which OLEDs work and suitable structures (layers) of OLEDs are specified, for example, in WO 2005/113704 and the literature cited therein. The light-emitting materials (emitters) used may, as well as fluorescent materials (fluorescence emitters), be phosphorescent materials (phosphorescence emitters). The phosphorescence emitters are typically organometallic complexes which, in contrast to the fluorescence emitters which exhibit singlet emission, exhibit triplet emission (M. A. Baldo et al., Appl. Phys. Lett. 1999, 75, 4-6). For quantum-mechanical reasons, when the phosphorescence emitters are used, up to four times the quantum efficiency, energy efficiency and power efficiency is possible.

Of particular interest are organic light-emitting diodes with long operative lifetime, good efficiency, high stability to thermal stress and a low use and operating voltage, which emit light especially in the blue region of the electromagnetic spectrum.

In order to implement the aforementioned properties in practice, it is not only necessary to provide suitable emitter materials, but the other components of the OLED (complementary materials) must also be balanced to one another in suitable device compositions. Such device compositions may, for example, comprise specific matrix materials in which the actual light emitter is present in distributed form. In addition, the compositions may comprise blocker materials, it being possible for hole blockers, exciton blockers and/or electron blockers to be present in the device compositions. Additionally or alternatively, the device compositions may further comprise hole injection materials and/or electron injection materials and/or charge transport materials such as hole conductor materials and/or electron conductor materials. The selection of the aforementioned materials which are used in combination with the actual light emitter has a significant influence on parameters including the efficiency and the lifetime of the OLEDs.

The prior art proposes numerous different materials for use in the different layers of OLEDs and for use in further applications in organic electronics.

JP 2001-172285 A discloses organic light-emitting diodes in which siloles are used as an electron transport material. The siloles have the following general formula

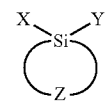

and the siloles disclosed include those in which the ring formed from Si and Z has the following formula:

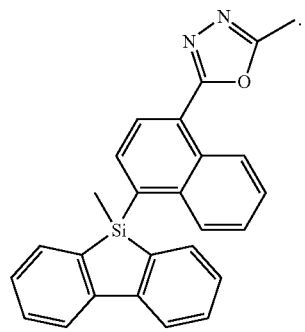 [SMILES: Cc1nnc(-c2ccc([Si]3(C)c4ccccc4-c4ccccc43)c3ccccc23)o1]

The use of siloles as a hole blocker material or as a matrix material is not mentioned in JP 2001-172285 A.

JP 2001-172284 discloses the use of siloles as hole transport compounds in organic light-emitting diodes. These siloles have the following general formula:

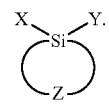

JP 2001-172284 A discloses inter alia siloles which have the following structure

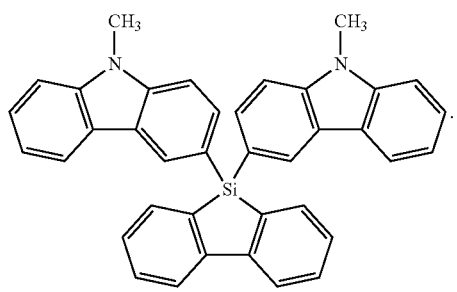 [SMILES: Cn1c2ccccc2c2cc([Si]3(c4ccc5c(c4)c4ccccc4n5C)c4ccccc4-c4ccccc43)ccc21]

The use of the siloles specified in JP 2001-172284 as hole blocker materials or matrix materials is not disclosed in JP 2001-172284 A. According to the examples in JP 2001-172284 A, the siloles are used as a replacement for TPD and PVK, which are typically used as hole transport materials in OLEDs.

X. Zhan et al., J. Am. Chem. Soc. 2005, 127, 9021-9029 disclose the experimental and theoretical characterization of the electronic structure of 1,1-diaryl-2,3,4,5-tetraphenyl-siloles. According to X. Zhan et al., these compounds constitute electron transport materials for use in organic electronics. Suitability of the siloles disclosed in X. Zhan et al. as hole blocker materials or matrix materials is not mentioned.

JP 2003-243178 A discloses organic light-emitting diodes which have good luminescence and long luminescence lifetimes and, as a matrix in the light-emitting layer or in the electron transport layer, comprise siloles of the following general formula:

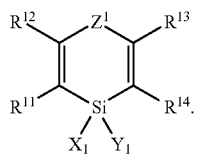

Preferred siloles have, for example, the following general formulae:

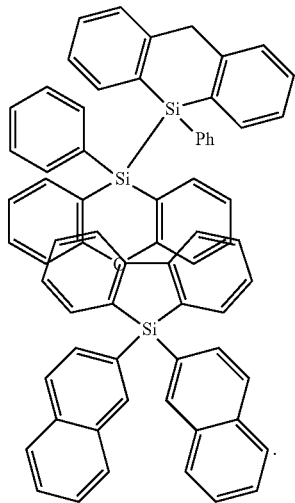

According to the examples in JP 2003-243178 A, siloles of the following formula are used:

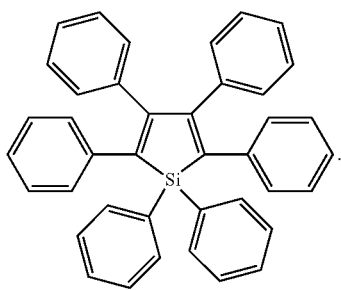 [SMILES: c1ccc(C2=C(c3ccccc3)[Si](c3ccccc3)(c3ccccc3)C(c3ccccc3)=C2c2ccccc2)cc1]

Among the numerous different siloles disclosed as matrix materials according to JP 2003-243178 A, no siloles which are substituted on the Si by a fused tricyclic system comprising at least one heteroatom selected from O, S, N and P are disclosed.

EP 1 740 019 A1 relates to organic light-emitting diodes which comprise a light-emitting layer which has at least one silicacyclopentadiene derivative as a matrix and at least one amine as a doping material. The silicacyclopentadiene derivative has the following formula:

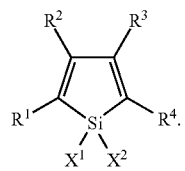

Among others, $X^1$ and $X^2$ may be a heteroring with 3 to 50 carbon atoms, although EP 1 740 019 A1 does not mention any heterorings with 3 fused rings for $X^1$ and $X^2$. In all example compounds in EP 1 740 019 A1, $X^1$ and $X^2$ are each phenyl or alkyl, especially methyl.

EP 0 754 691 A2 and EP 1 143 538 A1 disclose silacyclopentadiene derivatives and the use thereof in organic light-emitting diodes. The silacyclopentadiene derivatives according to EP 0 754 691 A2 have the following general formula:

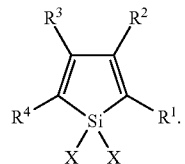

X and Y may be substituents including heterocycles, though no fused tricyclic heterocycles are mentioned.

In the examples in EP 0 754 691 A2, essentially 3,4-diphenylsilacyclopentadienes or 9,9'-silaspirobifluorenes are used. According to EP 0 754 691 A2, the silacyclopentadienes mentioned can be used in the electron transport layer of the light-emitting layer or a blocking layer for holes.

It is thus evident from the prior art that silole compounds can be used in different layers of organic light-emitting diodes. The use of silole compounds in various layers in OLEDs is mentioned.

It is an object of the present invention, with respect to the aforementioned prior art, to provide further materials suitable for use in OLEDs and further applications in organic electronics. More particularly, hole blocker materials and matrix materials for use in OLEDs are to be provided. The materials should especially be suitable for OLEDs which comprise at least one phosphorescence emitter, especially at least one green emitter or at least one blue emitter. It should thus be possible to provide especially matrix and/or hole blocker materials for OLEDs which have a high triplet energy. Furthermore, the materials should be suitable for providing OLEDs which ensure good efficiencies, good operative lifetimes and a high stability with respect to thermal stress and a low use and operating voltage of the OLEDs.

This object is achieved by the use of compounds of the general formula (I)

(I)

in which:

A is a fused ring system formed from at least 3, preferably 3 or 4, more preferably 3, fused rings which each independently have 4 to 10, preferably 5 to 7, more preferably 5 or 6, ring members and may be saturated or mono- or polyunsaturated and unsubstituted or substituted by one or more substituents selected from alkyl, cycloalkyl, heterocycloalkyl, aryl, heteroaryl, $SiR^2R^3R^4$ and groups with donor or acceptor action, preferably alkyl, heteroaryl, $SiR^2R^3R^4$ and groups with donor or acceptor action such as alkoxy, amino, halogen or pseudohalogen, wherein the fused ring system has at least one heteroatom, preferably selected from O, S, N and P, more preferably O, S and N, most preferably S and O, in the fused ring system itself or in at least one substituent; preferably in the fused ring system itself;

is an Si-containing ring which has 4 to 10, preferably 5 to 7, more preferably 5 or 6, most preferably 5, ring members, wherein the ring may be saturated or mono- or polyunsaturated and, in addition to the silicon atom, may have one or more further heteroatoms, preferably selected from O, S and N, more preferably O and N, and may be unsubstituted or substituted by one or more substituents selected from alkyl, cycloalkyl, heterocycloalkyl, aryl, heteroaryl and substituents with donor or acceptor action, wherein the Si-containing ring may additionally be part of a fused ring system formed from at least two, preferably two or three, more preferably three, rings, wherein the further rings in the fused ring system may each independently be saturated or mono- or polyunsaturated and unsubstituted or substituted by one or more substituents selected from alkyl, cycloalkyl, heterocycloalkyl, aryl, heteroaryl, and substituents with donor or acceptor action, and may have one or more heteroatoms, preferably selected from O, S and N, more preferably S and N;

$R^1$ is A, alkyl, cycloalkyl, heterocycloalkyl, aryl or heteroaryl, preferably alkyl, aryl or heteroaryl, more preferably methyl, phenyl, naphthyl, indenyl, benzofuryl, benzothienyl, benzopyrrolyl, dibenzofuryl, dibenzothienyl, carbazolyl, azacarbazolyl, phenanthrolinyl or fluorenyl, most preferably methyl, phenyl, dibenzofuryl, dibenzothienyl, carbazolyl or azacarbazolyl;

$R^2$, $R^3$, $R^4$ are each independently alkyl, cycloalkyl, heterocycloalkyl, aryl, heteroaryl, wherein the $R^2$, $R^3$ and $R^4$ moieties or two of the $R^2$, $R^3$ and $R^4$ moieties may additionally together form a fused ring system composed of 2 to 6 rings, preferably 2 to 3 rings, each of which may be saturated or mono- or polyunsaturated and may be unsubstituted or substituted by one or more substituents selected from alkyl, cycloalkyl, heterocycloalkyl, aryl, heteroaryl and a group with donor or acceptor action;

in organic electronics applications, preferably selected from switching elements such as organic transistors, for example organic FETs and organic TFTs, organic solar cells and organic light-emitting diodes, the compounds of the formula (I) being used in organic light-emitting diodes preferably as a matrix material and/or hole/exciton blocker material.

It has been found that the aforementioned compounds of the formula (I) in which the silole unit with a fused ring system is formed from at least three fused rings, where the fused ring system has at least one heteroatom-containing group selected from O, S, N, SO, $SO_2$ and P, are particularly suitable for use in applications in which charge carrier conductivity is required, especially for use in organic electronics applications selected from switching elements such as organic transistors, for example organic FETs and organic TFTs, organic solar cells and organic light-emitting diodes (OLEDs), the compounds of the formula (I) in OLEDs being particularly suitable for use as a matrix material and/or as a hole and/or exciton blocker material, especially in combination with a phosphorescence emitter. In the case of use of the compounds of the formula (I), organic light-emitting diodes (OLEDs) which have good efficiencies and a long lifetime are obtained. The outstanding suitability of the compounds of the general formula (I) as a matrix material and/or as a hole and/or exciton blocker material in OLEDs is surprising, especially with regard to JP 2001-172284 A, in which the use of silole derivatives closely related to the compounds of the formula (I) as hole transport materials is disclosed.

The siloles of the formula (I) which are substituted by a fused ring system and are used in accordance with the invention in the aforementioned organic electronics applications are notable for outstanding suitability for use in organic electronics applications, especially as a matrix and/or hole/exciton blocker in OLEDs. More particularly, the silole compounds of the formula (I) used in accordance with the invention have high amorphousness in thin layers and are readily obtainable. As a result, optimal performance of the organic electronics applications, especially of OLEDs, is achieved. The silole compounds of the formula (I) provided in accordance with the invention are especially suitable for providing OLEDs with good efficiencies and a long lifetime. Furthermore, the silole compounds of the formula (I) used in accordance with the invention preferably have an energy difference between the electronically excited triplet state $T_1$ and the base state $S_0$ which is sufficiently great that they can be used as matrix or hole/exciton blocker materials, for example for blue emitters and green emitters. In addition, the silole compounds of the formula (I) can be used as conductor/complementary materials in organic electronics applications selected from switching elements and organic solar cells.

In the context of the present application, the terms unsubstituted or substituted aryl moiety or group, unsubstituted or substituted heteroaryl moiety or group, unsubstituted or substituted alkyl moiety or group, unsubstituted or substituted cycloalkyl moiety or group, unsubstituted or substituted heterocycloalkyl moiety or group, unsubstituted or substituted alkenyl moiety or group, unsubstituted or substituted alkynyl moiety or group, unsubstituted or substituted aralkyl moiety or group, and groups with donor and/or acceptor action are each defined as follows:

An aryl moiety (or group) is understood to mean a moiety which has a base skeleton of 6 to 30 carbon atoms, preferably 6 to 18 carbon atoms, and which is formed from an aromatic ring or a plurality of fused aromatic rings. Suitable base skeletons are, for example, phenyl, naphthyl, anthracenyl or phenanthrenyl, indenyl or fluorenyl. This base skeleton may be unsubstituted (i.e. all carbon atoms which are substitutable bear hydrogen atoms) or be substituted at one, more than one or all substitutable positions of the base skeleton. Suitable substituents are, for example, deuterium, alkoxy moieties, aryloxy moieties, alkylamino groups, arylamino groups, carbazoyl groups, silyl groups, $SiR^2R^3R^4$, suitable silyl groups $SiR^2R^3R^4$ being specified below, alkyl moieties, preferably alkyl moieties having 1 to 8 carbon atoms, more preferably methyl, ethyl or i-propyl, aryl moieties, preferably $C_6$-aryl moieties, which may in turn be substituted or unsubstituted, heteroaryl moieties, preferably heteroaryl moieties which comprise at least one nitrogen atom, more preferably pyridyl moieties and carbazolyl moieties, alkenyl moieties, preferably alkenyl moieties which bear one double bond, more preferably alkenyl moieties with one double bond and 1 to 8 carbon atoms, alkynyl moieties, preferably alkynyl moieties with one triple bond, more preferably alkynyl moieties with one triple bond and 1 to 8 carbon atoms, or groups with donor or acceptor action. Suitable groups with donor or acceptor action are specified below. Most preferably, the substituted aryl moieties bear substituents selected from the group consisting of methyl, ethyl, isopropyl, alkoxy, heteroaryl, halogen, pseudohalogen and amino, preferably arylamino. The aryl moiety or the aryl group is preferably a $C_6$-$C_{18}$-aryl moiety, more preferably a $C_6$-aryl moiety, which is optionally substituted by at least one or more than one of the aforementioned substituents. More preferably, the $C_6$-$C_{18}$-aryl moiety, preferably $C_6$-aryl moiety, has none, one, two, three or four, most preferably none, one or two, of the aforementioned substituents.

A heteroaryl moiety or a heteroaryl group is understood to mean moieties which differ from the aforementioned aryl moieties in that, in the base skeleton of the aryl moieties, at least one carbon atom is replaced by a heteroatom, and in that the base skeleton of the heteroaryl moieties has preferably 5 to 18 ring atoms. Preferred heteroatoms are N, O and S. Particularly preferred suitable heteroaryl moieties are nitrogen-containing heteroaryl moieties. Most preferably, one or two carbon atoms of the base skeleton are replaced by heteroatoms, preferably nitrogen. Especially preferably, the base skeleton is selected from systems such as pyridine, pyrimidine and five-membered heteroaromatics such as pyrrole, furan, pyrazole, imidazole, thiophene, oxazole, thiazole, triazole. In addition, the heteroaryl moieties may be fused ring systems, for example benzofuryl, benzothienyl, benzopyrrolyl, dibenzofuryl, dibenzothienyl, phenanthrolinyl, carbazolyl moieties or azacarbazolyl moieties. The base skeleton may be substituted at one, more than one or all substitutable positions of the base skeleton. Suitable substituents are the same as have already been specified for the aryl groups.

An alkyl moiety or an alkyl group is understood to mean a moiety having 1 to 20 carbon atoms, preferably 1 to 10 carbon atoms, more preferably 1 to 8 and most preferably 1 to 4 carbon atoms. This alkyl moiety may be branched or unbranched and may optionally be interrupted by one or more heteroatoms, preferably Si, N, O or S, more preferably N, O or S. In addition, this alkyl moiety may be substituted by one or more of the substituents specified for the aryl groups. It is likewise possible that the alkyl moiety bears one or more (hetero)aryl groups. In the context of the present application, for example, benzyl moieties are thus substituted alkyl moieties. All of the above-listed (hetero)aryl groups are suitable. The alkyl moieties are more preferably selected from the group consisting of methyl, ethyl, isopropyl, n-propyl, n-butyl, isobutyl and tert-butyl; very particular preference is given to methyl and ethyl.

A cycloalkyl moiety or a cycloalkyl group is understood to mean a moiety having 3 to 20 carbon atoms, preferably 3 to 10 carbon atoms, more preferably 3 to 8 carbon atoms. This base skeleton may be unsubstituted (i.e. all carbon atoms which are substitutable bear hydrogen atoms) or may be substituted at one, more than one or all substitutable positions of the base skeleton. Suitable substituents are the groups already specified above for the aryl moieties. It is likewise possible that the cycloalkyl moiety bears one or more (hetero)aryl groups. Examples of suitable cycloalkyl moieties are cyclopropyl, cyclopentyl and cyclohexyl.

A heterocycloalkyl moiety or a heterocycloalkyl group is understood to mean moieties which differ from the aforementioned cycloalkyl moieties in that, in the base skeleton of the cycloalkyl moieties, at least one carbon atom is replaced by a heteroatom. Preferred heteroatoms are N, O and S. Most preferably, one or two carbon atoms of the base skeleton of the cycloalkyl moieties are replaced by heteroatoms. Examples of suitable heterocycloalkyl moieties are moieties derived from pyrrolidine, piperidine, piperazine, tetrahydrofuran, dioxane.

An alkenyl moiety or an alkenyl group is understood to mean a moiety which corresponds to the aforementioned alkyl moieties having at least two carbon atoms, with the difference that at least one C—C single bond of the alkyl moiety is replaced by a C—C double bond. The alkenyl moiety preferably has one or two double bonds.

An $SiR^2R^3R^4$ group is understood to mean a silyl moiety in which $R^2$, $R^3$ and $R^4$ are each independently alkyl, cycloalkyl, heterocycloalkyl, aryl, heteroaryl, wherein the $R^2$, $R^3$ and $R^4$ moieties or two of the $R^2$, $R^3$ and $R^4$ moieties may additionally together form a fused ring system composed of 2 to 6 rings, preferably 2 to 3 rings, each of which may be saturated or mono- or polyunsaturated and may be unsubstituted or substituted by one or more substituents selected from alkyl, cycloalkyl, heterocycloalkyl, aryl, heteroaryl and a group with donor or acceptor action; preferably—in the case when a fused ring system is present—two of the three $R^2$, $R^3$ and $R^4$ moieties form the fused ring system, while the third moiety has one of the aforementioned definitions.

A particularly preferred $SiR^2R^3R^4$ moiety has the following formula:

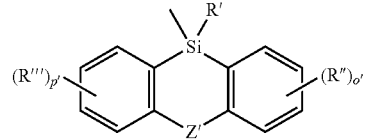

in which:
R' is independently alkyl, cycloalkyl, heterocycloalkyl, aryl, heteroaryl, preferably alkyl or aryl;
R", R''' are each independently alkyl, cycloalkyl, heterocycloalkyl, aryl, heteroaryl or a group with donor or acceptor action, preferably alkyl, heteroaryl or a group with donor or acceptor action;
Z' is a bond or NR"", CR""$_2$, O, SO, SO$_2$, Si or S, preferably a bond;
R"" is independently alkyl, cycloalkyl, heterocycloalkyl, aryl or heteroaryl, preferably alkyl or aryl;
R""' is independently hydrogen, alkyl, cycloalkyl, heterocycloalkyl, aryl or heteroaryl, preferably alkyl or aryl;
o, p are each independently 0, 1, 2, 3 or 4, preferably 0, 1 or 2, more preferably 0.

In the context of the present application, a group or a substituent with donor or acceptor action is understood to mean the following groups:

Groups with donor action are understood to mean groups which have a +I and/or +M effect, and groups with acceptor action to mean groups which have a −I and/or −M effect. Preferred suitable groups are selected from $C_1$-$C_{20}$-alkoxy, $C_6$-$C_{30}$-aryloxy, $C_1$-$C_{20}$-alkylthio, $C_6$-$C_{30}$-arylthio, $SiR^{20}R^{21}R^{22}$, halogen moieties, halogenated $C_1$-$C_{20}$-alkyl moieties, carbonyl (—CO($R^{20}$)), carbonylthio (—C=O (S$R^{20}$)), carbonyloxy (—C=O(O$R^{20}$)), oxycarbonyl (—OC=O($R^{20}$)), thiocarbonyl (—SC=O($R^{20}$)), amino (—N$R^{20}R^{21}$), pseudohalogen moieties, amido (—C=O (N$R^{20}$)), —N$R^{20}$C=O($R^{21}$), phosphonate (—P(O) (O$R^{20}$)$_2$, phosphate (—OP(O) (O$R^{20}$)$_2$), phosphine (—P$R^{20}R^{21}$), phosphine oxide (—P(O)$R^{20}_2$), sulfate (—OS(O)$_2$O$R^{20}$), sulfoxide (—S(O)$R^{20}$), sulfonate (—S(O)$_2$O$R^{20}$), sulfonyl (—S(O)$_2$R$^{20}$, sulfonamide (—S(O)$_2$NR$^{20}$R$^{21}$), NO$_2$, boronic acid esters (—OB(OR$^{20}$)$_2$), imino (—C=NR$^{20}$R$^{21}$)) borane moieties, stannane moieties, hydrazine moieties, hydrazone moieties, oxime moieties, nitroso groups, diazo groups, vinyl groups, sulfoximines, alanes, germanes, boroximes and borazines.

The R$^{20}$, R$^{21}$ and R$^{22}$ moieties mentioned in the aforementioned groups with donor or acceptor action are each independently:

Substituted or unsubstituted C$_1$-C$_{20}$-alkyl or substituted or unsubstituted C$_6$-C$_{30}$-aryl, suitable and preferred alkyl and aryl moieties having been specified above. The R$^{20}$, R$^{21}$ and R$^{22}$ moieties are more preferably each C$_1$-C$_6$-alkyl, e.g. methyl, ethyl or i-propyl, or phenyl. In a preferred embodiment—in the case of SiR$^{20}$R$^{21}$R$^{22}$—R$^{20}$, R$^{21}$ and R$^{22}$ are preferably each independently substituted or unsubstituted C$_1$-C$_{20}$-alkyl or substituted or unsubstituted aryl, preferably phenyl.

Preferred substituents with donor or acceptor action are selected from the group consisting of:

C$_1$- to C$_{20}$-alkoxy, preferably C$_1$-C$_6$-alkoxy, more preferably ethoxy or methoxy; C$_6$-C$_{30}$-aryloxy, preferably C$_6$-C$_{10}$-aryloxy, more preferably phenyloxy; SiR$^{20}$R$^{21}$R$^{22}$ wherein R$^{20}$, R$^{21}$ and R$^{22}$ are preferably each independently substituted or unsubstituted alkyl or substituted or unsubstituted aryl, preferably phenyl; more preferably, at least one of the R$^{20}$, R$^{21}$ and R$^{22}$ moieties is substituted or unsubstituted phenyl; most preferably, at least one of the R$^{20}$, R$^{21}$ and R$^{22}$ moieties is substituted phenyl, suitable substituents having been specified above; halogen moieties, preferably F, Cl, more preferably F, halogenated C$_1$-C$_{20}$-alkyl moieties, preferably halogenated C$_1$-C$_6$-alkyl moieties, most preferably fluorinated C$_1$-C$_6$-alkyl moieties, e.g. CF$_3$, CH$_2$F, CHF$_2$ or C$_2$F$_5$; amino, preferably dimethylamino, diethylamino or diarylamino, more preferably diarylamino; pseudohalogen moieties, preferably CN, —C(O)OC$_1$-C$_4$-alkyl, preferably —C(O)OMe, P(O)R$_2$, preferably P(O)Ph$_2$.

Very particularly preferred substituents with donor or acceptor action are selected from the group consisting of methoxy, phenyloxy, halogenated C$_1$-C$_4$-alkyl, preferably CF$_3$, CH$_2$F, CHF$_2$, C$_2$F$_5$, halogen, preferably F, CN, SiR$^{20}$R$^{21}$R$^{22}$, suitable R$^{20}$, R$^{21}$ and R$^{22}$ moieties already having been specified, diarylamino (NR$^{20}$R$^{21}$, wherein R$^{20}$, R$^{21}$ are each C$_6$-C$_{30}$-aryl), —C(O)OC$_1$-C$_4$-alkyl, preferably —(O)OMe, P(O)Ph$_2$.

Halogen groups are preferably understood to mean F, Cl and Br, more preferably F and Cl, most preferably F.

Pseudohalogen groups are preferably CN, SCN and OCN, more preferably CN.

The aforementioned groups with donor or acceptor action do not rule out that further moieties and substituents which are specified in the present application but are not included in the above list of groups with donor or acceptor action have donor or acceptor action.

The aryl moieties or groups, heteroaryl moieties or groups, alkyl moieties or groups, cycloalkyl moieties or groups, heterocycloalkyl moieties or groups, alkenyl moieties or groups and groups with donor and/or acceptor action may—as mentioned above—be substituted or unsubstituted. In the context of the present application, an unsubstituted group is understood to mean a group in which the substitutable atoms of the group bear hydrogen atoms. In the context of the present application, a substituted group is understood to mean a group in which one or more substitutable atom(s) bear(s) a substituent instead of a hydrogen atom at least at one position. Suitable substituents are the substituents already mentioned above with regard to the aryl moieties or groups.

When moieties with the same numbering occur more than once in the compounds of the present application, these moieties may each independently have the definitions specified.

The A group in the silole compounds of the general formula (I) is a fused ring system formed from at least 3, preferably 3 or 4, more preferably 3, fused rings which each independently have 4 to 10, preferably 5 to 7, more preferably 5 or 6, ring members, and may be saturated or mono- or polyunsaturated and may be unsubstituted or substituted by one or more substituents selected from alkyl, cycloalkyl, heterocycloalkyl, aryl, heteroaryl, SiR$^2$R$^3$R$^4$, and groups with donor or acceptor action, preferably alkyl, heteroaryl, halogen, pseudohalogen, alkoxy, amino and SiR$^2$R$^3$R$^4$, wherein the fused ring system has at least one heteroatom-containing group, preferably selected from O, S, N, P, SO, SO$_2$ and Si, more preferably O, S and N, most preferably O and S, in the fused ring system itself or in at least one substituent, preferably in the fused ring system itself.

The fused ring system is preferably formed from three fused rings which each independently have five or six ring members, wherein at least one of the three fused rings is at least diunsaturated, wherein the fused ring system has at least one heteroatom-containing group selected from the group consisting of S, O, N, SO, SO$_2$ and P, preferably S, O and N, more preferably S and O. The fused ring system may have the aforementioned substituents selected from alkyl, cycloalkyl, heterocycloalkyl, aryl, heteroaryl, SiR$^2$R$^3$R$^4$ and groups with donor or acceptor action, preferably alkyl, heteroaryl, halogen, pseudohalogen, alkoxy, amino and SiR$^2$R$^3$R$^4$.

The fused ring system A more preferably has the following general formula Aa

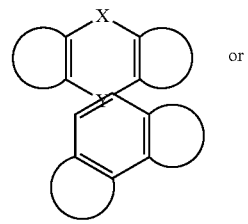

(Aa)

or (Ab)

in which:
X is S, O, NR$^5$, SO, SO$_2$ or PR$^6$, preferably S, O or NR$^5$, more preferably S or O;
Y is a bond or NR$^5$, CR$^7$R$^8$, O, SO, SO$_2$ or S, preferably NR$^5$, S or a bond, more preferably a bond;
R$^5$, R$^6$ are each independently alkyl, cycloalkyl, heterocycloalkyl, aryl or heteroaryl, preferably aryl or alkyl, more preferably phenyl;
R$^7$, R$^8$ are each independently hydrogen, alkyl, cycloalkyl, heterocycloalkyl, aryl or heteroaryl, preferably aryl or alkyl; and

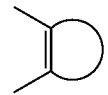

in each case independently is a fused ring which has 5 to 6 ring members and, in addition to the double bond already present, may have one or more double bonds and may be unsubstituted or substituted by one or more substituents, preferably one or two substituents, selected from alkyl, cycloalkyl, heterocycloalkyl, aryl, heteroaryl, SiR$^2$R$^3$R$^4$ and groups with donor or acceptor action, preferably alkyl, heteroaryl, halogen, pseudohalogen, alkoxy, amino and SiR$^2$R$^3$R$^4$, wherein the fused ring having 5 or 6 ring atoms may additionally be annulated to one or more further fused rings having 5 or 6 ring atoms;

$R^2$, $R^3$, $R^4$
are each independently alkyl, cycloalkyl, heterocycloalkyl, aryl, heteroaryl, where the $R^2$, $R^3$ and $R^4$ moieties or two of the $R^2$, $R^3$ and $R^4$ moieties may additionally together form a fused ring system composed of 2 to 6 rings, preferably 2 to 3 rings, each of which may be saturated or mono- or polyunsaturated and unsubstituted or substituted by one or more substituents selected from alkyl, cycloalkyl, heterocycloalkyl, aryl, heteroaryl and a group with donor or acceptor action.

Most preferably, the A group in formula (I) has the following formula Aaa:

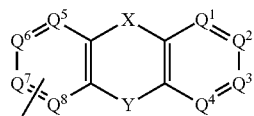

(Aaa)

in which:

X is S, O, $NR^5$, SO, $SO_2$ or $PR^6$, preferably S, O or $NR^5$, more preferably S or O;

Y is a bond or $NR^5$, $CR^7R^8$, O, SO, $SO_2$ or S, preferably a bond or $NR^5$, more preferably a bond;

$Q^1$ to $Q^8$ are each independently $CR^9$, N, preferably each independently $CR^9$, wherein via one of the $Q^1$, $Q^2$, $Q^3$, $Q^4$, $Q^5$, $Q^6$, $Q^7$ or $Q^8$ groups a linkage to the silicon atom of the

group is effected and this $Q^1$, $Q^2$, $Q^3$, $Q^4$, $Q^5$, $Q^6$, $Q^7$ or $Q^8$ group is C;

$R^5$, $R^6$ are each independently alkyl, cycloalkyl, heterocycloalkyl, aryl or heteroaryl, preferably aryl or alkyl, more preferably phenyl;

$R^7$, $R^8$ are each independently hydrogen, alkyl, cycloalkyl, heterocycloalkyl, aryl or heteroaryl, preferably aryl or alkyl;

$R^9$ is hydrogen, alkyl, cycloalkyl, heterocycloalkyl, aryl, heteroaryl, $SiR^2R^3R^4$, groups with donor or acceptor action, preferably hydrogen, alkyl, heteroaryl, halogen, pseudohalogen, alkoxy, amino or $SiR^2R^3R^4$;

$R^2$, $R^3$, $R^4$
are each independently alkyl, cycloalkyl, heterocycloalkyl, aryl, heteroaryl, where the $R^2$, $R^3$ and $R^4$ moieties or two of the $R^2$, $R^3$ and $R^4$ moieties may additionally together form a fused ring system composed of 2 to 6 rings, preferably 2 to 3 rings, each of which may be saturated or mono- or polyunsaturated and may be unsubstituted or substituted by one or more substituents selected from alkyl, cycloalkyl, heterocycloalkyl, aryl, heteroaryl and a group with donor or acceptor action.

In a preferred embodiment, $R^9$ in the group of the formula Aaa in the $Q^1$, $Q^2$, $Q^4$, $Q^5$, $Q^6$ and $Q^8$ groups is hydrogen and $R^9$ in the $Q^3$ group is hydrogen or $SiR^2R^3R^4$, and $Q^7$ is C and is linked to the silicon atom of the

group.

Preferred embodiments of the alkyl, cycloalkyl, heterocycloalkyl, aryl, heteroaryl, $SiR^2R^3R^4$ groups, and groups with donor or acceptor action which are present in preferred embodiments in the groups of the formulae (Aa) and (Aaa) have been mentioned above.

Most preferably, the group of the formula Aaa has the following definitions:

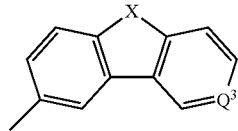

in which:

X is O, S or $NR^5$, preferably O or S;

$R^5$ is aryl or heteroaryl, preferably phenyl;

$Q^3$ is C—H or

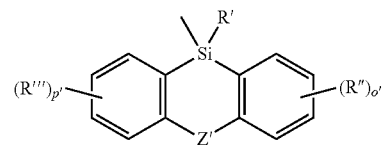

in which:

R' is independently alkyl or aryl;

R'', R''' are each independently alkyl or heteroaryl or a group with donor or acceptor action;

Z' is a bond or NR'''', CR''''$_2$ O, Si or S, preferably a bond,

R'''' is independently alkyl or aryl,

R''''' is independently hydrogen, alkyl or aryl;

o', p' are each independently 0, 1 or 2, preferably 0.

The

group in the silole compounds of the formula (I) is an Si-comprising ring which has 4 to 10, preferably 5 to 7, more preferably 5 or 6, most preferably 5, ring members, wherein the ring may be saturated or mono- or polyunsaturated and, in addition to the silicon atom, may have one or more further heteroatoms, preferably selected from O, S and N, more preferably O and N, and may be unsubstituted or substituted by one or more substituents selected from alkyl, cycloalkyl, heterocycloalkyl, aryl, heteroaryl and groups with donor or acceptor action, wherein the Si-comprising ring may additionally be part of a fused ring system formed from at least 2, preferably 2 or 3, more preferably 3, rings, wherein the further rings—in addition to the Si-comprising ring—in the fused ring system may each independently be saturated or mono- or polyunsaturated and be unsubstituted or substituted by one or more substituents selected from alkyl, cycloalkyl, heterocycloalkyl, aryl, heteroaryl and groups with donor or acceptor action, and may have one or more heteroatoms, preferably selected from O, S and N, more particularly S and N.

In a preferred embodiment, the

group in the general formula (I) is an Si-comprising ring which has 5 or 6 ring members, wherein the ring is at least diunsaturated and, in addition to the silicon atom, contains no or one further heteroatom-containing group selected from S, O, SO, $SO_2$ and N, preferably O and N, and may be unsubstituted or substituted by one or more substituents selected from alkyl, cycloalkyl, heterocycloalkyl, aryl, heteroaryl and groups with donor or acceptor action, wherein the Si-comprising ring may be part of a fused ring system formed from 2 or 3, preferably 3, rings, wherein the further rings—in addition to the Si—comprising ring—in the fused ring system may each independently be saturated or mono- or polyunsaturated and may be unsubstituted or substituted by one or more substituents selected from alkyl, cycloalkyl, heterocycloalkyl, aryl, heteroaryl and groups with donor or acceptor action, and may have one or two heteroatoms selected from O, S, SO, $SO_2$ and N, preferably S and N.

More preferably, the

group in formula (I) has the following formula (Sia):

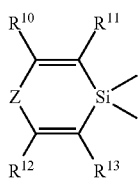

(Sia)

in which:
Z is a bond or $NR^{14}$, $CR^{15}R^{16}$, O, SO, $SO_2$, Si or S, preferably a bond,
$R^{10}$ to $R^{13}$ are each independently hydrogen, alkyl, cycloalkyl, heterocycloalkyl, aryl, heteroaryl and groups with donor or acceptor action, or $R^{10}$ and $R^{11}$ and/or $R^{12}$ and $R^{13}$ and/or $R^{10}$ and $R^{12}$ in each case independently form, together with the two particular carbon atoms of the Si-comprising ring in the formula (Sia) to which they are linked, a cyclic moiety which has 5 or 6 ring atoms and may have one, two or three double bonds and may have one or two heteroatoms selected from N, SO, $SO_2$ or S, preferably N, and may be unsubstituted or substituted by one or more substituents selected from alkyl, cycloalkyl, heterocycloalkyl, aryl, heteroaryl and groups with donor or acceptor action, wherein the cyclic moiety having 5 or 6 ring atoms may additionally be annulated to one or more further cyclic moieties having 5 or 6 ring atoms;
$R^{14}$ is alkyl, cycloalkyl, heterocycloalkyl, aryl or heteroaryl, preferably aryl or alkyl, more preferably phenyl; and
$R^{15}$, $R^{16}$ are each independently hydrogen, alkyl, cycloalkyl, heterocycloalkyl, aryl or heteroaryl, preferably phenyl or alkyl.

Most preferably, the

group in formula (I) has the following formula (Siaa):

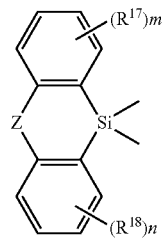

(Siaa)

in which:
Z is a bond or $NR^{14}$, $CR^{15}R^{16}$, O, SO, $SO_2$, Si or S, preferably a bond,
$R^{14}$ is alkyl, cycloalkyl, heterocycloalkyl, aryl or heteroaryl, preferably aryl or alkyl, more preferably phenyl; and
$R^{15}$, $R^{16}$ are each independently hydrogen, alkyl, cycloalkyl, heterocycloalkyl, aryl or heteroaryl, preferably aryl or alkyl;
$R^{17}$, $R^{18}$ are each independently alkyl, cycloalkyl, heterocycloalkyl, aryl, heteroaryl, or groups with donor or acceptor action, preferably alkyl, heteroaryl or groups with donor or acceptor action, or two adjacent $R^{17}$ moieties and/or two adjacent $R^{18}$ moieties in each case independently form, together with the two particular carbon atoms to which they are linked, a cyclic moiety which has 5 or 6 ring atoms and may have one, two or three double bonds and may have one or two heteroatom-containing groups selected from N, O, SO, $SO_2$ or S, preferably N, and may be unsubstituted or substituted by one or more substituents selected from alkyl, cycloalkyl, heterocycloalkyl, aryl, heteroaryl and groups with donor or acceptor action;
n, m are each independently 0, 1, 2, 3 or 4, preferably 0, 1 or 2, more preferably 0 or 1, most preferably 0.

The aforementioned alkyl, cycloalkyl, heterocycloalkyl, aryl, heteroaryl groups, and groups with donor or acceptor action, have, in the general formulae (Sia) and (Siaa), the aforementioned definitions.

A particularly preferred

group in formula (I) is specified below

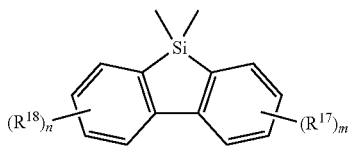

in which:
$R^{17}$, $R^{18}$ are each independently alkyl or groups with donor or acceptor action,
n, m are each independently 0 or 1, preferably 0.

$R^1$ in formula (I) is A, alkyl, cycloalkyl, heterocycloalkyl, aryl or heteroaryl, preferably alkyl, aryl or heteroaryl, more preferably alkyl, phenyl, naphthyl, indenyl, benzofuryl, benzothienyl, benzopyrrolyl, dibenzofuryl, dibenzothienyl, carbazolyl, azacarbazolyl, phenanthrolinyl or fluorenyl, most preferably methyl, phenyl, dibenzofuryl, dibenzothienyl, carbazolyl or azacarbazolyl. The aforementioned groups may be unsubstituted or mono- or polysubstituted by substituents selected from the group consisting of alkyl, cycloalkyl, heterocycloalkyl, aryl, heteroaryl and groups with donor or acceptor action.

Preferred embodiments with regard to the aforementioned moieties and groups A, alkyl, cycloalkyl, heterocycloalkyl, aryl, heteroaryl, halogen and pseudohalogen are mentioned above.

In a preferred embodiment, the present invention thus relates to the use of compounds of the formula (Ia):

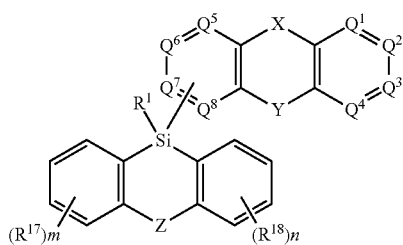

in which:
X is S, O, NR$^5$, SO, SO$_2$ or PR$^6$, preferably S, O or NR$^5$, more preferably S or O;
Y is a bond, NR$^5$, CR$^7$R$^8$, O, SO, SO$_2$ or S, preferably a bond or NR$^5$, more preferably a bond;
Q$^1$ to Q$^8$ are each independently CR$^9$ or N, preferably each independently CR$^9$, wherein via one of the Q$^1$ to Q$^8$ groups a bond to the silicon atom of the

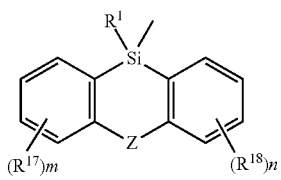

group is effected, and this group is C;
R$^5$, R$^6$ are each independently alkyl, cycloalkyl, heterocycloalkyl, aryl or heteroaryl, preferably aryl or alkyl, more preferably phenyl;
R$^7$, R$^8$ are each independently hydrogen, alkyl, cycloalkyl, heterocycloalkyl, aryl or heteroaryl, preferably alkyl or aryl;
R$^9$ is independently hydrogen, alkyl, cycloalkyl, heterocycloalkyl, aryl, heteroaryl, SiR$^2$R$^3$R$^4$ or a group with donor or acceptor action, preferably hydrogen, alkyl, heteroaryl, a group with donor or acceptor action or SiR$^2$R$^3$R$^4$;
R$^2$, R$^3$, R$^4$
are each independently alkyl, cycloalkyl, heterocycloalkyl, aryl, heteroaryl, wherein the R$^2$, R$^3$ and R$^4$ moieties or two of the R$^2$, R$^3$ and R$^4$ moieties may additionally together form a fused ring system composed of 2 to 6 rings, preferably 2 to 3 rings, each of which may be saturated or mono- or polyunsaturated and may be unsubstituted or substituted by one or more substituents selected from alkyl, cycloalkyl, heterocycloalkyl, aryl, heteroaryl and a group with donor or acceptor action;
Z is a bond or NR$^{14}$, CR$^{15}$R$^{16}$, O, SO, SO$_2$, Si or S, preferably a bond;
R$^{14}$ is alkyl, cycloalkyl, heterocycloalkyl, aryl or heteroaryl, preferably alkyl or aryl, more preferably phenyl;
R$^{15}$, R$^{16}$ are each independently hydrogen, alkyl, cycloalkyl, heterocycloalkyl, aryl or heteroaryl, preferably alkyl or aryl;
R$^{17}$, R$^{18}$ are each independently alkyl, cycloalkyl, heterocycloalkyl, aryl, heteroaryl, or a group with donor or acceptor action, preferably alkyl, heteroaryl or a group with donor or acceptor action, or two adjacent R$^{17}$ moieties and/or two adjacent R$^{18}$ moieties in each case independently form, together with the two particular carbon atoms to which they are linked, a cyclic moiety which has 5 or 6 ring atoms and may have one, two or three double bonds and may have one or two heteroatom-containing groups selected from N, O, SO, SO$_2$ or S, preferably N, and may be unsubstituted or substituted by one or more substituents selected from alkyl, cycloalkyl, heterocycloalkyl, aryl, heteroaryl and groups with donor or acceptor action;
n, m are each independently 0, 1, 2, 3 or 4, preferably 0, 1 or 2, more preferably 0 or 1, most preferably 0;
R$^1$ is

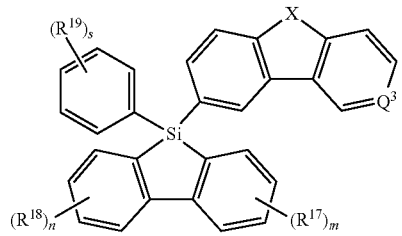

alkyl, cycloalkyl, heterocycloalkyl, aryl or heteroaryl, preferably alkyl, aryl or heteroaryl, more preferably alkyl, phenyl, naphthyl, indenyl, benzofuryl, benzothienyl, benzopyrrolyl, dibenzofuryl, dibenzothienyl, carbazolyl, azacarbazolyl, phenanthrolinyl or fluorenyl, most preferably methyl, phenyl or dibenzofuryl, dibenzothienyl, carbazolyl or azacarbazolyl.

Preferred embodiments of the moieties and groups specified in the formula (Ia) are the embodiments specified above for the corresponding moieties and groups.

Very particularly preferred compounds of the formula (I) have the following general formula:

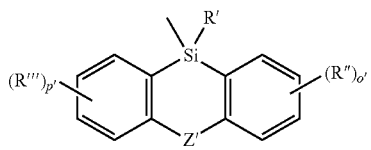

in which:
X is O, S, SO, SO$_2$ or NR$^5$, preferably O or S;
R$^5$ is aryl or alkyl, preferably phenyl;
Q$^3$ is C—H or

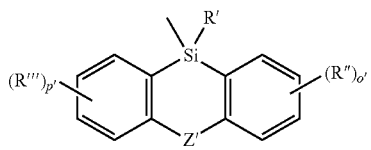

in which
R' is alkyl or aryl;
R'', R''' are each independently alkyl, heteroaryl or a group with donor or acceptor action;
Z' is a bond or NR'''', CR''''', O, SO, SO$_2$, Si or S, preferably a bond;
R'''' is independently alkyl or aryl;
R''''' is independently hydrogen, alkyl or aryl;
o', p' are each independently 0, 1 or 2, preferably 0, R$^{17}$, R$^{18}$ are each independently alkyl or a group with donor or acceptor action, R$^{19}$ is independently alkyl or a group with donor or acceptor action, or two adjacent R$^{19}$ groups together form a ring which has preferably 5 or 6, more preferably 5, ring members, wherein all ring members may be carbon atoms, or one or two ring members, preferably one ring member, is/are heteroatoms selected from O, S and N, and the remaining ring members are carbon atoms, wherein the ring may be unsubstituted or substituted by one or more substituents mentioned above for the aryl moieties and/or may be annulated to one or more further rings, preferably one further ring, wherein the ring is preferably benzoannulated; the ring is more preferably a benzoannulated 5-membered ring which has, in the 5-membered ring, a heteroatom selected from O, S and N;

n, m are each independently 0, 1 or 2, preferably 0 or 1, more preferably 0;

s is 0, 1 or 2, preferably 0 or, in the case when two adjacent R$^{19}$ groups form a ring, 2.

Examples of suitable compounds of the formula (I) are:

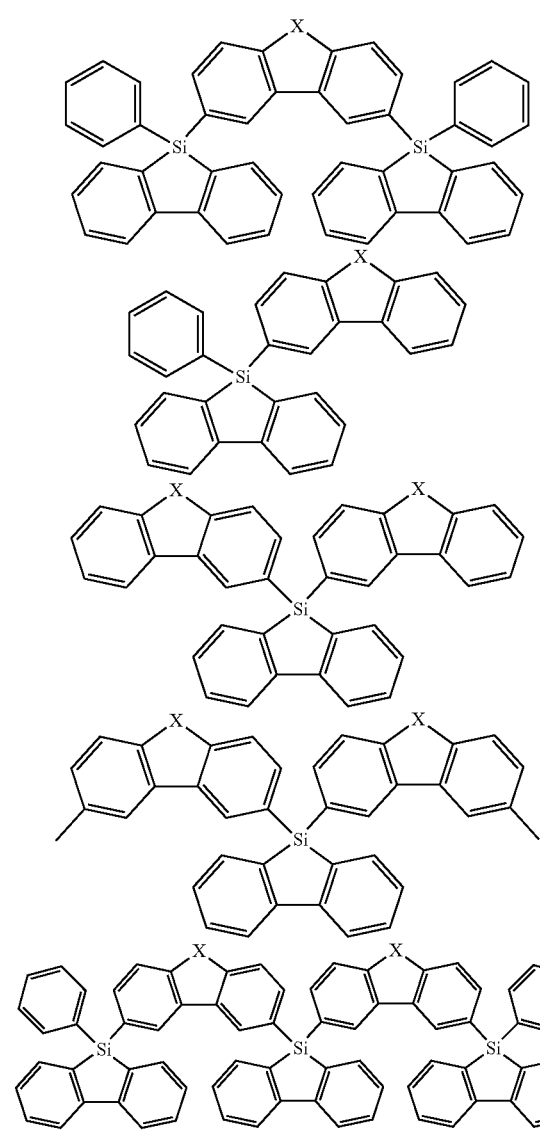

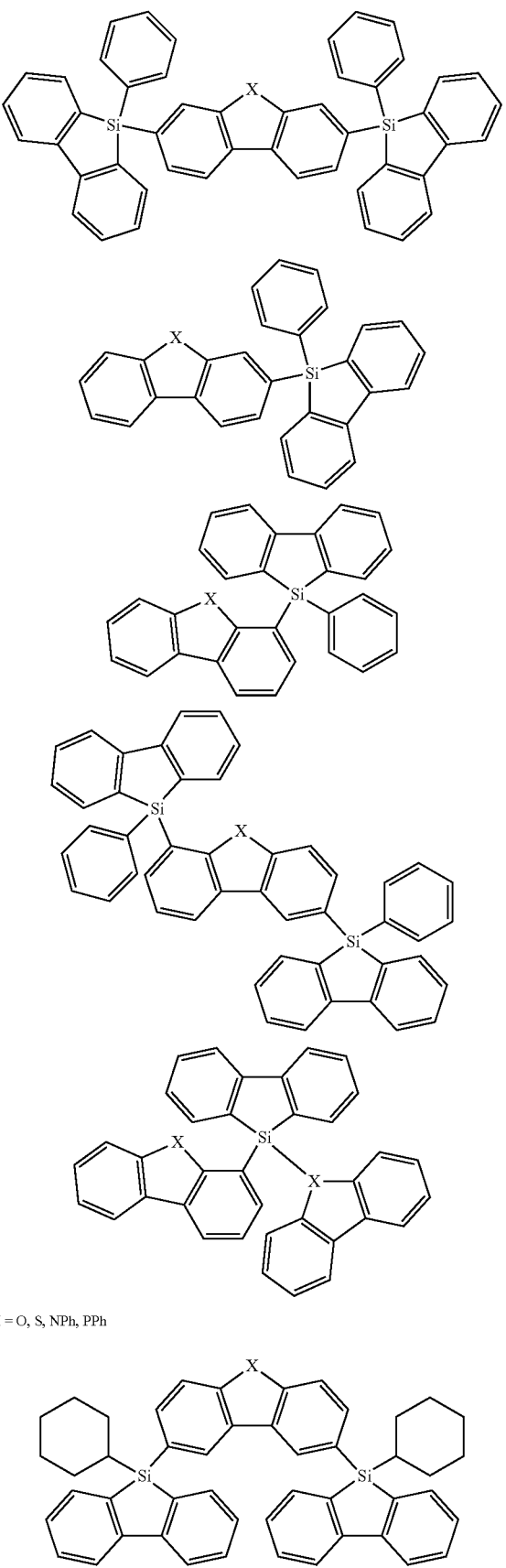

X = O, S, NPh, PPh

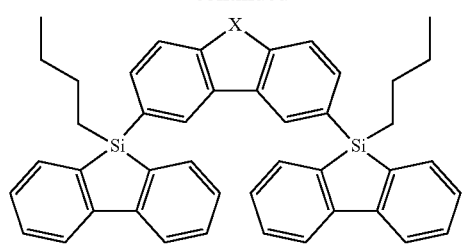
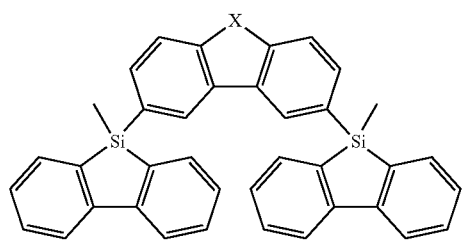
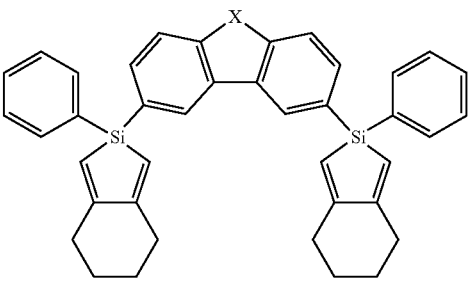
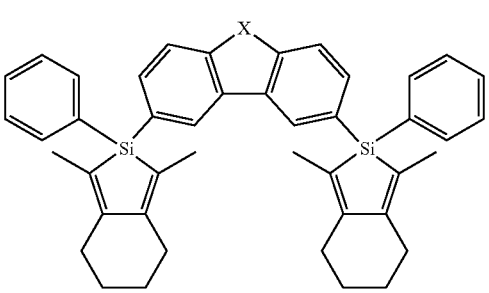
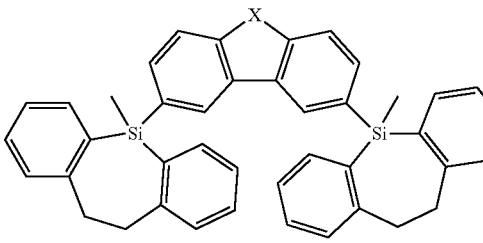
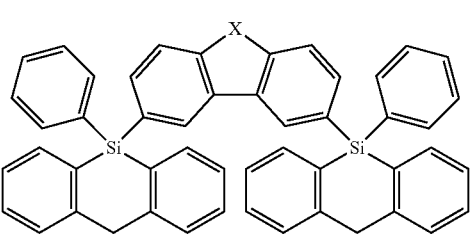
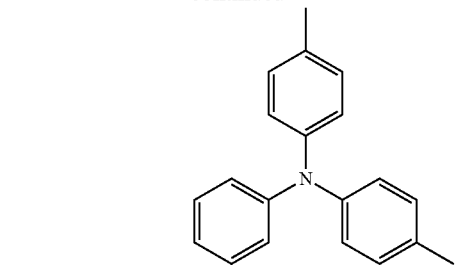
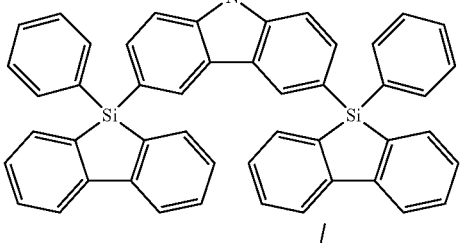
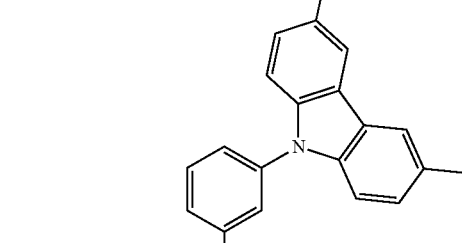
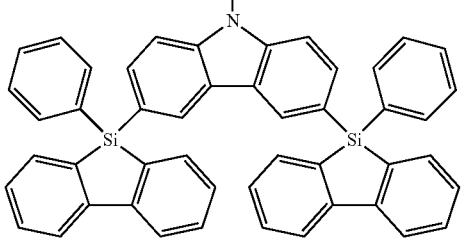
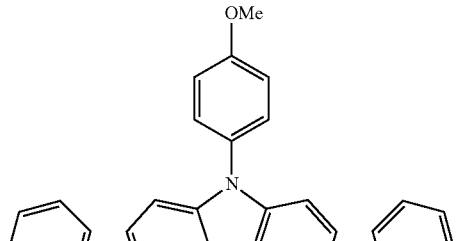
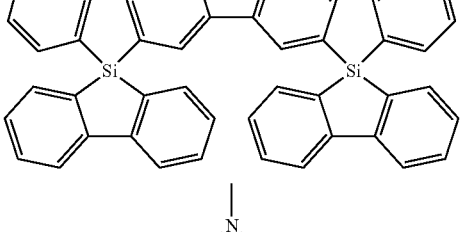
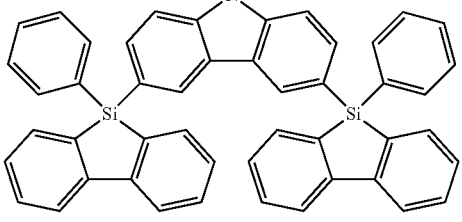

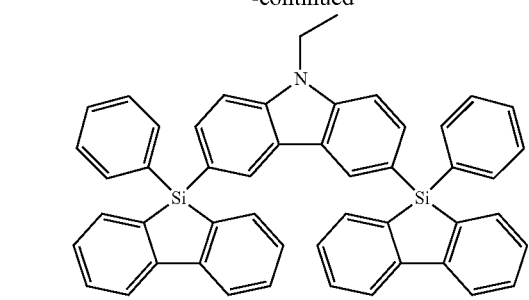
X = O, S, NPh, PPh
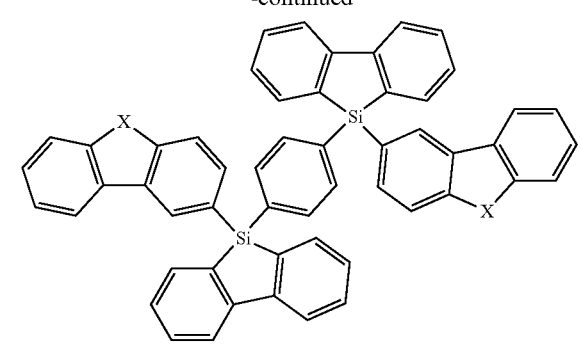
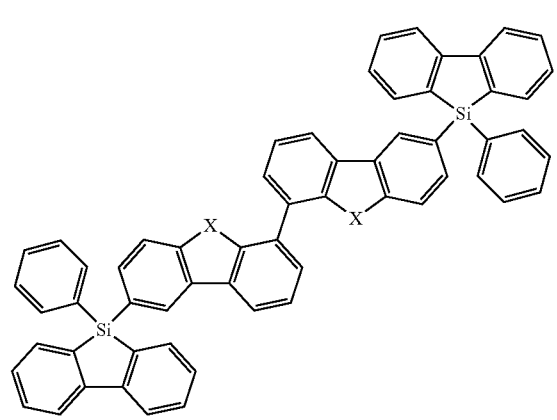
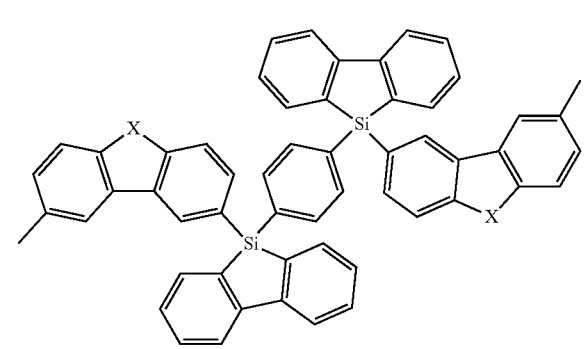
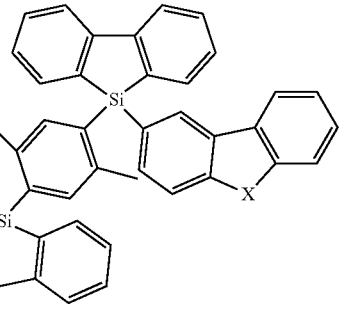
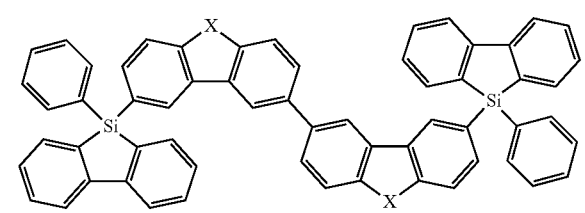
X = O, S, NPh, PPh
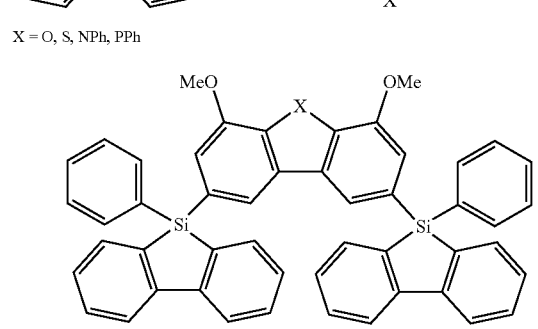

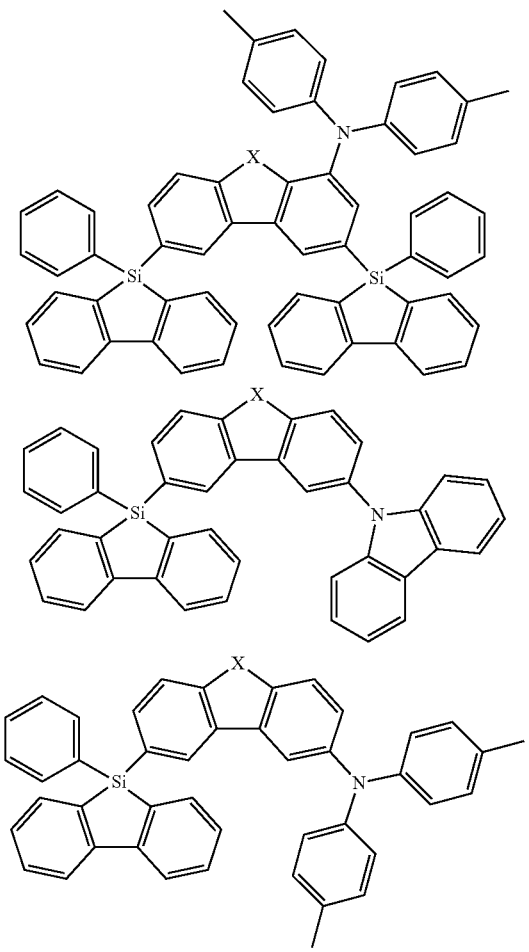
X = O, S
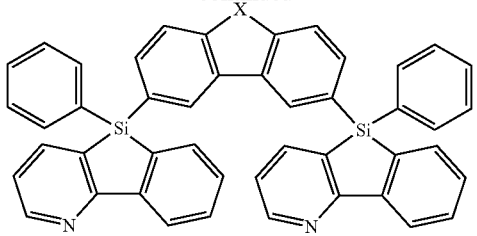
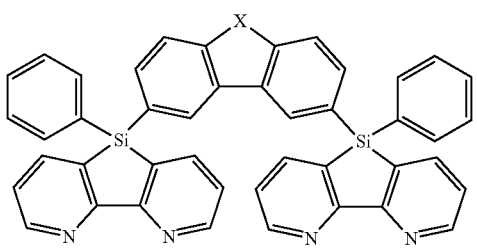
X = O, S, NPh, PPh
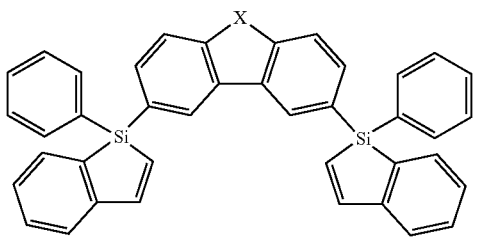
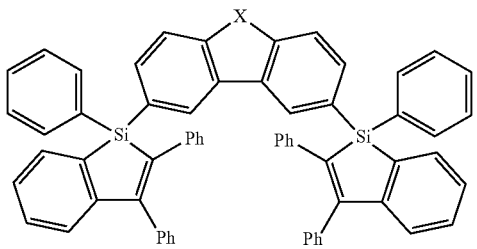
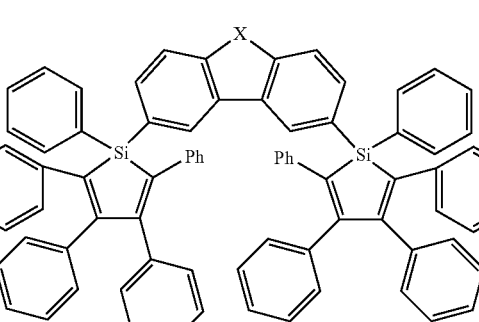
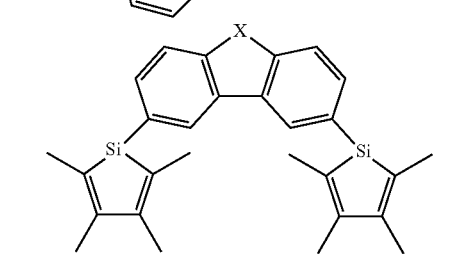
X = O, S, NPh, PPh

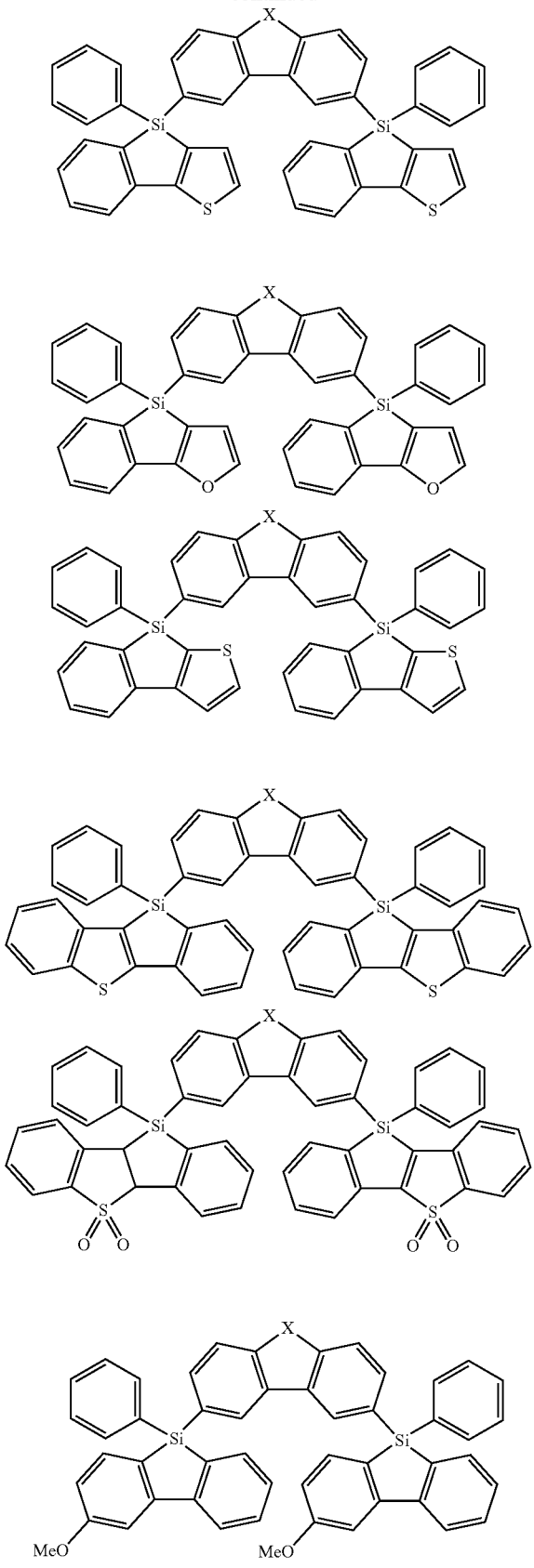
X = O, S, NPh, PPh
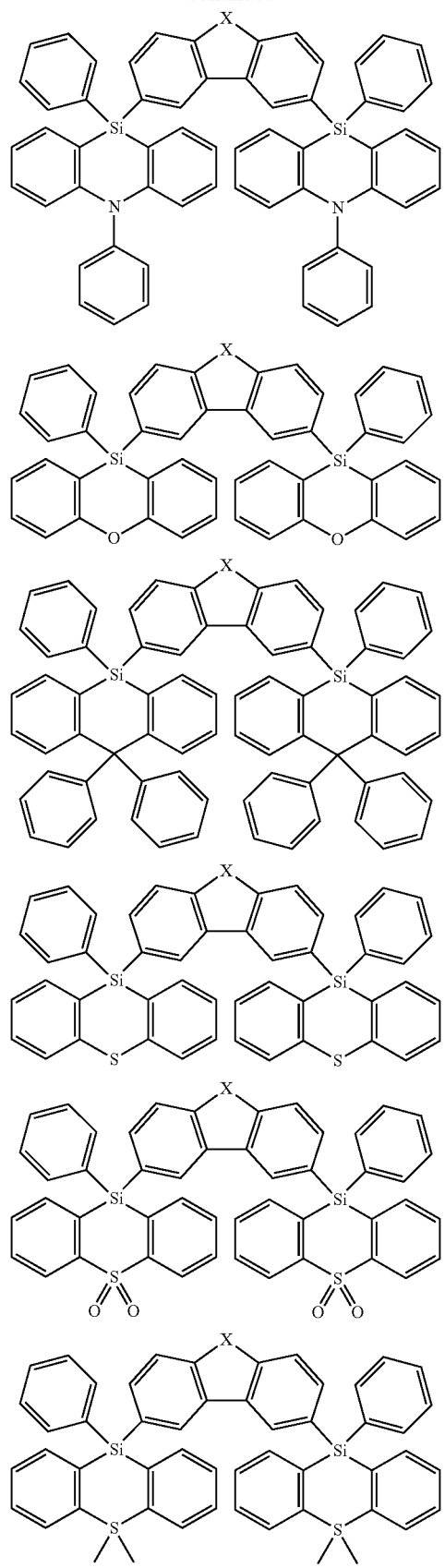

27
-continued
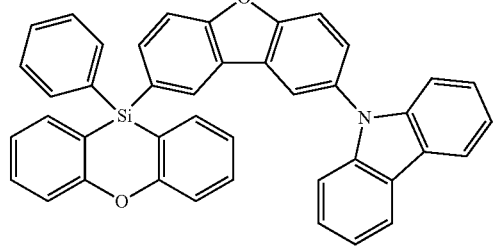
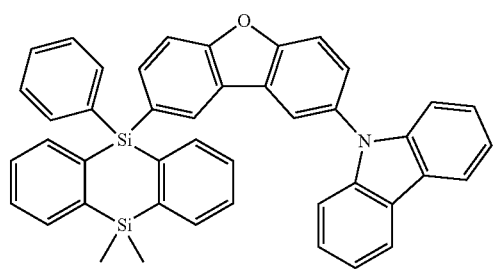
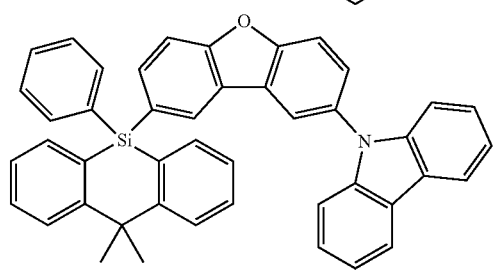
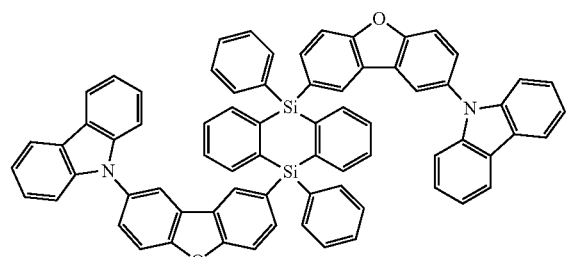
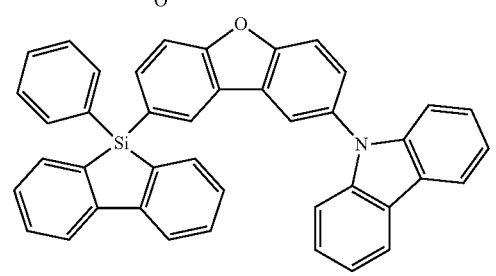
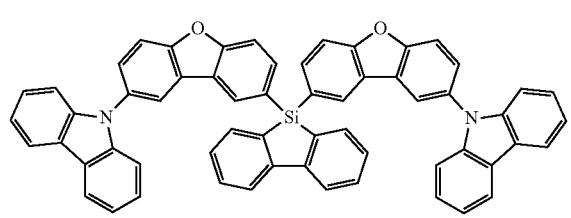
28
-continued
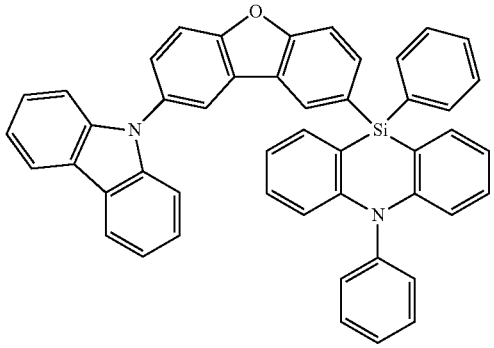
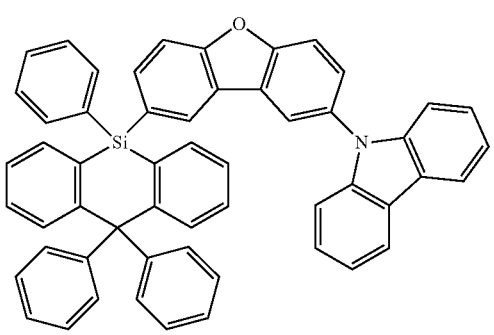
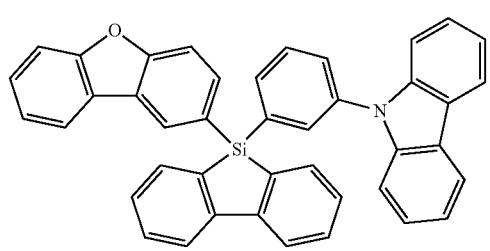
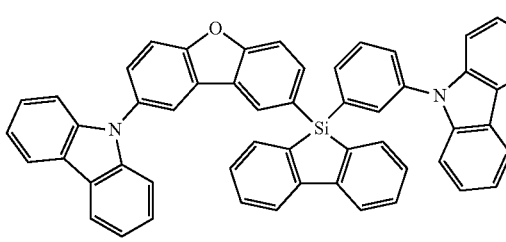
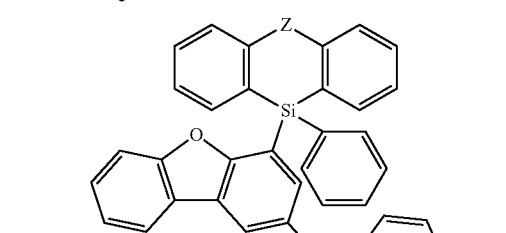
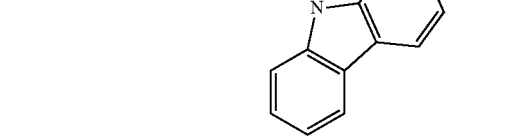
Z = Si, O, OMe$_2$

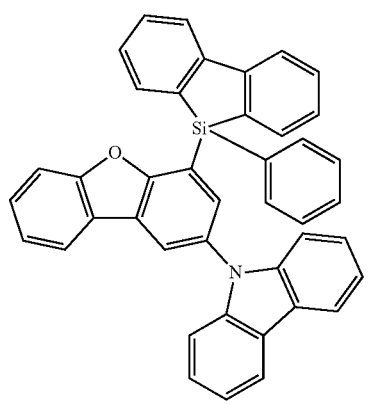
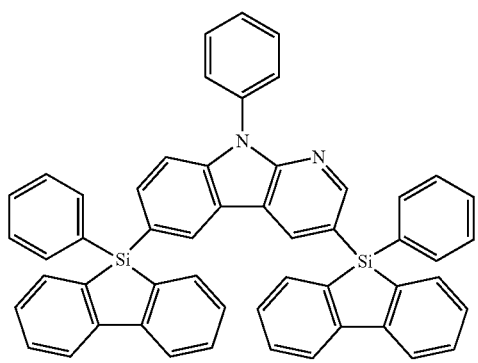
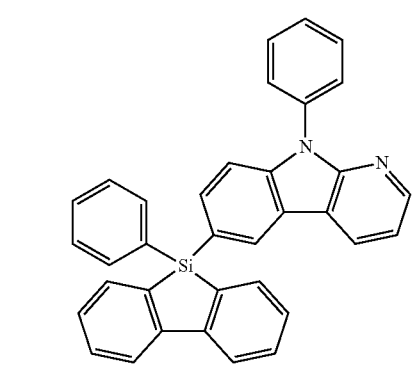
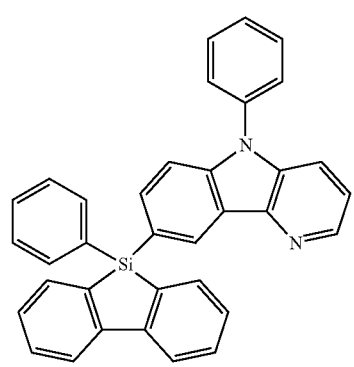
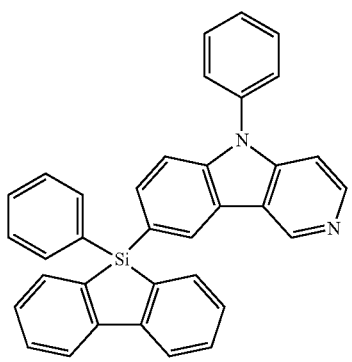
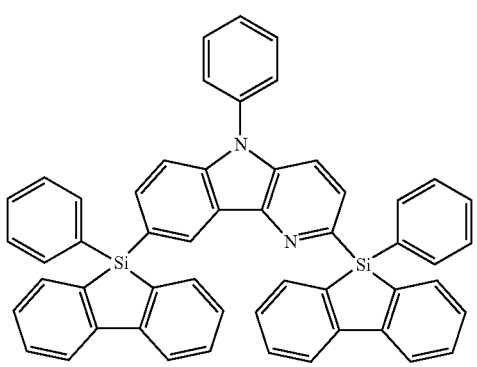
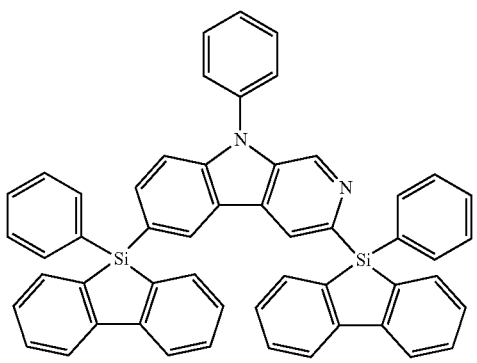
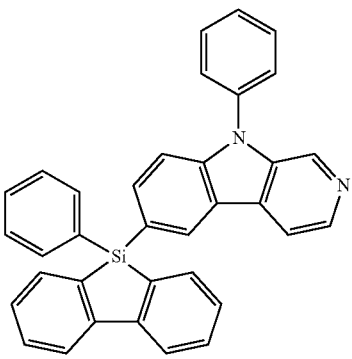

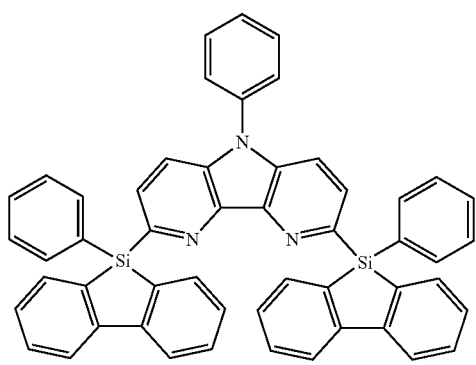
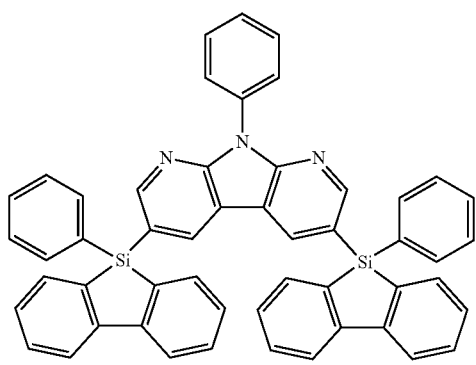
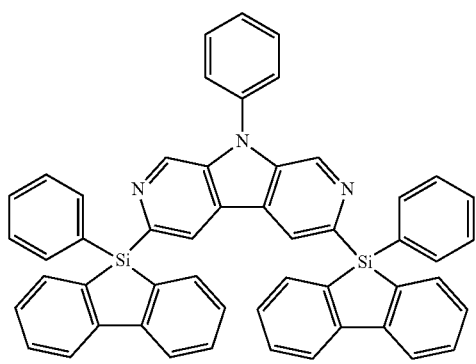
X = O, S, NPh, PPh
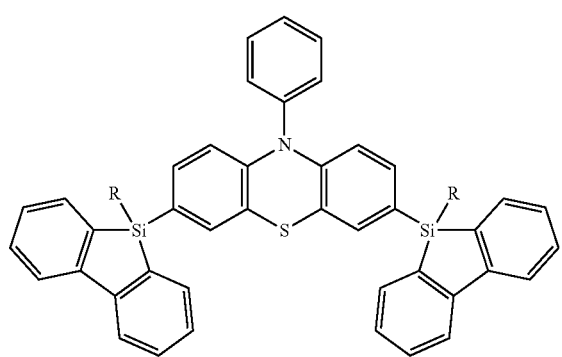
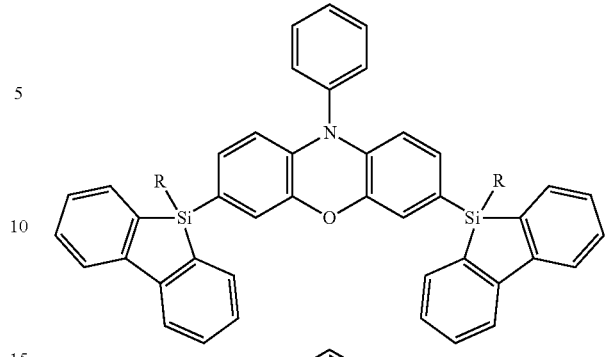
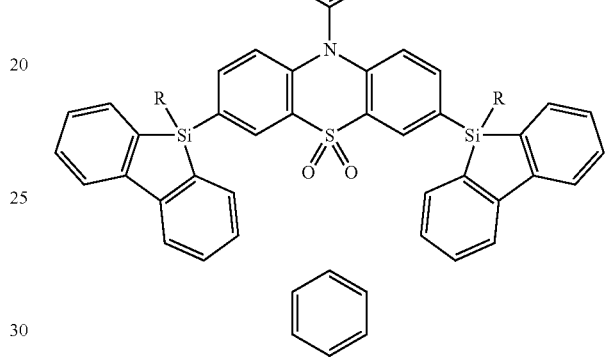
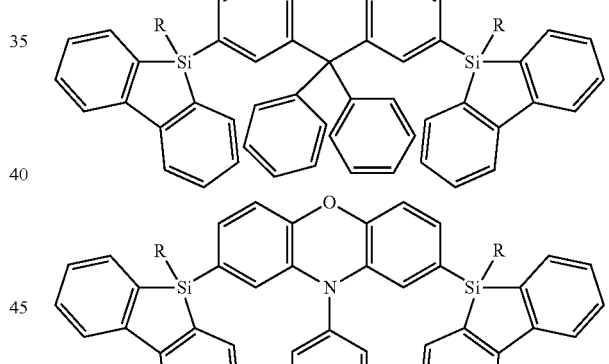
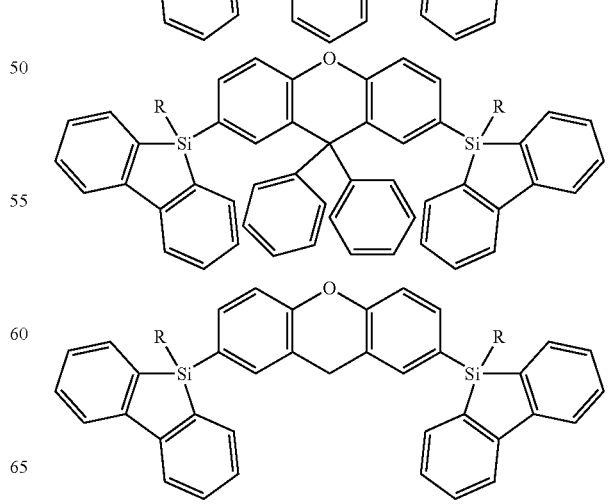

-continued
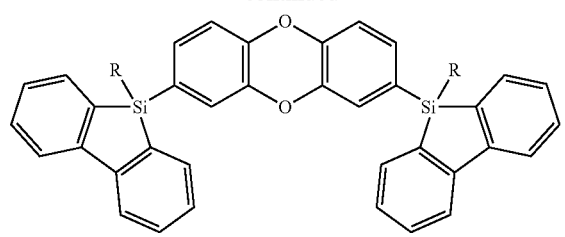
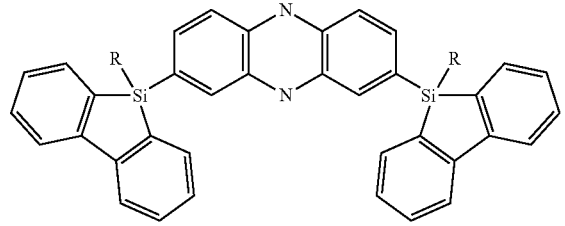
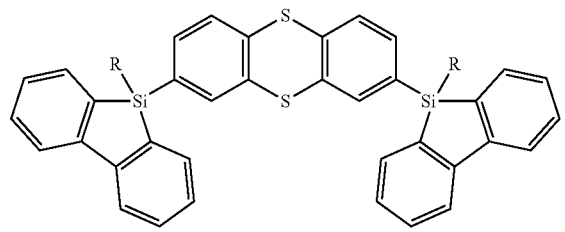
R = phenyl or methyl
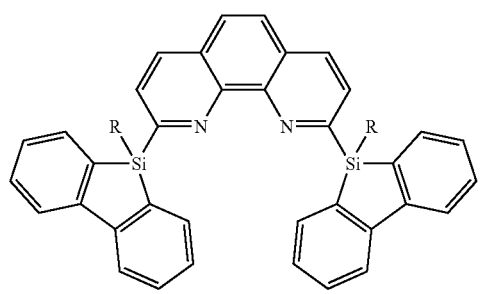
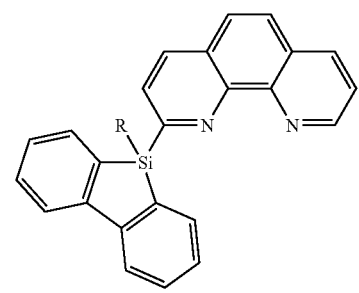
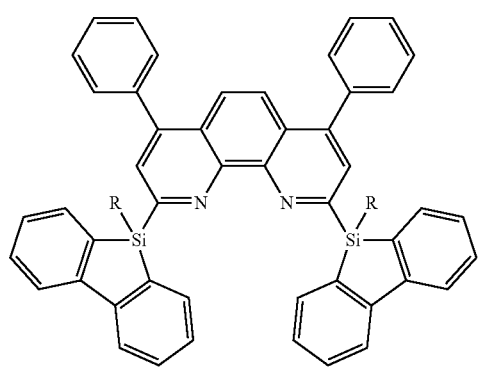
-continued
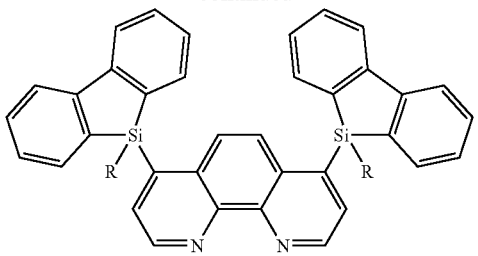
R = phenyl or methyl
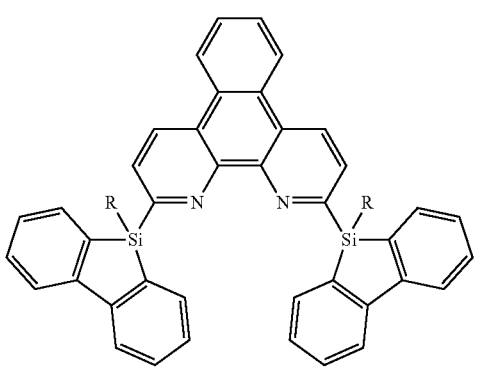
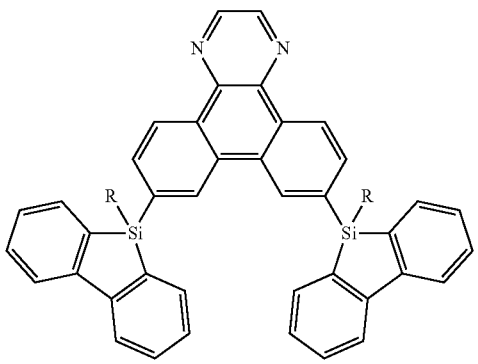
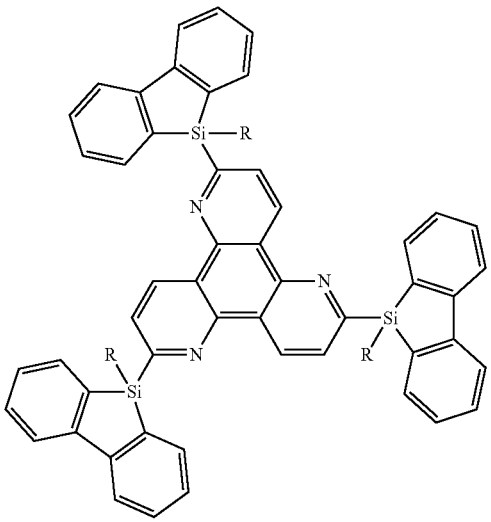

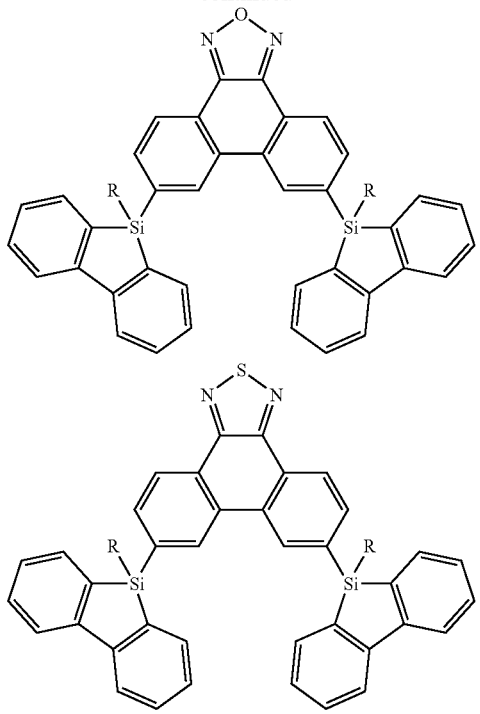

R = phenyl or methyl

Examples of very particularly preferred compounds of the formula (I) are:

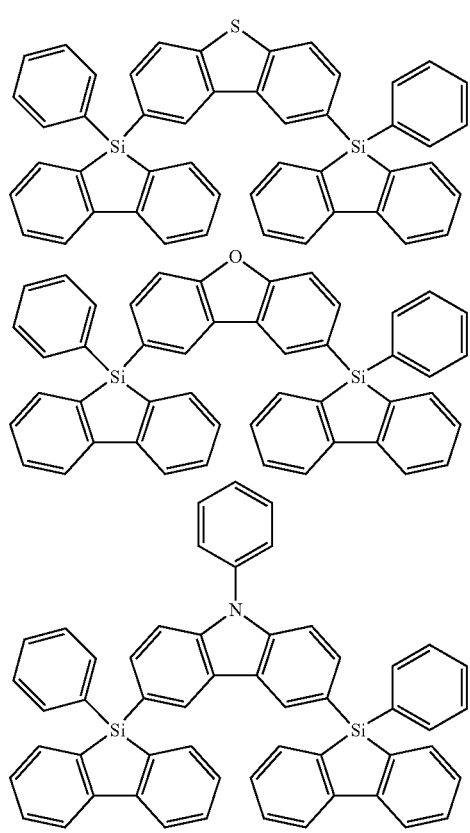

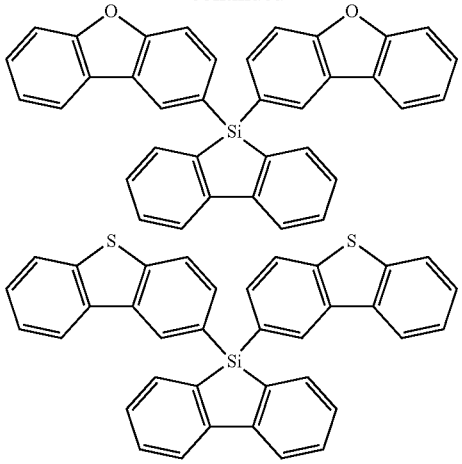

It has been found that the aforementioned silole compounds of the formula (I) are outstandingly suitable as matrix and/or hole/exciton blocker materials for organic electronics applications. More particularly, the silole compounds of the general formula (I) are suitable for use in OLEDs, in which case they can be used especially preferably as matrix and/or hole/electron blocker materials when blue or green light-emitting OLEDs are to be provided.

A group of silole compounds of the general formula (I) which has the general formula (Ib) is not known in the prior art.

The present invention therefore further provides silole compounds of the general formula (Ib)

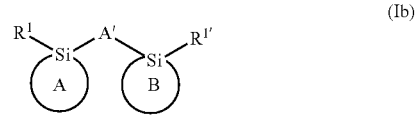

in which:
A' is a fused ring system formed from at least 3, preferably 3 or 4, more preferably 3, fused rings which each independently have 4 to 10, preferably 5 to 7, more preferably 5 or 6, ring members and may be saturated or mono- or poly-unsaturated and may be unsubstituted or substituted by one or more substituents selected from alkyl, cycloalkyl, heterocycloalkyl, aryl, heteroaryl and groups with donor or acceptor action, preferably alkyl, heteroaryl and groups with donor or acceptor action, where the fused ring system has at least one heteroatom-containing group, preferably selected from O, S, N, P, SO, SO$_2$ and Si, more preferably O, S and N, most preferably O and S, in the fused ring system itself or in at least one substituent, preferably in the fused ring system itself;

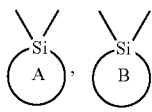

are each independently an Si-comprising ring which has 4 to 10, preferably 5 to 7, more preferably 5 or 6, most preferably 5, ring members, wherein the ring may be saturated or mono- or polyunsaturated and, in addition to the silicon atom, may have one or more further heteroatom-containing groups, preferably selected from O, S, SO, SO$_2$ and N, more preferably O and N, and may be unsubstituted or substituted by one or more substituents selected from alkyl, cycloalkyl, heterocycloalkyl, aryl, heteroaryl and groups with donor or acceptor action, wherein the Si-comprising ring may additionally be part of a fused ring system formed from at least 2, preferably 2 or 3, more preferably 3, fused rings, wherein the further rings—in addition to the Si-comprising ring—in the fused ring system may each independently be saturated or mono- or polyunsaturated and may be unsubstituted or substituted by one or more substituents selected from alkyl, cycloalkyl, heterocycloalkyl, aryl, heteroaryl and groups with donor or acceptor action, and may have one or more heteroatom-containing groups, preferably selected from O, S, SO, SO$_2$ and N, more preferably S and N;

$R^1$, $R^{1'}$ are each independently A, alkyl, cycloalkyl, heterocycloalkyl, aryl or heteroaryl, preferably alkyl, aryl or heteroaryl, more preferably alkyl, phenyl, naphthyl, indenyl, benzofuryl, benzothienyl, benzopyrrolyl, dibenzofuryl, dibenzothienyl, carbazolyl, azacarbazolyl, phenanthrolinyl or fluorenyl, most preferably methyl, phenyl or dibenzofuryl, dibenzothienyl, carbazolyl or azacarbazolyl, wherein the aforementioned groups may be unsubstituted or substituted by one or more substituents selected from alkyl, cycloalkyl, heterocycloalkyl, aryl, heteroaryl, and groups with donor or acceptor action;

A is a fused ring system formed from at least 3 fused rings which each independently have 4 to 10 ring members and may be saturated or mono- or polyunsaturated and substituted or substituted by one or more substituents selected from alkyl, cycloalkyl, heterocycloalkyl, aryl, heteroaryl, SiR$^2$R$^3$R$^4$ and groups with donor or acceptor action, wherein the fused ring system has at least one heteroatom in the fused ring system itself or in at least one substituent.

Preferred A, alkyl, cycloalkyl, heterocycloalkyl, aryl, heteroaryl groups and groups with donor or acceptor action have been specified above.

Preferred A' groups correspond to the aforementioned A groups, except that the A' group, unlike the A group, has two linkage sites to one Si-comprising ring each. A' is thus more preferably

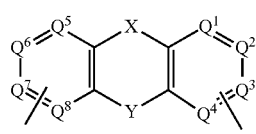

(A'aa)

in which:

X is S, O, NR$^5$, SO, SO$_2$ or PR$^6$, preferably S, O or NR$^5$, more preferably S or O;

Y is a bond or NR$^5$, CR$^7$R$^8$, O, SO, SO$_2$ or S, preferably a bond or NR$^5$, more preferably a bond;

$Q^1$ to $Q^8$ are each independently CR$^9$ or N, preferably each independently CR$^9$, wherein via one of the $Q^1$, $Q^2$, $Q^3$ or $Q^4$ groups and via one of the $Q^5$, $Q^6$, $Q^7$ or $Q^8$ groups a bond to the particular silicon atom of the

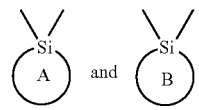

groups is effected and this $Q^1$, $Q^2$, $Q^3$ or $Q^4$ and $Q^5$, $Q^6$, $Q^7$ or $Q^8$ group is C;

$R^5$, $R^6$ are each independently alkyl, cycloalkyl, heterocycloalkyl, aryl or heteroaryl, preferably aryl or alkyl, more preferably phenyl;

$R^7$, $R^8$ are each independently hydrogen, alkyl, cycloalkyl, heterocycloalkyl, aryl or heteroaryl, preferably alkyl or aryl;

$R^9$ is hydrogen, alkyl, cycloalkyl, heterocycloalkyl, aryl, heteroaryl or a group with donor or acceptor action, preferably hydrogen, alkyl, heteroaryl or a group with donor or acceptor action.

More preferably, the linkage to the silicon atom of the

group is via the $Q^7$ group, which is correspondingly C, and the linkage to the silicon atom of the

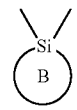

group is via the $Q^3$ group, which is correspondingly C. The remaining $Q^1$, $Q^2$, $Q^4$, $Q^5$, $Q^6$ and $Q^8$ groups are, in a very particularly preferred embodiment, each hydrogen.

Preferred embodiments of the

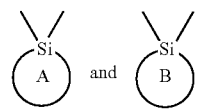

groups of the general formula (Ib) correspond to the preferred embodiments of the

group.

Preferred embodiments of the $R^1$ and $R^{1'}$ moieties in formula (Ib) correspond to the $R^1$ moiety in formula (I).

Very particularly preferred compounds of the formula (Ib) have the general formula (Iba):

(Iba)

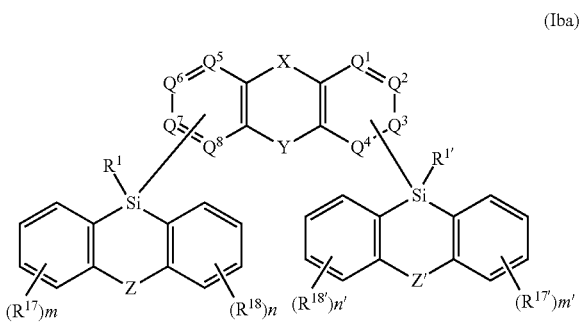

The groups specified in formula (Iba) have the preferred definitions for the moieties and groups X, Y, $Q^1$ to $Q^8$, Z, $R^1$, $R^{1'}$, $R^{17}$, $R^{18}$, n and m specified for the compounds of the formula (I), wherein—as mentioned above—one of the $Q^1$, $Q^2$, $Q^3$ or $Q^4$ and $Q^5$, $Q^6$, $Q^7$ or $Q^8$ groups in each case is C and has a bond to the silicon atom of the particular Si-comprising ring. The moieties and groups Z', $R^{17'}$, $R^{18'}$, m', n' specified in formula (Iba) are each independently as defined for the Z, $R^{17}$, $R^{18}$, m and n groups.

Very particularly preferred compounds of the formula (Ibaa) are specified below:

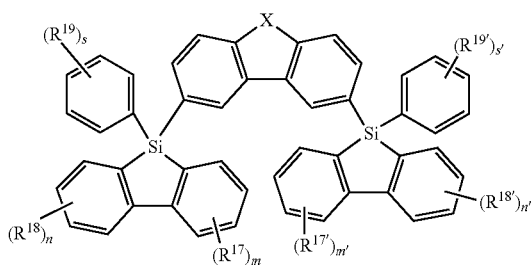

wherein the groups X, $R^{17}$, $R^{18}$, $R^{17'}$, $R^{18'}$, n, m, n' and m' are each as defined above.

The compounds of the formula (I) are prepared on the basis of processes known to those skilled in the art, for example by (i) transmetalating the compound A-Hal, in which A is as defined above and Hal is halogen, preferably Br or I, by processes known to those skilled in the art, for example with Mg, n-BuLi, sec-BuLi or tert-BuLi, and (ii) then reacting the transmetalated compound with a chlorosilol compound of the formula

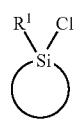

in which $R^1$ and

are each as defined above.

Suitable process conditions for transmetalation and further reaction are known to those skilled in the art and are specified, for example, in J. Am. Chem. Soc. 2005, 127, 9021-9029, page 9023, and Chem. Lett. 2007, 36, 1138, with regard to the preparation of siloles.

Suitable halogenated A-Hal compounds can be prepared by processes known to those skilled in the art. Suitable processes are described, for example, for N-phenylcarbazole in M. Park, J. R. Buck, C. J. Rizzo, Tetrahedron, 1998, 54, 12707-12714, and for dibenzothiophene in W. Yang et al., J. Mater. Chem. 2003, 13, 1351 and in Meille et al., J. Catal. 1997, 170, 29. The synthesis of 2,8-dibromodibenzofuran can be performed analogously. The synthesis of 4-bromodibenzofuran is described in D. J. Cram et al, J. Am. Chem. Soc., 1984, 106, 3286. The synthesis of 3-bromodibenzofuran is described in Cullinane, Padfield, J. Chem. Soc. 1935, 1131. The synthesis of 2-bromodibenzofuran is described in J. Org. Chem. 1997, 62, 1348. In addition, some brominated A-Hal compounds are commercially available, for example compounds in which X (in the A group)=NH (CAS 6825-20-3), NPh (CAS 57103-20-5) and S (CAS 31574-87-5).

Suitable chlorosilole compounds are likewise synthesized according to or analogously to processes known to those skilled in the art. For example, the synthesis of 5-chloro-5-phenyldibenzosilole and 5,5-dichlorodibenzosilole is described in J. Am. Chem. Soc., 1958, 80, 1883, and the synthesis of 5,5-dichlorodibenzosilole additionally in Chem. Lett., 2007, 36, 1138 and J. Am. Chem. Soc. 2002, 124, 49.

The synthesis of substituted siloles is described, inter alia, by Murakami in Org. Lett. 2007, 9, 133 and in Org. Lett. 2007, 9, 93, the synthesis of suitable precursors being known to those skilled in the art.

Moreover, suitable substituted siloles can be prepared, for example, by the following process:

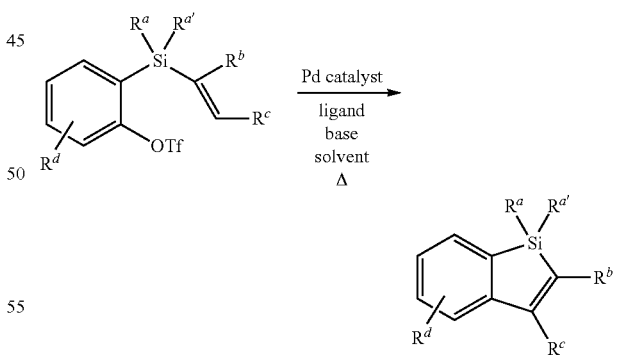

in which:

$R^a$, $R^{a'}$ are each independently alkyl, cycloalkyl, heterocycloalkyl, aryl, heteroaryl, preferably alkyl or aryl;

$R^b$, $R^c$
are each independently hydrogen, alkyl, cycloalkyl, heterocycloalkyl, aryl, heteroaryl and groups with donor or acceptor action, or $R^a$ and $R^{a'}$ form, together with the two particular carbon atoms of the Si-comprising ring to which they are bonded, a cyclic moiety which has 5 or 6 ring atoms and may have one, two or three double bonds and may have one or two heteroatoms selected from N, SO, $SO_2$ and S, preferably N, and may be unsubstituted or substituted by one or more substituents selected from alkyl, cycloalkyl, heterocycloalkyl, aryl, heteroaryl and groups with donor or acceptor action, where the cyclic moiety having 5 or 6 ring atoms may additionally be annulated to one or more further cyclic moieties having 5 or 6 ring atoms;

$R^d$ is alkyl, cycloalkyl, heterocycloalkyl, aryl, heteroaryl or a group with donor or acceptor action, preferably alkyl, heteroaryl or a group with donor or acceptor action.

Suitable Pd catalysts, bases, solvents and ligands, for example phosphine ligands, and suitable reaction conditions are known to those skilled in the art.

The silole compounds of the formula (I) used in accordance with the invention and the inventive silole compounds of the formula (Ib) are, according to the invention, used in organic electronics applications selected from switching elements such as organic transistors, for example organic FETs and organic TFTs, organic solar cells and organic light-emitting diodes (OLEDs), the compounds of the formula (I) or (Ib) being used in OLEDs as matrix and/or hole/exciton blocker materials. In a preferred embodiment, the present application relates to the use of the compounds of the formula (I) or (Ib) as matrix and/or hole/exciton blocker materials in OLEDs. Suitable constructions of the organic electronics applications are known to those skilled in the art.

The organic transistor generally includes a semiconductor layer formed from an organic layer with hole transport capacity and/or electron transport capacity; a gate electrode formed from a conductive layer; and an insulating layer introduced between the semiconductor layer and the conductive layer. A source electrode and a drain electrode are mounted on this arrangement in order thus to produce the transistor element. In addition, further layers known to those skilled in the art may be present in the organic transistor. The silole compound of the formula (I) or (Ib) may be present in any desired layer of the organic transistor.

The organic solar cell (photoelectric conversion element) generally comprises an organic layer present between two plate-type electrodes arranged in parallel. The organic layer may be configured on a comb-type electrode. There is no particular restriction regarding the site of the organic layer and there is no particular restriction regarding the material of the electrodes. When, however, plate-type electrodes arranged in parallel are used, at least one electrode is preferably formed from a transparent electrode, for example an ITO electrode or a fluorine-doped tin oxide electrode. The organic layer is formed from two sublayers, i.e. a layer with p-type semiconductor properties or hole transport capacity, and a layer formed with n-type semiconductor properties or electron transport capacity. In addition, it is possible for further layers known to those skilled in the art to be present in the organic solar cell. The silole compound of the formula (I) or (Ib) may be present in any desired layer of the organic solar cell.

The silole compounds of the formulae (I) and (Ib) are preferably used as matrix and/or hole/exciton blocker materials in organic light-emitting diodes (OLEDs). Suitable layer sequences of OLEDs are known to those skilled in the art and are specified below.

In a further embodiment, the present invention relates to an organic light-emitting diode in which the silole compounds of the formula (I) or of the formula (Ib) are used as matrix materials, preferably in the light-emitting layer of an OLED.

In a further embodiment, the present invention relates to an organic light-emitting diode in which the silole compounds of the formula (I) or (Ib) are used as a hole/exciton blocker, preferably in a blocking layer for holes.

It is likewise possible that the compounds of the formula (I) or (Ib) are present both in the light-emitting layer (as a matrix) and in the blocking layer for holes.

In addition, further layers of the OLED (in addition to the light-emitting layer and/or the blocking layer for holes) may comprise one or more compounds of the formula (I) or (Ib).

The present invention thus further provides for the use of the silole compounds of the formula (I) or of the silole compounds of the formula (Ib) as matrix materials and/or hole/exciton blocker materials in organic light-emitting diodes. The silole compounds of the formula (I) or (Ib) are preferably used in organic light-emitting diodes in the light-emitting layer and/or a blocking layer for holes/excitons.

The present invention further provides an organic light-emitting diode comprising an anode An and a cathode Ka and a light-emitting layer E arranged between the anode An and the cathode Ka, and optionally at least one blocking layer for holes/excitons, the organic light-emitting diode comprising at least one compound of the formula (I) or of the formula (Ib) which is present in the light-emitting layer and/or in the at least one blocking layer for holes/excitons—where present.

Structure of the Inventive OLED

The inventive organic light-emitting diode (OLED) thus has the following structure:
an anode (An) and a cathode (Ka) and a light-emitting layer E arranged between the anode (An) and the cathode (Ka), and optionally at least one blocking layer for holes/excitons.

The inventive OLED may, for example—in a preferred embodiment—be formed from the following layers:

1. anode
2. hole conductor layer
3. light-emitting layer
4. blocking layer for holes/excitons
5. electron conductor layer
6. cathode Layer sequences different than the aforementioned structure are also possible, and are known to those skilled in the art. For example, it is possible that the OLED does not have all of the layers mentioned; for example, an OLED with layers (1) (anode), (3) (light-emitting layer) and (6) (cathode) is likewise suitable, in which case the functions of the layers (2) (hole conductor layer) and (4) (blocking layer for holes/excitons) and (5) (electron conductor layer) are assumed by the adjacent layers. OLEDs which have layers (1), (2), (3) and (6), or layers (1), (3), (4), (5) and (6), are likewise suitable. In addition, the OLEDs may have a blocking layer for electrons/excitons between the anode (1) and the hole conductor layer (2).

It is additionally possible that a plurality of the aforementioned functions (electron/exciton blocker, hole/exciton blocker, hole injection, hole conduction, electron injection, electron conduction) are combined in one layer and are assumed, for example, by a single material present in this layer. For example, a material used in the hole conductor layer, in one embodiment, may simultaneously block excitons and/or electrons.

Furthermore, the individual layers of the OLED among those specified above may in turn be formed from two or more layers. For example, the hole conductor layer may be formed from a layer into which holes are injected from the electrode, and a layer which transports the holes away from the hole-injecting layer into the light-emitting layer. The electron conduction layer may likewise consist of a plurality of layers, for example a layer in which electrons are injected by the electrode, and a layer which receives electrons from the electron injection layer and transports them into the light-emitting layer. These layers mentioned are each selected according to factors such as energy level, thermal resistance and charge carrier mobility, and also energy difference of the layers specified with the organic layers or the metal electrodes. The person skilled in the art is capable of selecting the structure of the OLEDs such that it is matched optimally to the organic compounds used as emitter substances in accordance with the invention.

In order to obtain particularly efficient OLEDs, for example, the HOMO (highest occupied molecular orbital) of the hole conductor layer should be matched to the work function of the anode, and the LUMO (lowest unoccupied molecular orbital) of the electron conductor layer should be matched to the work function of the cathode, provided that the aforementioned layers are present in the inventive OLEDs.

The anode (1) is an electrode which provides positive charge carriers. It may be formed, for example, from materials which comprise a metal, a mixture of various metals, a metal alloy, a metal oxide or a mixture of various metal oxides. Alternatively, the anode may be a conductive polymer. Suitable metals comprise the metals of groups Ib, IVa, Va and VIa of the periodic table of the elements, and the transition metals of group VIIIa. When the anode is to be transparent, generally mixed metal oxides of groups IIb, IIIb and IVb of the periodic table of the elements (old IUPAC version) are used, for example indium tin oxide (ITO). It is likewise possible that the anode (1) comprises an organic material, for example polyaniline, as described, for example, in Nature, Vol. 357, pages 477 to 479 (Jun. 11, 1992). At least either the anode or the cathode should be at least partly transparent in order to be able to emit the light formed. The material used for the anode (1) is preferably ITO.

Suitable hole conductor materials for layer (2) of the inventive OLEDs are disclosed, for example, in Kirk-Othmer Encyclopedia of Chemical Technology, 4th edition, Vol. 18, pages 837 to 860, 1996. Both hole-transporting molecules and polymers can be used as the hole transport material. Hole-transporting molecules typically used are selected from the group consisting of tris[N-(1-naphthyl)-N-(phenylamino)]triphenylamine (1-NaphDATA), 4,4'-bis[N-(1-naphthyl)-N-phenylamino]biphenyl (α-NPD), N,N'-diphenyl-N,N'-bis(3-methylphenyl)-[1,1'-biphenyl]-4,4'-diamine (TPD), 1,1-bis[(di-4-tolylamino)-phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), 4,4',4''-tris(N,N-diphenylamino)triphenylamine (TDTA), 4,4',4''-tri(N-carbazolyl)triphenylamine (TCTA), N,N'-bis(naphthalen-2-yl)-N,N'-bis(phenyl)benzidine (β-NPB), N,N'-bis(3-methylphenyl)-N,N'-bis(phenyl)-9,9-spirobifluorene (Spiro-TPD), N,N'-bis(naphthalen-1-yl)-N,N'-bis(phenyl)-9,9-spirobifluorene (Spiro-NPB), N,N'-bis(3-methylphenyl)-N,N'-bis(phenyl)-9,9-dimethylfluorene (DMFL-TPD), N,N'-bis(3-methylphenyl)-N,N'-bis(phenyl)-9,9-diphenylfluorene (DPFL-TPD), N,N'-bis(naphthalen-1-yl)-N,N'-bis(phenyl)-9,9-diphenylfluorene (DPFL-NPB), 2,2',7,7'-tetrakis(N,N-diphenylamino)-9,9'-spirobifluorene (Spiro-TAD), 9,9-bis[4-(N,N-bis(biphenyl-4-yl)amino)phenyl]-9H-fluorene (BPAPF), 9,9-bis[4-(N,N-bis(naphthalen-2-yl)amino)phenyl]-9H-fluorene (NPAPF), 9,9-bis[4-(N,N-bis(naphthalen-2-yl)-N,N'-bisphenylamino)phenyl]-9H-fluorene (NPBAPF), 2,2',7,7'-tetrakis[N-naphthalenyl(phenyl)amino]-9,9'-spirobifluorene (Spiro-2NPB), N,N'-bis(phenanthren-9-yl)-N,N'-bis(phenyl)benzidine (PAPB), 2,7-bis[N,N-bis(9,9-spirobifluoren-2-yl)amino]-9,9-spirobifluorene (Spiro-5), 2,2'-bis[N,N-bis(biphenyl-4-yl)amino]-9,9-spirobifluorene (2,2'-Spiro-DBP), 2,2'-bis(N,N-diphenylamino)-9,9-spirobifluorene (Spiro-BPA), 2,2',7,7'-tetra(N,N-ditolyl)aminospirobifluorene (Spiro-TTB), N,N,N',N'-tetranaphthalen-2-ylbenzidine (TNB), porphyrin compounds and phthalocyanines such as copper phthalocyanines. Hole-transporting polymers typically used are selected from the group consisting of polyvinylcarbazoles, (phenylmethyl)polysilanes and polyanilines. It is likewise possible to obtain hole-transporting polymers by doping hole-transporting molecules into polymers such as polystyrene and polycarbonate. One example thereof is poly(3,4-ethylenedioxythiophene) doped with polystyrenesulfonate (PEDOT:PSS). Suitable hole-transporting molecules are the molecules already mentioned above.

In addition—in one embodiment—it is possible to use carbene complexes as hole conductor materials, the band gap of the at least one hole conductor material generally being greater than the band gap of the emitter material used. In the context of the present application, "band gap" is understood to mean the triplet energy. Suitable carbene complexes are, for example, carbene complexes as described in WO 2005/019373 A2, WO 2006/056418 A2, WO 2005/113704, WO 2007/115970, WO 2007/115981 and WO 2008/000727. One example of a suitable carbene complex is Ir(dpbic)$_3$ with the formula:

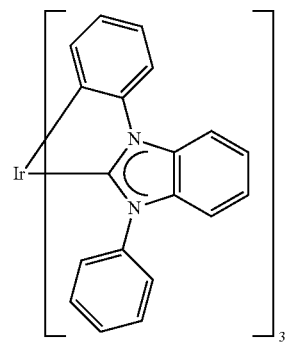

which is disclosed, for example, in WO2005/019373.

The light-emitting layer (3) comprises at least one emitter material. In principle, it may be a fluorescence or phosphorescence emitter, suitable emitter materials being known to those skilled in the art. The at least one emitter material is preferably a phosphorescence emitter. The phosphorescence emitter compounds used with preference are based on metal complexes, and in particular the complexes of the metals Ru, Rh, Ir, Pd and Pt, especially the complexes of Ir, have gained significance. The compounds of the formula (I) or (Ib) can—in addition to the use in the blocking layer for holes/excitons—be used as the matrix in the light-emitting layer.

Suitable metal complexes for use in the inventive OLEDs are described, for example, in documents WO 02/60910 A1, US 2001/0015432 A1, US 2001/0019782 A1, US 2002/

0055014 A1, US 2002/0024293 A1, US 2002/0048689 A1, EP 1 191 612 A2, EP 1 191 613 A2, EP 1 211 257 A2, US 2002/0094453 A1, WO 02/02714 A2, WO 00/70655 A2, WO 01/41512 A1, WO 02/15645 A1, WO 2005/019373 A2, WO 2005/113704 A2, WO 2006/115301 A1, WO 2006/067074 A1, WO 2006/056418, WO 2006121811 A1, WO 2007095118 A2, WO 2007/115970, WO 2007/115981 and WO 2008/000727.

Further suitable metal complexes are the commercially available metal complexes tris(2-phenylpyridine)iridium (III), iridium(III)tris(2-(4-tolyl)pyridinato-N,$C^{2'}$), iridium(III)tris(1-phenylisoquinoline), iridium(III)bis(2,2'-benzothienyl)pyridinato-N,$C^{3'}$)(acetylacetonate), iridium(III)bis(2-(4,6-difluorophenyl)pyridinato-N,$C^{2'}$)picolinate, iridium(III)bis(1-phenylisoquinoline)(acetylacetonate), iridium(III)bis(di-benzo[f,h]quinoxaline)(acetylacetonate), iridium(III)bis(2-methyldi-benzo[f,h]quinoxaline)(acetylacetonate) and tris(3-methyl-1-phenyl-4-trimethylacetyl-5-pyrazoline)terbium(III).

In addition, the following commercially available materials are suitable: tris(dibenzoylacetonato)mono(phenanthroline)europium(III), tris(dibenzoylmethane)-mono(phenanthroline)europium(III), tris(dibenzoylmethane)mono(5-aminophenan-throline)europium(III), tris(di-2-naphthoylmethane)mono(phenanthroline)europium(III), tris(4-bromobenzoylmethane)mono(phenanthroline)europium(III), tris(di(biphenyl)-methane)mono(phenanthroline)europium(III), tris(dibenzoylmethane)mono(4,7-diphenylphenanthroline)europium(III), tris(dibenzoylmethane)mono(4,7-dimethyl-phenanthroline)europium(III), tris(dibenzoylmethane)mono(4,7-dimethylphenan-throlinedisulfonic acid)europium(III) disodium salt, tris[di(4-(2-(2-ethoxyethoxy)ethoxy)-benzoylmethane)]mono(phenanthroline)europium(III) and tris[d][4-(2-(2-ethoxy-ethoxy)ethoxy)benzoylmethane)]mono(5-aminophenanthroline)europium(III).

Suitable triplet emitters are, for example, carbene complexes. In one embodiment of the present invention, the compounds of the formula (I) or (Ib) are used in the light-emitting layer as a matrix material together with carbene complexes as triplet emitters. Suitable carbene complexes are known to those skilled in the art and are described, for example, in WO 2005/019373 A2, WO 2006/056418 A2, WO 2005/113704, WO 2007/115970, WO 2007/115981 and WO 2008/000727.

The light-emitting layer may comprise further components in addition to the emitter material. For example, a fluorescent dye may be present in the light-emitting layer in order to alter the emission color of the emitter material. In addition—in a preferred embodiment—a matrix material can be used. This matrix material may be a polymer, for example poly(N-vinylcarbazole) or polysilane. The matrix material may, however, likewise be a small molecule, for example 4, 4'-N,N'-dicarbazolebiphenyl (CDP=CBP) or tertiary aromatic amines, for example TCTA. In a preferred embodiment of the present invention, at least one compound of the formula (I) or (Ib) is used as a matrix material.

In a preferred embodiment, the light-emitting layer is formed from 2 to 20% by weight, preferably 5 to 17% by weight, of at least one of the aforementioned emitter materials and 80 to 98% by weight, preferably 83 to 95% by weight, of at least one of the aforementioned matrix materials—in one embodiment at least one compound of the formula (I) or (Ib)—where the sum total of the emitter material and of the matrix material adds up to 100% by weight.

In a further embodiment, the compounds of the formula (I) or (Ib) are used as a hole/exciton blocker material together with carbene complexes as triplet emitters. The compounds of the formula (I) or (Ib) may additionally—as mentioned above—be used both as matrix materials and as hole/exciton blocker materials together with carbene complexes as triplet emitters.

Suitable metal complexes for use together with the compounds of the formula (I) or (Ib) as matrix materials and/or hole/exciton blocker materials in OLEDs are thus, for example, also carbene complexes as described in WO 2005/019373 A2, WO 2006/056418 A2, WO 2005/113704, WO 2007/115970, WO 2007/115981 and WO 2008/000727. Explicit reference is made here to the disclosure of the WO applications cited, and these disclosures shall be considered to be incorporated into the content of the present application.

If the blocking layer for holes/excitons (4) does not comprise any silole compounds of the formula (I) or (Ib), the OLED has—if a blocking layer for holes is present—hole blocker materials typically used in OLEDs, such as 2,6-bis(N-carbazolyl)pyridine (mCPy), 2,9-dimethyl-4,7-diphenyl-1,10-phenanthroline (bathocuproine, (BCP)), bis(2-methyl-8-quinolinato)-4-phenylphenylato)aluminum(III) (BAlq), phenothiazine-S, S-dioxide derivates and 1,3,5-tris(N-phenyl-2-benzylimidazolyl)benzene) (TPBI), TPBI also being suitable as electron-conducting material. In a further embodiment, it is possible to use compounds which comprise aromatic or heteroaromatic rings linked via groups comprising carbonyl groups, as disclosed in WO2006/100298, disilyl compounds selected from the group consisting of disilylcarbazoles, disilylbenzofurans, disilylbenzothiophenes, disilylbenzophospholes, disilylbenzothiophene-S-oxides and disilylbenzothiophene-S,S-dioxides, as specified, for example, in PCT applications PCT/EP2008/058207 and PCT/EP2008/058106, which were yet to be published at the priority date of the present application, and disilyl compounds as disclosed in WO2008/034758, as a blocking layer for holes/excitons (4) or as matrix materials in the light-emitting layer (3).

In a preferred embodiment, the present invention relates to an inventive OLED comprising the layers (1) anode, (2) hole conductor layer, (3) light-emitting layer, (4) blocking layer for holes/excitons, (5) electron conductor layer and (6) cathode, and if appropriate further layers, wherein the blocking layer for holes/excitons or the light-emitting layer comprises at least one compound of the formula (I) or (Ib).

In a further preferred embodiment, the present invention relates to an inventive OLED comprising the layers (1) anode, (2) hole conductor layer, (3) light-emitting layer, (4) blocking layer for holes/excitons, (5) electron conductor layer and (6) cathode, and if appropriate further layers, wherein the light-emitting layer (3) comprises at least one compound of the formula (I) or (Ib) and the blocking layer for holes/excitons comprises at least one compound of the formula (I) or (Ib).

Suitable electron conductor materials for the layer (5) of the inventive OLEDs comprise metals chelated with oxinoid compounds, such as 2,2',2"-(1,3,5-phenylene)tris[1-phenyl-1H-benzimidazole] (TPBI), tris(8-quinolinolato)aluminum ($Alq_3$), compounds based on phenanthroline, such as 2,9-dimethyl-4,7-diphenyl-1,10-phenanthroline (DDPA=BCP) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ), 8-hydroxyquinolinolatolithium (Liq), 4,7-diphenyl-1,10-phenanthroline (BPhen), bis(2-methyl-8-quinolinolato)-4-(phenyl-phenolato)aluminum (BAIq), 1,3-bis[2-(2,2'-bipyridin-6-yl)-1,3,4-oxadiazo-5-yl]benzene (Bpy-OXD), 6,6'-bis[5-(biphenyl-4-yl)-1,3,4-oxadiazo-2-yl]-2,2'-bipyridyl (BP-OXD-Bpy), 4-(naphthalen-1-yl)-3,5-diphenyl-4H-1,2,4-triazole (NTAZ), 2,9-bis(naphthalen-2-yl)-4,7-diphenyl-1, 10-phenanthroline (NBphen), 2,7-bis[2-(2,2'-bipyridin-6-yl)-1,3,4-oxadiazo-5-yl]-9,9-dimethylfluorene (Bby-FOXD), 1,3-bis[2-(4-tert-butylphenyl)-1,3,4-oxadiazo-5-yl] benzene (OXD-7), tris(2,4,6-trimethyl-3-(pyridin-3-yl) phenyl)borane (3TPYMB), 1-methyl-2-(4-(naphthalen-2-yl) phenyl)-1H-imidazo[4,5-f][1,10]phenanthroline (2-NPIP), 2-phenyl-9,10-di(naphthalen-2-yl)anthracene (PADN), 2-(naphthalen-2-yl)-4,7-diphenyl-1,10-phenanthroline (HN-Bphen). The layer (5) may serve both to facilitate electron transport and as a buffer layer or barrier layer in order to prevent quenching of the exciton at the interfaces of the layers of the OLED. The layer (5) preferably improves the mobility of the electrons and reduces quenching of the exciton. In a preferred embodiment, TPBI is used as the electron conductor material. Among the materials mentioned above as hole conductor materials and electron conductor materials, some may fulfill several functions. For example, some of the electron-conducting materials are simultaneously hole-blocking materials when they have a low-lying HOMO. These can be used, for example, in the blocking layer for holes/excitons (4). However, it is likewise possible that the function as a hole/exciton blocker is also assumed by the layer (5), such that the layer (4) can be dispensed with.

The charge transport layers can also be electronically doped in order to improve the transport properties of the materials used, in order firstly to make the layer thicknesses more generous (avoidance of pinholes/short circuits) and in order secondly to minimize the operating voltage of the device. For example, the hole conductor materials can be doped with electron acceptors; for example, phthalocyanines or arylamines such as TPD or TDTA can be doped with tetrafluorotetracyanoquinodimethane (F4-TCNQ) or with $MoO_3$ or $WO_3$. The electron conductor materials can be doped, for example, with alkali metals, for example $Alq_3$ with lithium. In addition, electron conductors can be doped with salts such as $Cs_2CO_3$. Electronic doping is known to those skilled in the art and is disclosed, for example, in W. Gao, A. Kahn, J. Appl. Phys., Vol. 94, No. 1, 1 Jul. 2003 (p-doped organic layers); A. G. Werner, F. Li, K. Harada, M. Pfeiffer, T. Fritz, K. Leo. Appl. Phys. Lett., Vol. 82, No. 25, 23 Jun. 2003 and Pfeiffer et al., Organic Electronics 2003, 4, 89-103. For example, the hole conductor layer may, in addition to a carbene complex, e.g. $Ir(dpbic)_3$, be doped with $MoO_3$ or $WO_3$.

The cathode (6) is an electrode which serves to introduce electrons or negative charge carriers. Suitable materials for the cathode are selected from the group consisting of alkali metals of group Ia, for example Li, Cs, alkaline earth metals of group IIa, for example calcium, barium or magnesium, metals of group IIb of the periodic table of the elements (old IUPAC version), comprising the lanthanides and actinides, for example samarium. In addition, it is also possible to use metals such as aluminum or indium, and combinations of all metals mentioned. In addition, lithium-comprising organometallic compounds or LiF can be applied between the organic layer and the cathode in order to reduce the operating voltage.

The OLED according to the present invention may additionally comprise further layers which are known to those skilled in the art. For example, a layer which facilitates the transport of the positive charge and/or matches the band gaps of the layers to one another may be applied between the layer (2) and the light-emitting layer (3). Alternatively, this further layer may serve as a protective layer. In an analogous manner, additional layers may be present between the light-emitting layer (3) and the layer (4) in order to facilitate the transport of negative charge and/or to match the band gaps between the layers to one another. Alternatively, this layer may serve as a protective layer.

In a preferred embodiment, the inventive OLED, in addition to layers (1) to (6), comprises at least one of the further layers mentioned below:
a hole injection layer between the anode (1) and the hole-transporting layer (2);
a blocking layer for electrons between the hole-transporting layer (2) and the light-emitting layer (3);
an electron injection layer between the electron-transporting layer (5) and the cathode (6).

Materials for a hole injection layer may be selected from copper phthalocyanine, 4,4',4''-tris(N-3-methylphenyl-N-phenylamino)triphenylamine (m-MTDATA), 4,4',4''-tris-(N-(2-naphthyl)-N-phenylamino)triphenylamine (2T-NATA), 4,4',4''-tris(N-(1-naphthyl)-N-phenylamino)triphenylamine (1T-NATA), 4,4',4''-tris(N,N-diphenylamino)-triphenylamine (NATA), titanium oxide phthalocyanine, 2,3,5,6-tetrafluoro-7,7,8,8-tetra-cyanoquinodimethane (F4-TCNQ), pyrazino[2,3-f][1,10]phenanthroline-2,3-dicarbonitrile (PPDN), N,N,N',N'-tetrakis(4-methoxyphenyl)benzidine (MeO-TPD), 2,7-bis[N,N-bis(4-methoxyphenyl)amino]-9,9-spirobifluorene (MeO-Spiro-TPD), 2,2'-bis[N,N-bis(4-methoxyphenyl)amino]-9,9-spirobifluorene (2,2'-MeO-Spiro-TPD), N,N'-diphenyl-N,N'-di-[4-(N,N-ditolylamino) phenyl]benzidine (NTNPB), N,N'-diphenyl-N,N'-di[4-(N,N-diphenylamino)phenyl]benzidine (NPNPB), N,N'-di (naphthalen-2-yl)-N,N'-diphenylbenzene-1,4-diamine (β-NPP).

As a material for the electron injection layer, LiF, $Cs_2CO_3$ or $Li_3PO_4$, for example, can be selected.

The person skilled in the art is aware (for example on the basis of electrochemical studies) of how suitable materials have to be selected. Suitable materials for the individual layers are known to those skilled in the art and are disclosed, for example, in WO 00/70655.

In addition, it is possible that some of the layers used in the inventive OLED have been surface-treated in order to increase the efficiency of charge carrier transport. The selection of the materials for each of the layers mentioned is preferably determined by obtaining an OLED with a high efficiency and lifetime.

The inventive OLED can be produced by methods known to those skilled in the art. In general, the inventive OLED is produced by successive vapor deposition of the individual layers onto a suitable substrate. Suitable substrates are, for example, glass, inorganic semiconductors or polymer films. For vapor deposition, it is possible to use customary techniques, such as thermal evaporation, chemical vapor deposition (CVD), physical vapor deposition (PVD) and others. In an alternative process, the organic layers of the OLED can be applied from solutions or dispersions in suitable solvents, employing coating techniques known to those skilled in the art.

In general, the different layers have the following thicknesses: anode (1) 50 to 500 nm, preferably 100 to 200 nm; hole-conducting layer (2) 5 to 100 nm, preferably 20 to 80 nm, light-emitting layer (3) 1 to 100 nm, preferably 10 to 80 nm, blocking layer for holes/excitons (4) 2 to 100 nm, preferably 5 to 50 nm, electron-conducting layer (5) 5 to 100 nm, preferably 20 to 80 nm, cathode (6) 20 to 1000 nm, preferably 30 to 500 nm. The relative position of the recombination zone of holes and electrons in the inventive OLED in relation to the cathode and hence the emission spectrum of the OLED can be influenced, among others, by the relative thickness of each layer. This means that the thickness of the electron transport layer should preferably be selected such that the position of the recombination zone is matched to the optical resonator property of the diode and hence to the emission wavelength of the emitter. The ratio of the layer thicknesses of the individual layers in the OLED depends on the materials used. The layer thicknesses of any additional layers used are known to those skilled in the art. It is possible that the electron-conducting layer and/or the hole-conducting layer have greater thicknesses than the layer thicknesses specified when they are electrically doped.

Use of the silole compounds of the formula (I) or (Ib) in the light-emitting layer and/or the blocking layer for holes/excitons makes it possible to obtain OLEDs with high efficiency and lifetime. The efficiency of the OLEDs can additionally be improved by optimizing the other layers of the OLEDs. For example, high-efficiency cathodes such as Ca or Ba, if appropriate in combination with an intermediate layer of LiF, can be used. Shaped substrates and novel hole-transporting materials which bring about a reduction in the operating voltage or an increase in the quantum efficiency are likewise usable in the inventive OLEDs. Moreover, additional layers may be present in the OLEDs in order to adjust the energy level of the different layers and to facilitate electroluminescence.

The OLEDs may further comprise at least one second light-emitting layer. The overall emission of the OLEDs may be composed of the emission of the at least two light-emitting layers and may also comprise white light.

The present invention further provides a light-emitting layer comprising at least one silole compound of the formula (I) or (Ib) and at least one emitter material. Preferred silole compounds of the formula (I) or (Ib) and suitable and preferred emitter materials and preferred amounts of the emitter material and of the compound of the formula (I) or (Ib) have been specified above.

The present invention further provides an OLED comprising an inventive light-emitting layer.

The OLEDs can be used in all apparatus in which electroluminescence is useful. Suitable devices are preferably selected from stationary and mobile visual display units and illumination units. Stationary visual display units are, for example, visual display units of computers, televisions, visual display units in printers, kitchen appliances and advertising panels, illuminations and information panels. Mobile visual display units are, for example, visual display units in cellphones, laptops, digital cameras, vehicles and destination displays on buses and trains.

In addition, the silole compounds of the formula (I) or (Ib) can be used in OLEDs with inverse structure. The compounds of the formula (I) or (Ib) used in accordance with the invention are preferably used in these inverse OLEDs in turn as hole/exciton blocker materials. The structure of inverse OLEDs and the materials typically used therein are known to those skilled in the art.

In addition, the present invention relates to a device selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, vehicles and destination displays on buses and trains, and illumination units comprising at least one inventive organic light-emitting diode or at least one inventive light-emitting layer.

The examples and figures which follow provide additional illustration of the invention.

EXAMPLES

A Synthesis Examples

Example 1

Figure 1B:
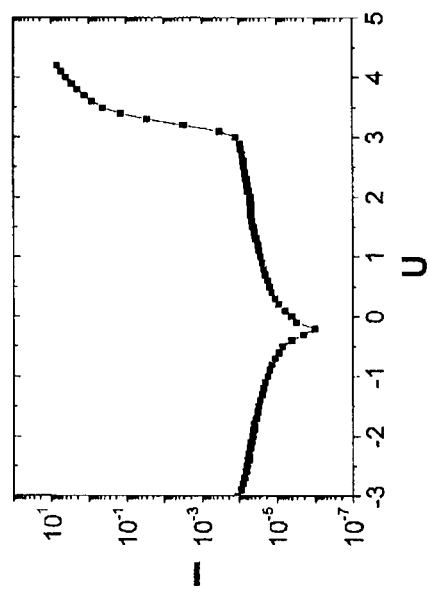
FIG. 1 shows a) the current-voltage curve and b) the current-efficiency curve of the OLED of diode example 3.

Preparation of siloles of the formula (1)

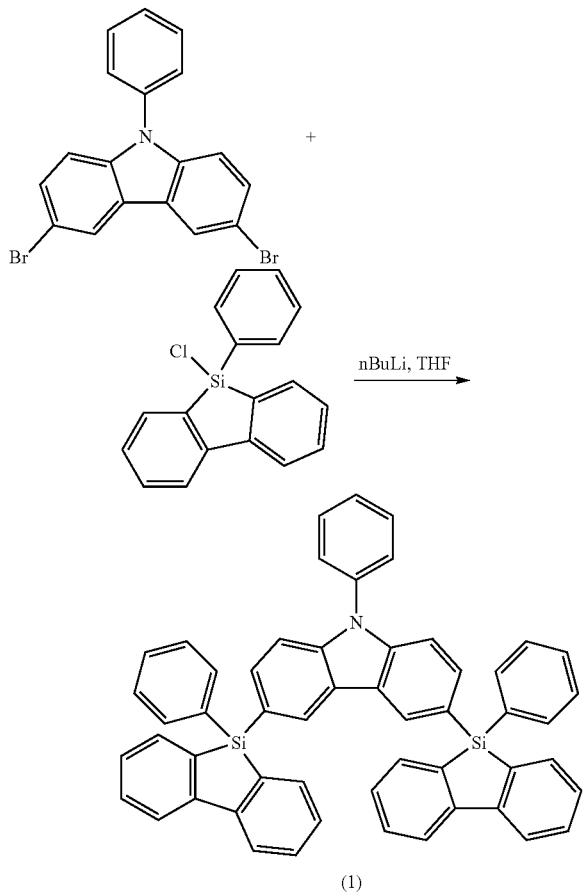

(1)

A solution of 9-phenyl-3,6-dibromo-9H-carbazole (*Tetrahedron*, 1998, 54, 12707-12714) (2.1 g, 5.1 mmol) in dry THF (100 ml) is admixed slowly at −78° C. under argon with n-butyllithium (1.6 M in hexane, 8.0 ml, 12.8 mmol), and stirred at −78° C. for 1 h. After adding a solution of 5-chloro-5-phenyldibenzosilol (J. Am. Chem. Soc. 1958, 80, 1883) (4.61 g, 15.4 mmol) in dry THF (25 ml) at −78° C., the mixture is warmed to room temperature with stirring overnight. Excess butyllithium is hydrolyzed with saturated ammonium chloride solution. The precipitated product is filtered off and washed thoroughly with $CH_2Cl_2$. The combined $CH_2Cl_2$ filtrates are washed with $H_2O$, dried over $Na_2SO_4$ and concentrated. The residue is digested in ethanol, filtered and dried.

Yield (1): 60%. ¹H NMR (CDCl₃, 400 MHz): δ=7.32 (m, 8H), 7.42-7.52 (m, 13H), 7.63 (d, 2H), 7.68 (d, 4H), 7.82 (d, 4H), 7.90 (d, 4H), 8.38 (s, 2H).

Example 2

Preparation of Siloles of the Formula (2)

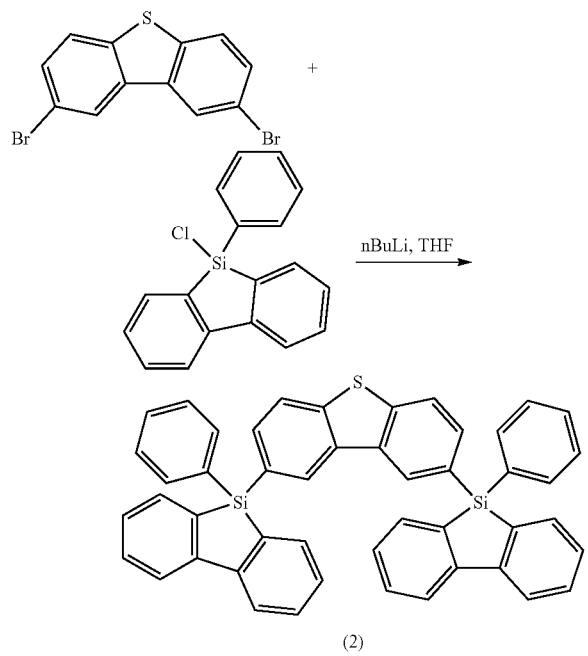

A solution of 2,8-dibromodibenzothiophene (*J. Catal.* 1997, 170, 29) (1.8 g, 5.3 mmol) in dry THF (25 ml) is admixed slowly at −78° C. under argon with n-butyllithium (1.6 M in hexane, 8.4 ml, 13.4 mmol), and stirred at −78° C. for 1 h. After adding a solution of 5-chloro-5-phenyldibenzosilol (J. Am. Chem. Soc. 1958, 80, 1883) (4.82 g, 16.1 mmol) in dry THF (20 ml) at −78° C., the mixture is warmed to room temperature with stirring overnight. The mixture is admixed with MeOH and H₂O and extracted with CH₂Cl₂. The combined organic phases are washed with H₂O, dried over Na₂SO₄ and concentrated. The residue is digested in ethanol, filtered and dried. Flash column chromatography (SiO₂, gradient from cyclohexane to 4:1 cyclohexane/CH₂Cl₂). Yield (2): 60%. ¹H NMR (CDCl₃, 400 MHz): δ=7.24 (m, 8H), 7.43 (t, 2H), 7.51 (dd, 4H), 7.67 (m, 6H), 7.81 (m, 6H), 7.92 (d, 4H), 8.31 (s, 2H).

Example 3

Preparation of Siloles of the Formula (3)

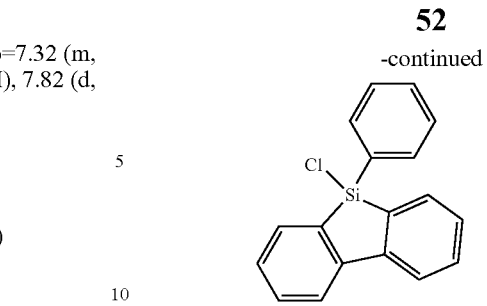

A solution of 2,8-dibromodibenzofuran (analogous to *J. Catal.* 1997, 170, 29) (8.73 g, 26.8 mmol) in dry THF (500 ml) is admixed slowly at −78° C. under argon with n-butyllithium (1.6 M in hexane, 41.8 ml, 66.9 mmol), and stirred at −78° C. for 1 h. After adding a solution of 5-chloro-5-phenyldibenzosilol (J. Am. Chem. Soc. 1958, 80, 1883) (23.7 g, 80.3 mmol) in dry THF (80 ml) at −78° C., the mixture is warmed to room temperature with stirring overnight. The mixture was admixed with MeOH and H₂O, and extracted with CH₂Cl₂. The combined organic phases are washed with H₂O, dried over Na₂SO₄ and concentrated. Flash column chromatography (SiO₂, gradient from cyclohexane to 4:1 cyclohexane/CH₂Cl₂). Yield (3): 43%. ¹H NMR (CDCl₃, 400 MHz): δ=7.33 (m, 8H), 7.42 (t, 2H), 7.50 (dd, 4H), 7.55 (d, 2H), 7.64 (d, 2H), 7.72 (d, 4H), 7.81 (d, 4H), 7.93 (d, 4H), 8.22 (s, 2H).

Example 4

Preparation of Siloles of the Formula (4)

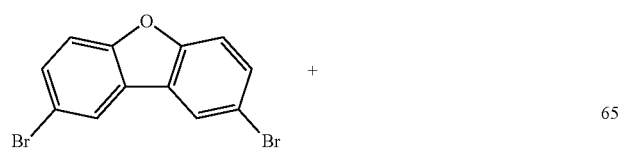

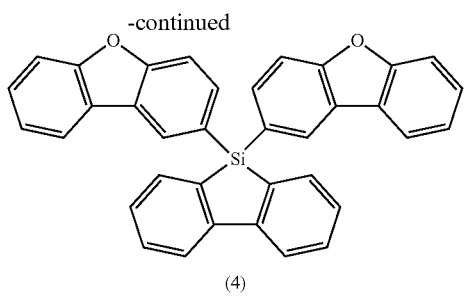

(4)

A solution of 2-bromodibenzofuran (*J. Org. Chem.* 1997, 62, 1348) (1.97 g, 7.96 mmol) in dry THF (70 ml) is admixed slowly at −78° C. under argon with n-butyllithium (1.6 M in hexane, 5.7 ml, 9.2 mmol), and stirred at −78° C. for 1 h. After adding a solution of 5,5-dichlorodibenzosilol (*Chem. Lett.* 2007, 36, 1138) (1.0 g, 4.0 mmol) in dry THF (10 ml) at −78° C., the mixture is warmed to room temperature with stirring overnight. The mixture was admixed with saturated NH$_4$Cl solution and extracted with CH$_2$Cl$_2$. The combined organic phases are washed with H$_2$O, dried over Na$_2$SO$_4$ and concentrated. Flash column chromatography (SiO$_2$, gradient from cyclohexane to 4:1 cyclohexane/CH$_2$Cl$_2$). Yield (4): 48%. $^1$H NMR (CDCl$_3$, 400 MHz): δ=7.32 (dd, 2H), 7.38 (dd, 2H), 7.44 (dd, 2H), 7.54 (m, 4H), 7.59 (d, 2H), 7.77 (d, 2H), 7.91 (d, 4H), 7.96 (d, 2H), 8.30 (s, 2H).

A secondary component isolated was:

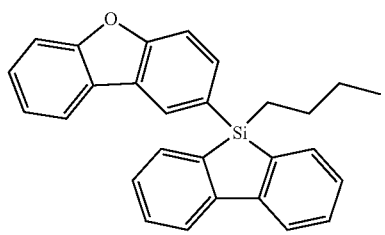 [SMILES: CCCC[Si]1(c2ccc3oc4ccccc4c3c2)c2ccccc2-c2ccccc21]

Yield: 5.9%
$^1$H NMR (CDCl$_3$, 400 MHz): δ=0.82 (t, 3H), 1.38 (m, 6H), 7.32 (m, 3H), 7.45 (m, 3H), 7.56 (dd, 2H), 7.62 (d, 1H), 7.72 (d, 2H), 7.88 (d, 2H), 7.94 (d, 1H), 8.19 (s, 1H).

B Diode Examples

Example 1

Production of an OLED with Compound (1) (Synthesis Example 1) or Compound (2) (Synthesis Example 2) as a Matrix Material The ITO substrate used as the anode is cleaned first with commercial detergents for LCD production (Deconex® 20NS, and 25ORGAN-ACID® neutralizing agent) and then in an acetone/isopropanol mixture in an ultrasound bath. To eliminate possible organic residues, the substrate is exposed to a continuous ozone flow in an ozone oven for a further 25 minutes. This treatment also improves the hole injection properties of the ITO.

Thereafter, the organic materials specified below are applied to the cleaned substrate by vapor deposition at a rate of approx. 0.5-5 nm/min at about 10$^{-8}$ mbar. As a hole conductor, a mixture of 50% Ir(dpbic)$_3$ and 50% MoO$_3$ with a thickness of 35 nm is applied to the substrate. Subsequently, a 20 nm-thick undoped layer of Ir(dpbic)$_3$.

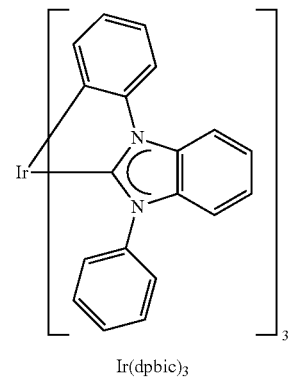

Ir(dpbic)$_3$ (for preparation of Ir(dpbic)$_3$, see Ir complex (7) in the application WO 2005/019373).

Subsequently, a mixture of 15% by weight of the emitter Ir(ppy)$_3$

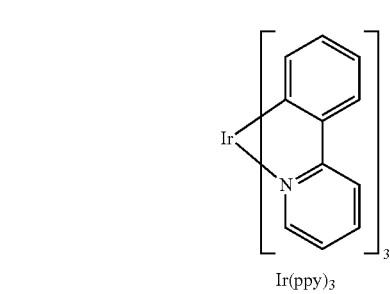

Ir(ppy)$_3$ and 85% by weight of the compound (1) or of the compound (2) is applied by vapor deposition in a thickness of 20 nm, the former compound Ir(ppy)$_3$ functioning as an emitter, and one of the latter two in each case as a matrix material.

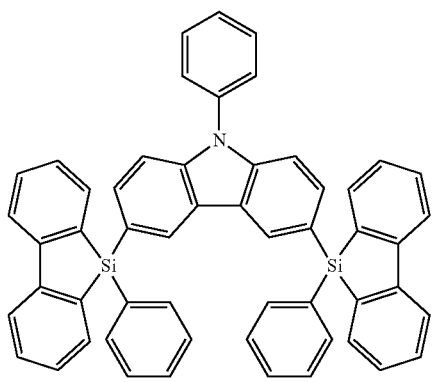

(1)

(2)

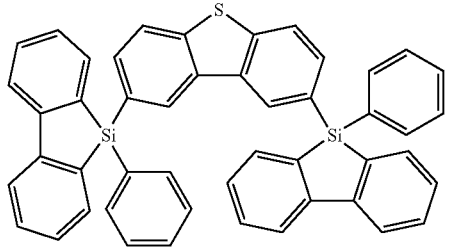

Subsequently, the material mCPy is applied by vapor deposition with a thickness of 10 nm as an exciton and hole blocker.

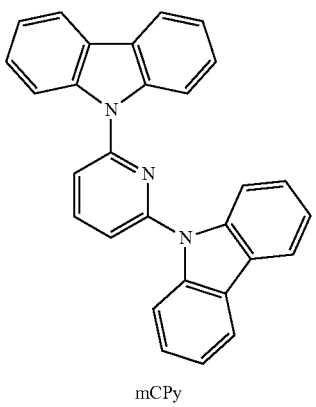 [SMILES: c1cc(-n2c3ccccc3c3ccccc32)nc(-n2c3ccccc3c3ccccc32)c1]

mCPy

Next, an electron transporter Alq₃ in a thickness of 50 nm, a 0.75 nm-thick lithium fluoride layer and finally a 110 nm-thick Al electrode are applied by vapor deposition.

To characterize the OLEDs, electroluminescence spectra are recorded at different currents and voltages. In addition, the current-voltage characteristic is measured in combination with the light output emitted. The light output can be converted to photometric parameters by calibration with a photometer.

For the OLEDs described, the following electrooptical data are obtained:

TABLE 1

|  | Compound (1) | Compound (2) |
| --- | --- | --- |
| Emission maximum | 515 nm | 516 nm |
| CIE(x, y) | X = 0.329 | X = 0.325 |
|  | Y = 0.571 | Y = 0.572 |
| Luminance at 8 V | 480 cd/m2 | 1900 cd/m2 |

Example 2

Production of an OLED Comprising Compound (1) (Synthesis Example 1) or Compound (2) (Synthesis Example 2) or Compound (3) (Synthesis Example 3) or Compound (4) (Synthesis Example 4) as a Blocker Material and/or Matrix Material The ITO substrate used as the anode is cleaned first with commercial detergents for LCD production (Deconex® 20NS, and 25ORGAN-ACID® neutralizing agent) and then in an acetone/isopropanol mixture in an ultrasound bath. To eliminate possible organic residues, the substrate is exposed to a continuous ozone flow in an ozone oven for a further 25 minutes. This treatment also improves the hole injection properties of the ITO.

Thereafter, the organic materials specified below are applied to the cleaned substrate by vapor deposition at a rate of approx. 0.5-5 nm/min at about $10^{-8}$ mbar. As a hole conductor, a mixture of 50% Ir(dpbic)₃ and 50% MoO₃ with a thickness of 35 nm is applied to the substrate. Subsequently, a 20 nm-thick undoped layer of Ir(dpbic)₃ is applied.

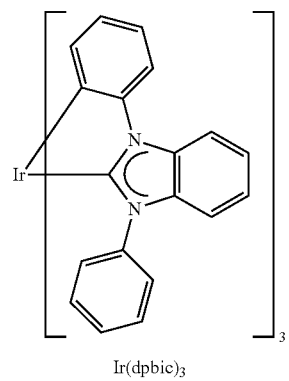

Ir(dpbic)₃

(for preparation of Ir(dpbic)₃, see Ir complex (7) in the application WO 2005/019373).

Subsequently, a mixture of 10% by weight of the emitter

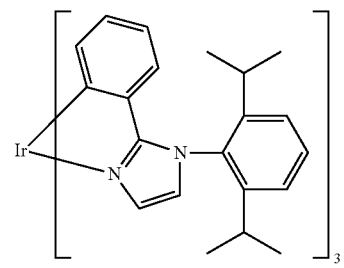

HBE-1

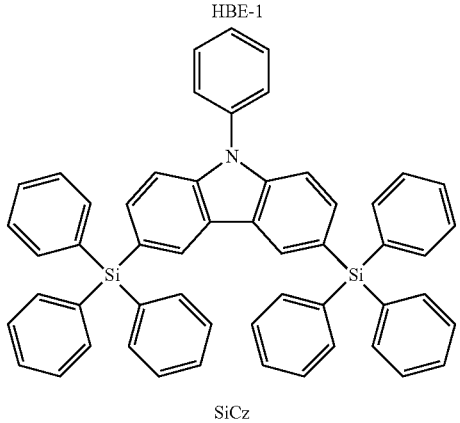

SiCz and 90% by weight of the compound SiCz (reference) or of the compound (1), (2), (3) or (4) is applied by vapor deposition in a thickness of 20 nm, the former compound HBE-1 functioning as an emitter, and one of the latter in each case as a matrix material.

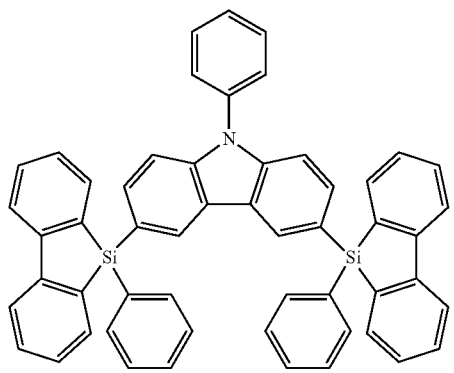

(1)

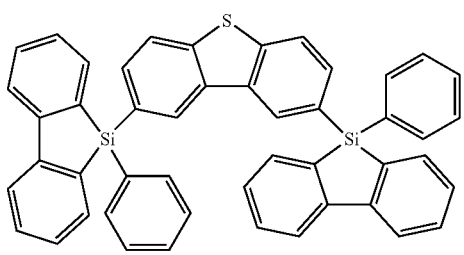

(2)

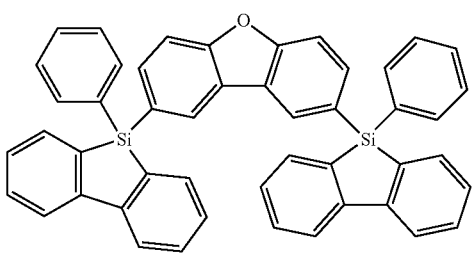

(3)

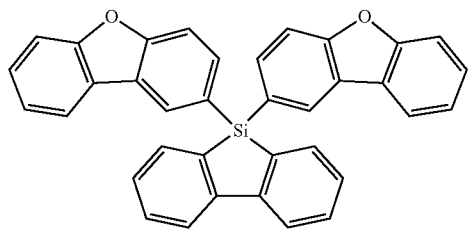

(4)

Subsequently, the material mCPy (reference) or compound (3) or (4) is applied by vapor deposition with a thickness of 10 nm as an exciton and hole blocker.

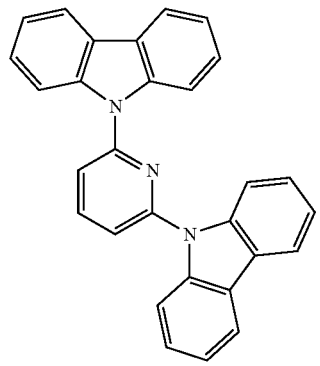

mCPy

Next, an electron transporter $Alq_3$ in a thickness of 50 nm, a 0.75 nm-thick lithium fluoride layer and finally a 110 nm-thick Al electrode are applied by vapor deposition.

To characterize the OLEDs, electroluminescence spectra are recorded at different currents and voltages specified in Table 2 below. The data for the inventive diodes specified in Table 2 are reported irelative to the data for the reference diode (matrix: SiCz; hole and exciton blocker: mCPy). The values for the reference diode are equated to 100.

TABLE 2

| Material | Function | Luminance at 8 V | Current efficiency at 300 nits | Power efficiency at 300 nits | Device structure (ITO 125 +/− 20 nm) (analogously to the typical procedure, exchange of mCPy and/or SiCz for novel material) |
|---|---|---|---|---|---|
| SiCz (Reference) | Matrix | 100 | 100 | 100 | 50% $MoO_3$: Ir(dpbic)3 (35 nm)//Ir(dpbic)$_3$ (20 nm)// 10% HBE-1: SiCz (20 nm)//mCPy (10 nm)// $Alq_3$ (50 nm)//LiF//Alu |
| 1 | Matrix | 297 | 158 | 180 | 50% $MoO_3$: Ir(dpbic)3 (35 nm)//Ir(dpbic)$_3$(20 nm)// 10% HBE-1: (1) (20 nm)//mCPy (10 nm)// $Alq_3$ (50 nm)//LiF//Alu |
| 2 | Matrix | 670 | 161 | 209 | 50% $MoO_3$: Ir(dpbic)3 (35 nm)//Ir(dpbic)$_3$ (20 nm)// 10% HBE-1: (2) (20 nm)//mCPy (10 nm)// $Alq_3$ (50 nm)//LiF//Alu |
| 3 | Matrix | 185 | 117 | 129 | 50% $MoO_3$: Ir(dpbic)3 (35 nm)//Ir(dpbic)$_3$ (20 nm)// 10% HBE-1: (3) (20 nm)//mCPy (10 nm)// $Alq_3$ (50 nm)//LiF//Alu |
|  | Matrix + Blocker | 169 | 123 | 134 | 50% $MoO_3$: Ir(dpbic)3 (35 nm)//Ir(dpbic)$_3$(20 nm)// 10% HBE-1:(3) (20 nm)//(3) (10 nm)// $Alq_3$ (50 nm)//LiF//Alu |
| 4 | Matrix | 337 | 156 | 185 | 50% $MoO_3$: Ir(dpbic)3 (35 nm)//Ir(dpbic)$_3$(20 nm)// |

TABLE 2-continued

| Material | Function | Luminance at 8 V | Current efficiency at 300 nits | Power efficiency at 300 nits | Device structure (ITO 125 +/− 20 nm) (analogously to the typical procedure, exchange of mCPy and/or SiCz for novel material) |
|---|---|---|---|---|---|
| | Matrix + Blocker | 325 | 155 | 178 | 10% HBE-1: (4) (20 nm)//mCPy (10 nm)// Alq$_3$ (50 nm)//LiF//Alu 50% MoO$_3$: Ir(dpbic)3 (35 nm)//Ir(dpbic)$_3$(20 nm)// 10% HBE-1: (4)(20 nm)//(4) (10 nm)// Alq$_3$ (50 nm)//LiF//Alu |

Example 3

OLED with Compound (2) as a Matrix Material for a Green Phosphorescent Emitter An OLED is provided, which has, on an ITO anode, a 20 nm-thick hole injection layer, a 10 nm-thick hole conductor layer, a 10 nm-thick red light-emitting layer, a 5 nm-thick green light-emitting layer, a 3 nm-thick blocking layer for holes and excitons, a 30 nm-thick electron conductor layer, a 20 nm-thick electron injection layer and a 200 nm-thick aluminum cathode.

The hole injection layer has, for example, 10% by weight of molybdenum trioxide and 90% by weight of NPB (N,N'-bis(naphthalen-1-yl)-N,N'-bis(phenyl)benzidine)). The hole conductor layer comprises NPB in this working example. The red light-emitting layer contains, for example, 70% by weight of NPB, 20% by weight of TPBi (2,2',2"-(1,3,5-benzinetriyl)-tris(1-phenyl)-1H-benzimidazole) and 10% by weight of iridium(III)bis(2-methyldibenzo[f,h]quinoxaline)(acetylacetonate) (compound 5).

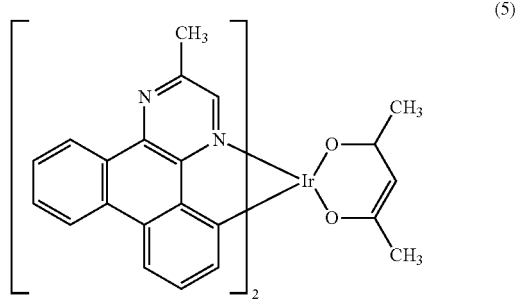

(5)

The green light-emitting layer has, as a matrix, compound (2) and, as a phosphorescent green emitter, 10% by weight of Ir(ppy)$_3$.

The blocking layer comprises a material of compound (6):

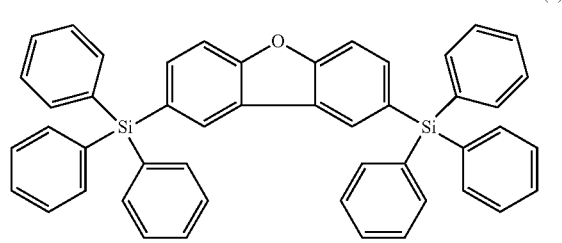

(6)

The electron conductor layer comprises TPBi, and the electron injection layer comprises 50% by weight of BCP (2,9-dimethyl-4,7-diphenyl-1,10-phenanthroline) and 50% by weight of cesium carbonate.

The combination of these materials for the blocking layer, the hole conductor layer and the matrix material of the green light-emitting layer can, in conjunction with the phosphorescent, green emitter, achieve high quantum efficiency values, high power efficiency values, low voltages and a high lifetime. The high quantum efficiency and power efficiency values are also enabled by the fact that the arrangement of the blocking layer adjoining the light-emitting layer prevents the further transport of charge carriers, for example holes, into non-emitting or low-emission layers, and loss of charge carriers into adjacent layers. In addition, the selection of the emitter and of the matrix in the green light-emitting layer allows the ratios of the particular energy levels within the light-emitting layer, for example the triplet level, to be adjusted.

As a result of the particular selection of the materials, radiative recombination of holes and electrons takes place at least partly in the green light-emitting layer. This means that the phosphorescent green emitter can be incorporated efficiently into the matrix and can form a solid solution therewith, which enables good energy transfer from the matrix material to the emitter, since aggregation of emitter molecules and annihilation effects in the matrix can be avoided. Thus, the triplet level of the matrix is sufficient for the emitter and hence also for emitters which emit longer-wave light.

In addition, the compounds (2) and (6) have a band gap between HOMO (highest occupied molecular orbital) and LUMO (lowest unoccupied molecular orbital), the compound (6) of the blocking layer having lower HOMO values and higher LUMO values than the compound (2) of the matrix material in the light-emitting layer. The two compounds are also chemically similar due to their similar chemical structures. This leads to good electron injection from the blocking layer into the green light-emitting layer, and to good blocking properties with respect to holes which originate from the green light-emitting layer. The compound (2) is thus a suitable matrix for the green emitter, which is also advantageous for the production of white light-emitting OLEDs.

Figure 1A:
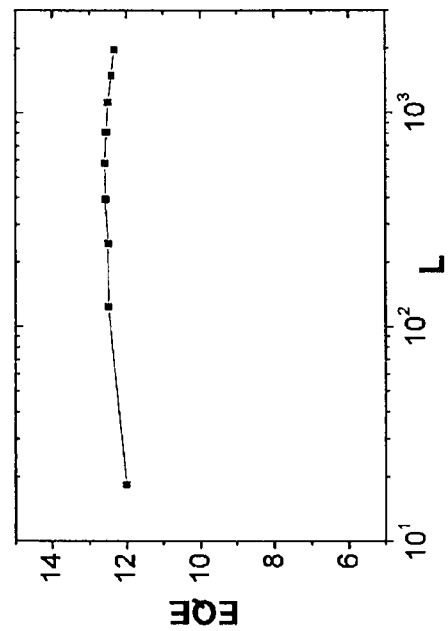

FIG. 1a) shows the current-voltage curve of an OLED according to Example 3, which has the combination of compounds (2) and Ir(ppy)$_3$ in its green light-emitting layer, and compound (6) in its blocking layer. The plot is of the current I in mA/cm$^2$ against the voltage U in V.

FIG. 1b) shows the external quantum efficiency curve of the abovementioned OLED, which has the combination of compounds (2) and Ir(ppy)$_3$ in its light-emitting layer, and compound (6) in its blocking layer. The plot is of the external quantum efficiency (EQE) in % against the luminance L in cd/m$^2$. To determine the EQE, a defined current is applied to the OLED and a spectrum is measured. The external quantum efficiency states how many photons measured outside the component are generated in the light-emitting layer per charge carrier injected. At a luminance of 1000 cd/m$^2$, the EQE for the abovementioned illustrative OLED may be 12.5%.

Alternatively, an OLED with the abovementioned structure may also have a red light-emitting layer and a green light-emitting layer, both the red emitter and the green emitter being arranged in a matrix which fully or partly comprises the compound (2).

Analogously to the OLED of Example 3, it is also possible to produce other monochrome OLEDs. For example, a light blue light-emitting OLED with a light blue phosphorescent emitter can be provided in the light-emitting layer.

Example 4

White Light-Emitting OLED with Compound (2) as a Material in the Blocking Layer

It is possible to produce a white light-emitting OLED which has, on an ITO anode, a 20 nm-thick hole injection layer, a 10 nm-thick hole conductor layer, a 10 nm-thick red light-emitting layer, a 3 nm-thick green light-emitting layer, a 10 nm-thick blue light-emitting layer, a 3 nm-thick blocking layer for holes and excitons, a 10 nm-thick electron conductor layer, a 20 nm-thick electron injection layer and a 200 nm-thick aluminum cathode.

The hole injection layer, the hole conductor layer, the red light-emitting layer, the electron conductor layer and the electron injection layer are formed according to Example 3.

The green light-emitting layer comprises 10% by weight of the green phosphorescent emitter Ir(ppy)$_3$ and 90% by weight of compound (7).

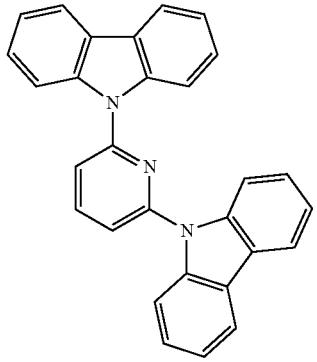

(7)

The blue light-emitting layer comprises compound (8) as a first matrix, compound (7) as a second matrix and compound (9) as a phosphorescent blue emitter in a ratio of 35:60:5.

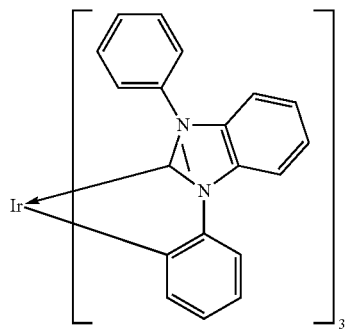

(8)

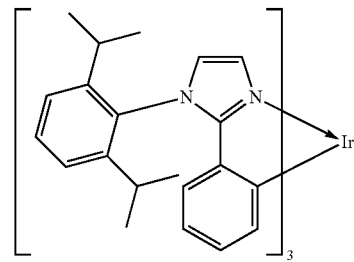

(9)

The blocking layer which adjoins the blue light-emitting layer comprises the material of compound (2).

Figure 2B:
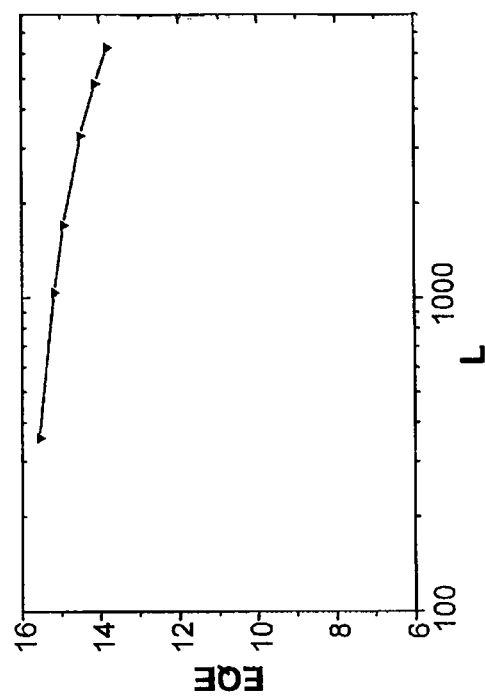
FIG. 2 shows a) the current-voltage curve and b) the current-efficiency curve of the OLED of diode example 4.
Figure 2A:
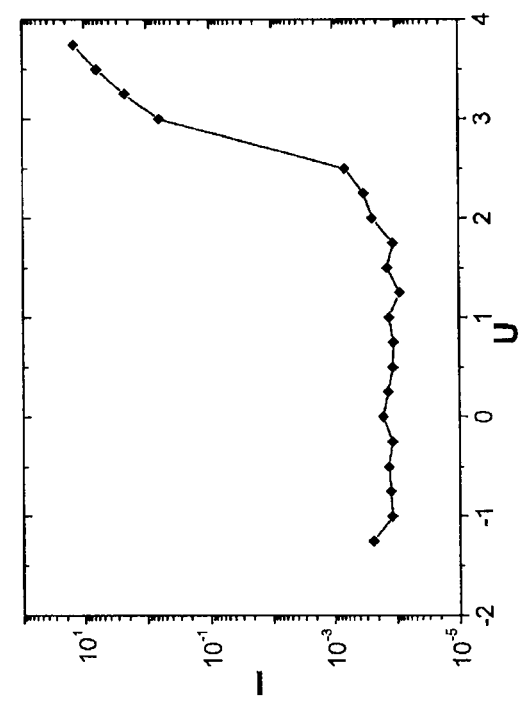

FIG. 2a shows the current-voltage curve, and FIG. 2b the external quantum efficiency curve, for this OLED. Such a white light-emitting OLED with compound (2) as the material for the blocking layer has a good efficiency (15.2% EQE at 1000 cd/m$^2$) and a low voltage, which is caused by a sufficient electron transport capacity in the layers. This shows that compound (2) in conjunction with the blue emitter (9), with compounds (7) and (8) as the matrix in the blue light-emitting layer, is a suitable material for the blocking layer.

Example 5

White Light-Emitting OLED with Compound (2) as a Matrix for a Green Phosphorescent Emitter and a Blue Phosphorescent Emitter It is possible to produce a white light-emitting OLED which has, on an ITO anode, a 20 nm-thick hole injection layer, a 10 nm-thick hole conductor layer, a 10 nm-thick red light-emitting layer, a 5 nm-thick green light-emitting layer, a 10 nm-thick blue light-emitting layer, a 5 nm-thick blocking layer for holes and excitons, a 30 nm-thick electron conductor layer, a 20 nm-thick electron injection layer and a 200 nm-thick aluminum cathode.

The hole injection layer, the hole conductor layer, the red light-emitting layer, the electron conductor layer and the electron injection layer are formed, for example, according to Example 3.

The green light-emitting layer comprises 10% by weight of the green phosphorescent emitter Ir(ppy)$_3$ and 90% by weight of compound (2) as a matrix.

The blue light-emitting layer comprises compound (2) as a matrix and compound (9) as a blue emitter, which is present in the layer at 10% by weight.

The blocking layer has the material of compound (6).

This example shows that compound (2) is suitable as a matrix for two successive light-emitting layers with emitters of different color and it is thus also possible to provide a white light-emitting OLED which has a good efficiency and color (CIE at luminance 1000 cd/m$^2$ is 0.45/0.44).

Figure 3A:
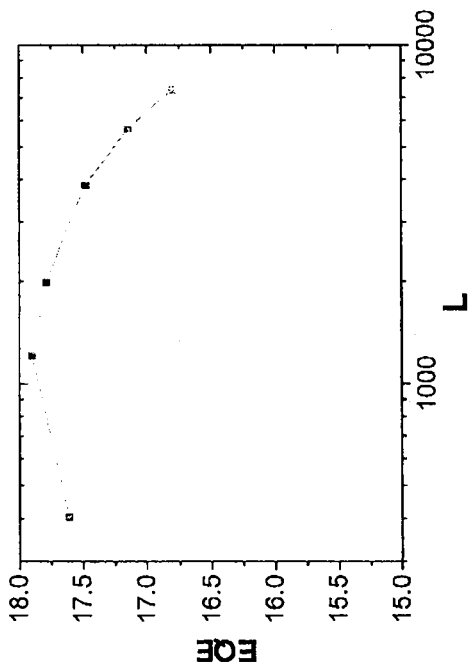
FIG. 3 shows a) the current-voltage curve and b) the current-efficiency curve of the OLED of diode example 5.
Figure 3B:
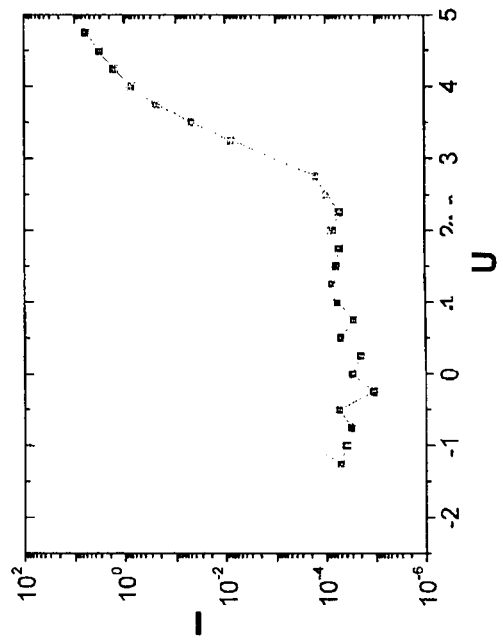

FIGS. 3a and 3b show the current-efficiency curve and the external quantum efficiency curve (EQE is 17.8% at 1000 cd/m$^2$) for this working example.

Alternatively, an OLED with the abovementioned structure may also have a red light-emitting layer and a green light-emitting layer, in which both the red emitter and the green emitter are arranged in a matrix which fully or partly comprises the compound (2). Or the OLED may have a red light-emitting layer and a blue light-emitting layer in which both the red emitter and the blue emitter are arranged in a matrix which fully or partly comprises the compound (2). It is also possible for all three light-emitting layers with compound (2) as a matrix to be present in an OLED, in which case compound (2) is used alone or in combination with other matrix materials.

Example 6

White Light-Emitting OLED with Compound (2) as a Matrix for the Green Phosphorescent Emitter and as a Matrix Component for the Blue Phosphorescent Emitter It is possible to produce a white light-emitting OLED which has, on an ITO anode, a 20 nm-thick hole injection layer, a 10 nm-thick hole conductor layer, a 10 nm-thick red light-emitting layer, a 3 nm-thick green light-emitting layer, a 10 nm-thick blue light-emitting layer, a 3 nm-thick blocking layer for holes and excitons, a 30 nm-thick electron conductor layer, a 20 nm-thick electron injection layer and a 200 nm-thick aluminum cathode.

The hole injection layer, the hole conductor layer, the red light-emitting layer, the green light-emitting layer, the blocking layer, the electron conductor layer and the electron injection layer are formed, for example, according to Example 5.

The blue light-emitting layer comprises compound (2) as a first matrix at 60% by weight, compound (8) as a second matrix at 35% by weight and compound (9) as a blue phosphorescent emitter which is present in the layer at 5% by weight.

This example shows that compound (2) is suitable as a matrix material for two successive light-emitting layers. Compound (2) is present as the sole matrix material in the green light-emitting layer, and in a mixture with a further matrix material in the blue light-emitting layer. This OLED is notable for a high efficiency and a high color stability even in the event of a change in the current density and hence luminance (CIE 0.44/0.42 between 100 and 3000 cd/m$^2$). Thus, compound (2) is suitable as a matrix for efficient white light-emitting OLEDs.

Figure 4B:
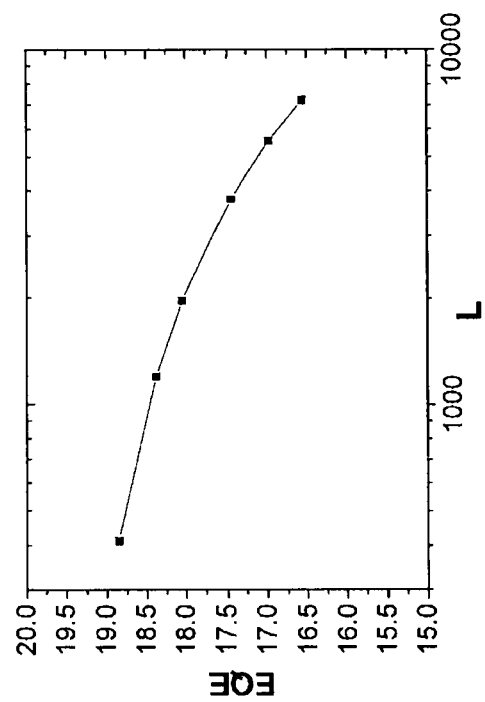
FIG. 4 shows a) the current-voltage curve and b) the current-efficiency curve of the OLED of diode example 6.
Figure 4A:
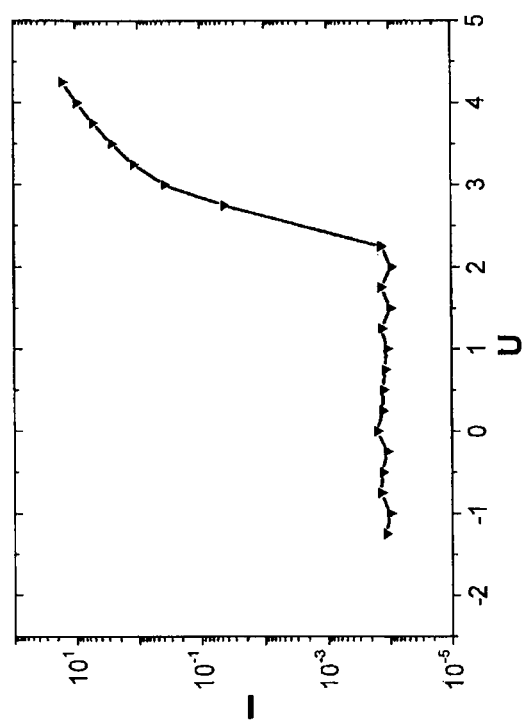

FIGS. 4a and 4b show the current-efficiency curve and the external quantum efficiency curve (EQE is 18.5% at 1000 cd/m$^2$) for this working example.

Alternatively, an OLED with the abovementioned structure may also have a red light-emitting layer and a green light-emitting layer, in which both the red emitter and the green emitter are arranged in a matrix which fully or partly comprises compound (2). Alternatively, the OLED may have a red light-emitting layer and a blue light-emitting layer, in which both the red emitter and the blue emitter are arranged in a matrix which fully or partly comprises compound (2). In a further embodiment, the OLED may have a green light-emitting layer and a blue light-emitting layer, in which both the green emitter and the blue emitter are arranged in a matrix which fully or partly comprises compound (2). It is also possible for all light-emitting layers comprising compound (2) to be formed as a matrix, in which case compound (2) may be present alone or in combination with other matrix materials.

For the abovementioned Examples 3 to 6, the materials for the individual layers may be varied.

For example, the phosphorescent green emitter used may be tris(2-phenylpyridine)-iridium(III), tris(2-(p-tolyl)pyridine)iridium(III),
bis(2-phenylpyridine)(acetylacetonate)iridium(III)
bis(2-(p-tolyl)pyridine)(acetylacetonate)iridium(III)
bis[2-(2-hydroxyphenyl)benzothiazolato]zinc(III)
bis[1-(9,9-dimethyl-9H-fluoren-2-yl)isoquinoline](acetylacetonate)iridium(III)
bis(2-benzo[b]thiophene-2-yl-pyridine)(acetylacetonate)iridium(III)
tris(1-phenylisoquinoline)iridium(III)
bis(1-phenylisoquinoline)acetylacetonate)iridium(III)
tris(dibenzoylmethane)phenanthroline europium(III)
osmium(II)bis(3-(trifluoromethyl)-5-(4-tert-butylpyridyl)-1,2,4-triazolate)diphenylmethyl-phosphine
osmium(II)bis(3-(trifluoromethyl)-5-(2-pyridyl)-1,2,4-triazole)dimethylphenylphosphine
osmium(II)bis(3-(trifluoromethyl)-5-(4-tert-butylpyridyl)-1,2,4-triazolate)dimethylphenylphosphine
bis(2-phenylbenzothiazolato)(acetylacetonate)iridium(III)
osmium(II)bis(3-trifluoromethyl-5-(2-pyridyl)pyrazolate) dimethylphenylphosphine
tris(2-phenylquinoline)iridium(III)
bis(2-phenylquinoline)(acetylacetonate)iridium(III)
bis[3-(9,9-dimethyl-9H-fluorene-2-yl)isoquinoline](acetylacetonate)iridium(III)
tris[4,4'-di-tert-butyl-(2,2)-bipyridine]ruthenium(III)
iridium(III) bis(2-(2'-benzothienyl)pyridinato-N,C3')(acetylacetonate)
tris(1-phenylisoquinoline)iridium(III)
bis(1-phenylisoquinoline)(acetylacetonate)iridium(III)
iridium(III)bis(dibenzo[f,h]quinoxaline)(acetylacetonate)
bis(2-(9,9-dibutylfluorenyl)-1-isoquinoline(acetylacetonate)
iridium(III)bis(2-methyldibenzo[f,h]quinoxaline(acetylacetonate)
bis(2-(9,9-dihexylfluorenyl)-1-pyridine)(acetylacetonate) iridium(III)
tris(3-methyl-1-phenyl-4-trimethyl-acetyl-5-pyrazoline)terbium(III).

In addition, the material used for the blocking layer and/or the hole conductor layer may be N,N'-bis(naphthalen-1-yl)-N,N'-bis(phenyl)-9,9-dimethylfluorene
N,N'-bis(3-methylphenyl)-N,N'-bis(phenyl)-9,9-diphenylfluorene
N,N'-bis(naphthalen-1-yl)-N,N'-bis(phenyl)-9,9-diphenylfluorene
N,N'-bis(naphthalen-1-yl)-N,N'-bis(phenyl)-2,2-dimethylbenzidine
N,N'-bis(3-methylphenyl)-N,N'-bis(phenyl)-9,9-spirobifluorene
2,2',7,7'-tetrakis(N,N-diphenylamino)-9,9'-spirobifluorene
N,N'-bis(naphthalen-1-yl)-N,N'-bis(phenyl)benzidine
N,N'-bis(naphthalen-2-yl)-N,N'-bis(phenyl)benzidine
N,N'-bis(3-methylphenyl)-N,N'-bis(phenyl)benzidine
N,N'-bis(3-methylphenyl)-N,N'-bis(phenyl)-9,9-dimethylfluorene
N,N'-bis(naphthalen-1-yl)-N,N'-bis(phenyl)-9,9-spirobifluorene
di-[4-(N,N-ditolylamino)phenyl]cyclohexane
2,2',7,7'-tetra(N,N-ditolyl)aminospirobifluorene
9,9-bis[4-(N,N-bis-biphenyl-4-yl-amino)phenyl]-9H-fluorene
2,2',7,7'-tetrakis[N-naphthalenyl(phenyl)amino]-9,9-spirobifluorene
2,7-bis[N,N-bis(9,9-spirobifluorene-2-yl)amino]-9,9-spirobifluorene
2,2'-bis[N,N-bis(biphenyl-4-yl)amino]-9,9-spirobifluorene
N,N'-bis(phenanthren-9-yl)-N,N'-bis(phenyl)benzidine
N,N,N',N'-tetra-naphthalen-2-yl-benzidine
2,2'-bis(N,N-diphenylamino)-9,9-spirobifluorene
9,9-bis[4-(N,N-bisnapthalen-2-yl-amino)phenyl]-9H-fluorene
9,9-bis[4-(N,N'-binaphthalen-2-yl-N,N'-bisphenylamino) phenyl]-9H-fluorene
titanium oxide phthalocyanine copper phthalocyanine
2,3,5,6-tetrafluoro-7,7,8,8-tetracyano-quinodimethane
4,4',4''-tris(N-3-methylphenyl-N-phenylamino)triphenylamine (as a dopant in a hole conductor layer)
4,4',4''-tris(N-(2-naphthyl)-N-phenylamino)triphenylamine
4,4',4''-tris(N-(1-naphthyl)-N-phenylamino)triphenylamine
4,4',4''-tris(N,N-diphenylamino)triphenylamine)
pyrazino[2,3-f][1,10]phenanthroline-2,3-dicarbonitrile
N,N, N',N'-tetrakis(4-methoxyphenyl)benzidine
2,7-bis[N,N-bis(4-methoxyphenyl)amino]-9,9-spirobifluorene
2,2'-bis[N,N-bis(4-methoxyphenyl)amino]-9,9-spirobifluorene
N,N'-di(naphthalen-2-yl)-N,N'-diphenylbenzol-1,4-diamine
N,N'-diphenyl-N,N'-di[4-(N,N-ditolylamino)phenyl]benzidine
N,N'-diphenyl-N,N'-di[4-(N,N-diphenylamino)phenyl]benzidine
or, as a blocking layer and/or electron conductor layer,
2,2',2''-(1,3,5-benzinetriyl)-tris(1-phenyl-1H-benzimidazole)
2-(4-biphenylyl)-5-(4-tert-butylphenyl)-1,3,4-oxadiazole
2,9-dimethyl-4,7-diphenyl-1,10-phenanthroline
8-hydroxyquinolinolato-lithium
4-(naphthalen-1-yl)-3,5-diphenyl-4H-1,2,4-triazole
1,3-bis[2-(2,2'-bipyridin-6-yl)-1,3,4-oxadiazo-5-yl]benzene
4,7-diphenyl-1,10-phenanthroline
3-(4-biphenylyl)-4-phenyl-5-tert-butylphenyl-1,2,4-triazole
bis(2-methyl-8-quinolinolate)-4-(phenylphenolato)aluminum
6,6'-bis[5-(biphenyl-4-yl)-1,3,4-oxadiazo-2-yl]-2,2'-bipyridyl
2-phenyl-9,10-di(naphthalen-2-yl)anthracene
2,7-bis[2-(2,2'-bipyridine-6-yl)-1,3,4-oxadiazo-5-yl]-9,9-dimethylfluorene
1,3-bis[2-(4-tert-butylphenyl)-1,3,4-oxadiazo-5-yl]benzene
2-(naphthalen-2-yl)-4,7-diphenyl-1,10-phenanthroline
2,9-bis(naphthalen-2-yl)-4,7-diphenyl-1,10-phenanthroline
tris(2,4,6-trimethyl-3-(pyridin-3-yl)phenyl)borane
1-methyl-2-(4-(naphthalen-2-yl)phenyl)-1H-imidazo[4,5-f][1,10]phenanthroline.

In addition, the OLED of Example 3 can be used for a component which emits white light, by stacking a plurality of monochrome OLEDs which emit light of different colors one on top of another, together with the OLED of Example 3, and bonding them to one another by means of "charge generation layers" (CGLs). The CGLs may transport the charge carriers of an OLED to the OLED arranged above or below.

The OLED of Example 3 may also be arranged alongside a plurality of monochrome OLEDs which emit light of different colors, in order to achieve a white light-emitting component.

In Examples 3 to 6, the anode and/or cathode used may also be materials selected from a group comprising Cu, Au, Pt, Pd, Ph, Os, Al, Mg, Ca, Ba, Ag, Yb, Fe, Co, Ni, ITO (indium tin oxide), AZO (aluminum-doped zinc oxide) and combinations thereof. In addition, metals of the main groups, transition metals, lanthanoids and alloys of these metals, transition metals and lanthanoids, are suitable as material for the electrodes.

In addition, the OLED of Examples 1 to 6 may be configured as a transparent OLED. The OLED of Examples 1 to 6 may also be formed as a top-emitting or bottom-emitting OLED. In the case of a top-emitting OLED, the electrode further remote from the substrate is transparent, such that the emission goes through this electrode. In a bottom-emitting OLED, the substrate and the electrode arranged on the substrate are transparent, such that the emission goes through the substrate. In a transparent OLED, double-sided emission, through substrate and the electrode further remote from the substrate, both of which are transparent, is possible.

The invention claimed is:

1. A compound of the formula (Ib)

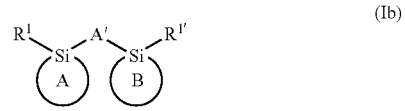

in which:

A' is a fused ring system formed from at least 3 fused rings which each independently have 4 to 10 ring members and may be saturated or mono- or polyunsaturated and may be unsubstituted or substituted by one or more substituents selected from alkyl, cycloalkyl, heterocycloalkyl, aryl, heteroaryl and groups with donor or acceptor action, wherein the fused ring system has at least one heteroatom-containing group in the fused ring system itself or in at least one substituent;

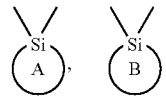

are each independently an Si-comprising ring which has 4 to 10, wherein the ring may be saturated or mono- or polyunsaturated and, in addition to the silicon atom, may have one or more further heteroatom-containing groups and may be unsubstituted or substituted by one or more substituents selected from alkyl, cycloalkyl, heterocycloalkyl, aryl, heteroaryl and groups with donor or acceptor action, wherein the Si-comprising ring may additionally be part of a fused ring system formed from at least 2, wherein the further rings—in addition to the Si-comprising ring—in the fused ring system may each independently be saturated or mono- or polyunsaturated and may be unsubstituted or substituted by one or more substituents selected from alkyl, cycloalkyl, heterocycloalkyl, aryl, heteroaryl and groups with donor or acceptor action, and may have one or more heteroatom-containing groups;

$R^1$, $R^{1'}$ are each independently a fused ring system formed from at least 3 fused rings which each independently have 4 to 10 ring members and may be saturated or mono- or polyunsaturated and unsubstituted or substituted by one or more substituents selected from alkyl, cycloalkyl, heterocycloalkyl, aryl, heteroaryl, $SiR^2R^3R^4$ and groups with donor or acceptor action, wherein the fused ring system has at least one heteroatom in the fused ring system itself or in at least one substituent, alkyl, cycloalkyl, heterocycloalkyl, aryl or heteroaryl, wherein the aforementioned groups may be unsubstituted or substituted by one or more substituents selected from alkyl, cycloalkyl, heterocycloalkyl, aryl, heteroaryl, and groups with donor or acceptor action.

2. An electronic device comprising the compound of according to claim 1.

3. A matrix material and/or hole/exciton blocker material comprising the compound of claim 1.

4. An organic light-emitting diode comprising the compound of claim 1.

5. A light-emitting layer comprising at least one emitter material and the compound of claim 1.

6. An organic light-emitting diode comprising an anode An and a cathode Ka and a first light-emitting layer E arranged between the anode An and the cathode Ka, and optionally, as a further layer, at least one blocking layer for holes/excitons, characterized in that the organic light-emitting diode comprises the compound of the formula (Ib) according to claim 1, which is present in the light-emitting layer and/or in the at least in the blocking layer for holes/excitons—if present.

7. A device selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, vehicles, and destination displays on buses and trains, comprising at least one organic light-emitting diode according to claim 6.

8. The light-emitting diode according to claim 6, comprising at least one second light-emitting layer arranged between the anode An and the cathode Ka.

9. The light-emitting diode according to claim 8, wherein the second light-emitting layer comprises a compound of formula (Ib).

10. The light-emitting diode according to claim 8, wherein the second light-emitting layer comprises a compound of formula (I)

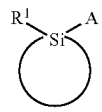
(I)

in which:

A is a fused ring system formed from at least 3 fused rings which each independently have 4 to 10 ring members and may be saturated or mono- or polyunsaturated and unsubstituted or substituted by one or more substituents selected from alkyl, cycloalkyl, heterocycloalkyl, aryl, heteroaryl, $SiR^2R^3R^4$ and groups with donor or acceptor action, wherein the fused ring system has at least one heteroatom in the fused ring system itself or in at least one substituent;

is an Si-containing ring which has 4 to 10 ring members, where the ring may be saturated or mono- or polyunsaturated and, in addition to the silicon atom, may have one or more further heteroatoms, and may be unsubstituted or substituted by one or more substituents selected from alkyl, cycloalkyl, heterocycloalkyl, aryl, heteroaryl and substituents with donor or acceptor action, wherein the Si-containing ring may additionally be part of a fused ring system formed from at least two rings, wherein the further rings in the fused ring system may each independently be saturated or mono- or polyunsaturated and unsubstituted or substituted by one or more substituents selected from alkyl, cycloalkyl, heterocycloalkyl, aryl, heteroaryl, and substituents with donor or acceptor action, and may have one or more heteroatoms;

$R^1$ is A or alkyl, cycloalkyl, heterocycloalkyl, aryl or heteroaryl;

$R^2$, $R^3$, $R^4$ are each independently alkyl, cycloalkyl, heterocycloalkyl, aryl, heteroaryl, where the $R^2$, $R^3$ and $R^4$ moieties or two of the $R^2$, $R^3$ and $R^4$ moieties may additionally together form a fused ring system composed of 2 to 6 rings each of which may be saturated or mono- or polyunsaturated and may be unsubstituted or substituted by one or more substituents selected from alkyl, cycloalkyl, heterocycloalkyl, aryl, heteroaryl and a group with donor or acceptor action.

11. The light-emitting diode according to claim 8, which has an overall emission composed of the emission of the first light-emitting layer E and of the second light emitting layer.

12. The light-emitting diode according to claim 11, wherein the overall emission comprises white light.

13. A matrix material and/or hole/exciton blocker material comprising a compound represented by formula (I)

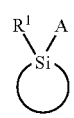
(I)

in which:

A has the following general formula Aa

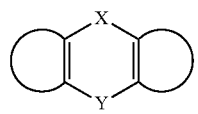
(Aa)

in which:

X is S, O, $NR^5$, SO, $SO_2$ or $PR^6$;

Y is a bond or $NR^5$, $CR^7R^8$, O, SO, $SO_2$ or S;

$R^5$ is cycloalkyl, heterocycloalkyl, aryl or heteroaryl;

$R^6$ is alkyl, cycloalkyl, heterocycloalkyl, aryl or heteroaryl;

$R^7$, $R^8$ are each independently hydrogen, alkyl, cycloalkyl, heterocycloalkyl, aryl or heteroaryl; and

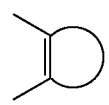

in each case independently is a fused ring which has 5 to 6 ring members and, in addition to the double bond already present, may have one or more double bonds and may be unsubstituted or substituted by one or more substituents, selected from alkyl, cycloalkyl, heterocycloalkyl, aryl, heteroaryl, $SiR^2R^3R^4$ and groups with donor or acceptor action, wherein the fused ring having 5 or 6 ring atoms may additionally be annulated to one or more further fused rings having 5 or 6 ring atoms;

is an Si-containing ring which has 4 to 10 ring members, where the ring may be saturated or mono- or polyunsaturated and, in addition to the silicon atom, may have one or more further heteroatoms, and may be unsubstituted or substituted by one or more substituents selected from alkyl, cycloalkyl, heterocycloalkyl, aryl, heteroaryl and substituents with donor or acceptor action, wherein the Si-containing ring may additionally be part of a fused ring system formed from at least two rings, wherein the further rings in the fused ring system may each independently be saturated or mono- or polyunsaturated and unsubstituted or substituted by one or more substituents selected from alkyl, cycloalkyl, heterocycloalkyl, aryl, heteroaryl, and substituents with donor or acceptor action, and may have one or more heteroatoms;

$R^1$ is a fused ring system formed from at least 3 fused rings which each independently have 4 to 10 ring members and may be saturated or mono- or polyunsaturated and unsubstituted or substituted by one or more substituents selected from alkyl, cycloalkyl, heterocycloalkyl, aryl, heteroaryl, $SiR^2R^3R^4$ and groups with donor or acceptor action, wherein the fused ring system has at least one heteroatom in the fused ring system itself or in at least one substituent or alkyl, cycloalkyl, heterocycloalkyl, aryl or heteroaryl;

$R^2, R^3, R^4$ are each independently alkyl, cycloalkyl, heterocycloalkyl, aryl, heteroaryl, where the $R^2, R^3$ and $R^4$ moieties or two of the $R^2, R^3$ and $R^4$ moieties may additionally together form a fused ring system composed of 2 to 6 rings, each of which may be saturated or mono- or polyunsaturated and may be unsubstituted or substituted by one or more substituents selected from alkyl, cycloalkyl, heterocycloalkyl, aryl, heteroaryl and a group with donor or acceptor action.

14. The material according to claim 13, wherein the compound of the formula (I) has the following formula (Ia):

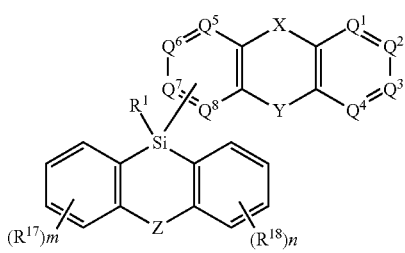

(Ia)

in which:
X is S, O, $NR^5$, SO, $SO_2$ or $PR^6$;
Y is a bond, $NR^5$, $CR^7R^8$, O, SO, $SO_2$ or S;
$Q^1$ to $Q^8$ are each independently $CR^9$ or N, wherein one of the $Q^1$ to $Q^8$ groups forms a bond to the silicon atom of the

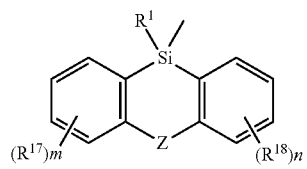

group, and this group is C;

$R^5$ is cycloalkyl, heterocycloalkyl, aryl or heteroaryl;

$R^6$ is alkyl, cycloalkyl, heterocycloalkyl, aryl or heteroaryl, $R^7, R^8$ are each independently hydrogen, alkyl, cycloalkyl, heterocycloalkyl, aryl or heteroaryl;

$R^9$ is independently hydrogen, alkyl, cycloalkyl, heterocycloalkyl, aryl, heteroaryl, $SiR^2R^3R^4$ or a group with donor or acceptor action;

$R^2, R^3, R^4$ are each independently alkyl, cycloalkyl, heterocycloalkyl, aryl, heteroaryl, wherein the $R^2, R^3$ and $R^4$ or two of the $R^2, R^3$ and $R^4$ moieties may additionally together form a fused ring system composed of 2 to 6 rings, each of which may be saturated or mono- or polyunsaturated and may be unsubstituted or substituted by one or more substituents selected from alkyl, cycloalkyl, heterocycloalkyl, aryl, heteroaryl and a group with donor or acceptor action;

Z is a bond or $NR^{14}$, $CR^{15}R^{16}$, O, SO, $SO_2$, Si or S;

$R^{14}$ is alkyl, cycloalkyl, heterocycloalkyl, aryl or heteroaryl;

$R^{15}, R^{16}$ are each independently hydrogen, alkyl, cycloalkyl, heterocycloalkyl, aryl or heteroaryl, preferably alkyl or aryl;

$R^{17}, R^{18}$ are each independently alkyl, cycloalkyl, heterocycloalkyl, aryl, heteroaryl, or a group with donor or acceptor action, or two adjacent $R^{17}$ moieties and/or two adjacent $R^{18}$ moieties in each case independently form, together with the two particular carbon atoms to which they are linked, a cyclic moiety which has 5 or 6 ring atoms and may have one, two or three double bonds and may have one or two heteroatom-containing groups selected from N, O, SO, $SO_2$ or S, and may be unsubstituted or substituted by one or more substituents selected from alkyl, cycloalkyl, heterocycloalkyl, aryl, heteroaryl and groups with donor or acceptor action;

n, m are each independently 0, 1, 2, 3 or 4;

$R^1$ is

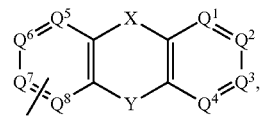

alkyl, cycloalkyl, heterocycloalkyl, aryl or heteroaryl.

15. An organic light-emitting diode comprising the material of claim 13.

16. A light-emitting layer comprising at least one emitter material and the material of claim 13.

17. The material according to claim 13, wherein the A group in formula (I) has the following formula Aaa

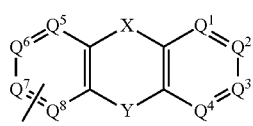
(Aaa)

in which:

X is S, O, NR$^5$, SO, SO$_2$ or PR$^6$;

Y is a bond or NR$^5$, CR$^7$R$^8$, O, SO, SO$_2$ or S;

Q$^1$ to Q$^8$ are each independently CR$^9$, N, wherein one via of the Q$^1$, Q$^2$, Q$^3$, Q$^4$, Q$^5$, Q$^5$, Q$^7$, Q$^8$, groups a linkage to the silicon atom of the

group is effected and this Q$^1$, Q$^2$, Q$^3$, Q$^4$, Q$^5$, Q$^6$, Q$^7$ or Q$^8$ group is C;

R$^5$, is cycloalkyl, heterocycloalkyl, aryl or heteroaryl;

R$^6$ is alkyl, cycloalkyl, heterocycloalkyl, aryl or heteroaryl;

R$^7$, R$^8$ are each independently hydrogen, alkyl, cycloalkyl, heterocycloalkyl, aryl or heteroaryl;

R$^9$ is hydrogen, alkyl, cycloalkyl, heterocycloalkyl, aryl, heteroaryl, SiR$^2$R$^3$R$^4$, groups with donor or acceptor action,

R$^2$, R$^3$, R$^4$ are each independently alkyl, cycloalkyl, heterocycloalkyl, aryl, heteroaryl, wherein the R$^2$, R$^3$ and R$^4$ moieties or two of the R$^2$, R$^3$ and R$^4$ moieties may additionally together form a fused ring system composed of 2 to 6 rings, each of which may be saturated or mono- or polyunsaturated and may be unsubstituted or substituted by one of the more substituents selected from alkyl, cycloalkyl, heterocycloalkyl, aryl, heteroaryl and a group with donor or acceptor action.

18. The material according to claim 17, wherein R$^9$ in Q$^1$, Q$^2$, Q$^4$, Q$^5$, Q$^6$ and Q$^8$ is hydrogen and R$^9$ in Q$^3$ is hydrogen or SiR$^2$R$^3$R$^4$ and Q$^7$ is C and is linked to the silicon atoms of the

group.

19. The material according to claim 13, wherein the

group in formula (I) is defined as follows:

an Si-comprising ring which has 5 or 6 ring members, wherein the ring is at least diunsaturated and, in addition to the silicon atom, contains no or one further heteroatom-containing group selected from S, O, SO, SO$_2$ and N, and may be unsubstituted or substituted by one or more substituents selected from alkyl, cycloalkyl, heterocycloalkyl, aryl, heteroaryl and groups with donor or acceptor action, wherein the Si-comprising ring may be part of a fused ring system formed from 2 or 3, rings, wherein the further rings—in addition to the Si—comprising ring—in the fused ring system may each independently be saturated or mono- or polyunsaturated and may be unsubstituted or substituted by one or more substituents selected from alkyl, cycloalkyl, heterocycloalkyl, aryl, heteroaryl and groups with donor or acceptor action, and may have one or two heteroatom-containing groups selected from O, S, SO, SO$_2$ and N.

20. The material according to claim 19, wherein the

group in formula (I) has the following formula (Sia)

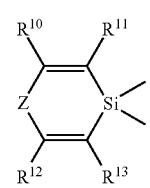
(Sia)

in which:

Z is a bond or NR$^{14}$, CR$^{15}$R$^{16}$, O, SO, SO$_2$, Si or S,

R$^{10}$ to R$^{13}$ are each independently hydrogen, alkyl, cycloalkyl, heterocycloalkyl, aryl, heteroaryl and groups with donor or acceptor action, or R$^{10}$ and R$^{11}$ and/or R$^{12}$ and R$^{13}$ and/or R$^{10}$ and R$^{12}$ in each case independently form, together with the two particular carbon atoms of the Si-comprising ring in the formula (Sia) to which they are linked, a cyclic moiety which has 5 or 6 ring atoms and may have one, two or three double bonds and may have one or two heteroatom-containing groups selected from N, O, SO, SO$_2$ or S, and may be unsubstituted or substituted by one or more substituents selected from alkyl, cycloalkyl, heterocycloalkyl, aryl, heteroaryl and groups with donor or acceptor action, wherein the cyclic moiety having 5 or 6 ring atoms may additionally be anullated to one or more further cyclic moieties having 5 or 6 ring atoms;

R$^{14}$ is alkyl, cycloalkyl, heterocycloalkyl, aryl or heteroaryl; and

R$^{15}$, R$^{16}$ are each independently hydrogen, alkyl, cycloalkyl, heterocycloalkyl, aryl or heteroaryl.

21. The material according to claim 20, wherein the

group in formula (I) has the following formula (Siaa)

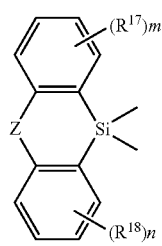
(Siaa)

in which:

Z is a bond or $NR^{14}$, $CR^{15}R^{16}$, O, SO, $SO_2$, Si or S, $R^{14}$ is alkyl, cycloalkyl, heterocycloalkyl, aryl or heteroaryl; and $R^{15}$, $R^{16}$ are each independently hydrogen, alkyl, cycloalkyl, heterocycloalkyl, aryl or heteroaryl;

$R^{17}$, $R^{18}$ are each independently alkyl, cycloalkyl, heterocycloalkyl, aryl, heteroaryl, or groups with donor or acceptor action, or two adjacent $R^{17}$ moieties and/or two adjacent $R^{18}$ moieties in each case independently form, together with the two particular carbon atoms to which they are linked, a cyclic moiety which has 5 or 6 ring atoms and may have one, two or three double bonds and may have one or two heteroatom-containing groups selected from N, O, SO, $SO_2$ or S, and may be unsubstituted or substituted by one or more substituents selected from alkyl, cycloalkyl, heterocycloalkyl, aryl, heteroaryl and groups with donor or acceptor action;

n, m are each independently 0, 1, 2, 3 or 4.

22. An organic light-emitting diode comprising an anode An and a cathode Ka and a first light-emitting layer E arranged between the anode An and the cathode Ka, and optionally, as a further layer, at least one blocking layer for holes/excitons, characterized in that the organic light-emitting diode comprises the material according to claim 13, which is present in the light-emitting layer and/or in the at least in the blocking layer for holes/excitons—if present.

23. A device selected from the group consisting of stationary visual display units such as visual display units of computers, televisions, visual display units in printers, kitchen appliances and advertising panels, illuminations, information panels, and mobile visual display units such as visual display units in cellphones, laptops, digital cameras, vehicles, and destination displays on buses and trains, comprising at least one organic light-emitting diode according to claim 22.

24. The light-emitting diode according to claim 22, comprising at least one second light-emitting layer arranged between the anode An and the cathode Ka.

25. The light-emitting diode according to claim 24, wherein the second light-emitting layer comprises a compound of the formula (I).

26. The light-emitting diode according to claim 24, wherein the second light-emitting layer comprises a compound of formula (Ib)

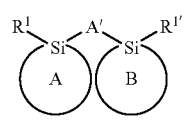
(Ib)

in which:

A' is a fused ring system formed from at least 3 fused rings which each independently have 4 to 10 ring members and may be saturated or mono- or polyunsaturated and may be unsubstituted or substituted by one or more substituents selected from alkyl, cycloalkyl, heterocycloalkyl, aryl, heteroaryl and groups with donor or acceptor action, wherein the fused ring system has at least one heteroatom-containing group in the fused ring system itself or in at least one substituent;

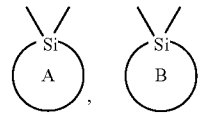

are each independently an Si-comprising ring which has 4 to 10 ring members, wherein the ring may be saturated or mono- or polyunsaturated and, in addition to the silicon atom, may have one or more further heteroatom-containing groups and may be unsubstituted or substituted by one or more substituents selected from alkyl, cycloalkyl, heterocycloalkyl, aryl, heteroaryl and groups with donor or acceptor action, wherein the Si-comprising ring may additionally be part of a fused ring system formed from at least 2 fused rings, wherein the further rings—in addition to the Si-comprising ring—in the fused ring system may each independently be saturated or mono- or polyunsaturated and may be unsubstituted or substituted by one or more substituents selected from alkyl, cycloalkyl, heterocycloalkyl, aryl, heteroaryl and groups with donor or acceptor action, and may have one or more heteroatom-containing groups;

$R^1$, $R^{1'}$ are each independently a fused ring system formed from at least 3 fused rings which each independently have 4 to 10 ring members and may be saturated or mono- or polyunsaturated and substituted or substituted by one or more substituents selected from alkyl, cycloalkyl, heterocycloalkyl, aryl, heteroaryl, $SiR^2R^3R^4$ and groups with donor or acceptor action, wherein the fused ring system has at least one heteroatom in the fused ring system itself or in at least one substituent, alkyl, cycloalkyl, heterocycloalkyl, aryl or heteroaryl, wherein the aforementioned groups may be unsubstituted or substituted by one or more substituents selected from alkyl, cycloalkyl, heterocycloalkyl, aryl, heteroaryl, and groups with donor or acceptor action.

27. The light-emitting diode according claim 24, which has an overall emission composed of the emission of the first light-emitting layer E and of the second light-emitting layer.

28. The light-emitting diode according to claim 27, wherein the overall emission comprises white light.

* * * * *

UNITED STATES PATENT AND TRADEMARK OFFICE
CERTIFICATE OF CORRECTION

PATENT NO.        : 8,618,533 B2
APPLICATION NO.   : 13/123173
DATED             : December 31, 2013
INVENTOR(S)       : Karsten Heuser et al.

It is certified that error appears in the above-identified patent and that said Letters Patent is hereby corrected as shown below:

In the Claims

Claim 1, Column 66, line 33, "10, wherein" should read --10 ring members, wherein--.

Claim 1, Column 66, line 40, "formed from at least 2," should read --formed from at least 2 fused rings,--.

Claim 14, Column 69, line 62, "$NR^S$" should read --$NR^5$--.

Claim 14, Column 70, lines 36-37, ", prefer-ably alkyl or aryl" should be deleted.

Claim 17, Column 71, line 24, "$R^5$," should read --$R^5$--.

Claim 19, Column 72, lines 3, "2 or 3, rings," should read --2 or 3 rings,--.

Signed and Sealed this
Fifteenth Day of July, 2014

Michelle K. Lee
*Deputy Director of the United States Patent and Trademark Office*